(12) United States Patent
Montorsi et al.

(10) Patent No.: US 12,218,687 B2
(45) Date of Patent: *Feb. 4, 2025

(54) LOW DENSITY PARITY CHECK CODE ENCODING METHOD AND COMMUNICATION APPARATUS

(71) Applicant: HUAWEI TECHNOLOGIES CO., LTD., Shenzhen (CN)

(72) Inventors: Guido Montorsi, Turin (IT); Sergio Benedetto, Turin (IT); Wei Lin, Shenzhen (CN); Yan Xin, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/523,495

(22) Filed: Nov. 29, 2023

(65) Prior Publication Data

US 2024/0204801 A1 Jun. 20, 2024

Related U.S. Application Data

(63) Continuation of application No. 17/856,645, filed on Jul. 1, 2022, now Pat. No. 11,881,870, which is a (Continued)

(30) Foreign Application Priority Data

Jan. 3, 2020 (CN) .......................... 202010006366.5

(51) Int. Cl.
*H03M 13/11* (2006.01)
*H03M 13/00* (2006.01)

(52) U.S. Cl.
CPC ....... *H03M 13/118* (2013.01); *H03M 13/616* (2013.01)

(58) Field of Classification Search
CPC ......... H03M 13/1157; H03M 13/1151; H03M 13/616

See application file for complete search history.

(56) References Cited

U.S. PATENT DOCUMENTS

11,881,870 B2 * 1/2024 Montorsi ........... H03M 13/1188
11,901,014 B2 * 2/2024 Xu ....................... G11C 16/102
(Continued)

FOREIGN PATENT DOCUMENTS

| CN | 106685586 A | 5/2017 |
|----|-------------|--------|
| CN | 108023598 A | 5/2018 |

(Continued)

OTHER PUBLICATIONS

U.S. Appl. No. 17/856,645, filed Jul. 1, 2022.
(Continued)

*Primary Examiner* — Samir W Rizk
(74) *Attorney, Agent, or Firm* — Leydig, Voit & Mayer, Ltd.

(57) ABSTRACT

This application provides an LDPC code encoding method and a communication apparatus, to meet a requirement of increasing redundant bits through retransmission in an IR-HARQ mechanism, so as to decrease a channel coding rate, and improve decoding performance of an LDPC code. In the method, a check matrix of the LDPC code is used as a basic matrix, and the basic matrix is extended to obtain a mother matrix compatible with a plurality of code rates. During LDPC encoding, a transmit device reads, from the mother matrix, a check matrix corresponding to a required code rate, and performs LDPC encoding on an information bit sequence based on the read check matrix. LDPC encoding is performed on the information bit sequence by using check matrices of different sizes, to obtain different quantities of redundant bits.

22 Claims, 8 Drawing Sheets

400

Perform LDPC encoding on an information bit sequence based on a first check matrix, to obtain a first codeword at a first code rate, where the first check matrix is obtained by reading i rows and j columns from a mother matrix, the mother matrix includes a basic matrix, an extension matrix, a first fixed matrix, and a second fixed matrix, $i = p + k$, $j = q + k$, $p$ and $q$ are respectively a quantity of rows and a quantity of columns in the basic matrix, $k \geq 0$, and $k$, $p$, $q$, $i$, and $j$ are all integers — 410

Send the first codeword — 420

Related U.S. Application Data continuation of application No. PCT/CN2020/142584, filed on Dec. 31, 2020.

(56) References Cited

U.S. PATENT DOCUMENTS

| | | |
|---|---|---|
| 2018/0337691 A1 | 11/2018 | Kalachev et al. |
| 2019/0013901 A1 | 1/2019 | Nimbalker et al. |
| 2019/0356333 A1 | 11/2019 | Ma et al. |
| 2019/0393890 A1 | 12/2019 | Montorsi et al. |

FOREIGN PATENT DOCUMENTS

| | | |
|---|---|---|
| CN | 110611510 A | 12/2019 |
| EP | 4047846 A1 | 8/2022 |
| WO | 2022073245 A1 | 4/2022 |

OTHER PUBLICATIONS

Mu et al., "Construction of Regular Rate-Compatible LDPC Convolutional Codes," Wireless Communications, China Communications, Total 6 pages (Aug. 2016).

Wu et al., "A High Throughput Implementation of QC-LDPC Codes for 5G NR," IEEE Access, vol. 7, Date of publication Dec. 19, 2019, IEEE Access, Total 12 pages (Date of current version: Dec. 31, 2019).

"Draft Standard for Information technology—Telecommunications and information exchange between systems Local and metropolitan area networks—Specific requirements, Part 11: Wireless LAN Medium Access Control (MAC) and Physical Layer (PHY) Specifications," IEEE P802.11ax/D6.0, Total 780 pages (Nov. 2019).

Mu et al., "Construction of Rate-Compatible (RC) Low-Density Parity-Check (LDPC) Convolutional Codes Based on RC-LDPC Block Codes," Shanghai Jiaotong University and Springer-Verlag Berlin Heidelberg 2016, Total 5 pages (Mar. 27, 2016).

"IEEE Standard for Information technology—Telecommunications and information exchange between systems Local and metropolitan area networks—Specific requirements, Part 11: Wireless LAN Medium Access Control (MAC) and Physical Layer (PHY) Specifications," IEEE Computer Society, Std 802.11-2016, Total 3534 pages (Approved Dec. 7, 2016).

* cited by examiner

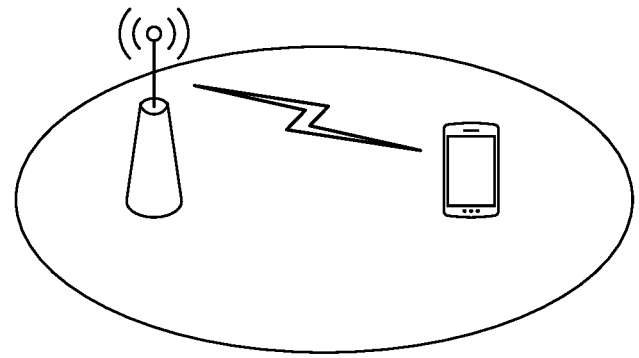

FIG. 3(a)

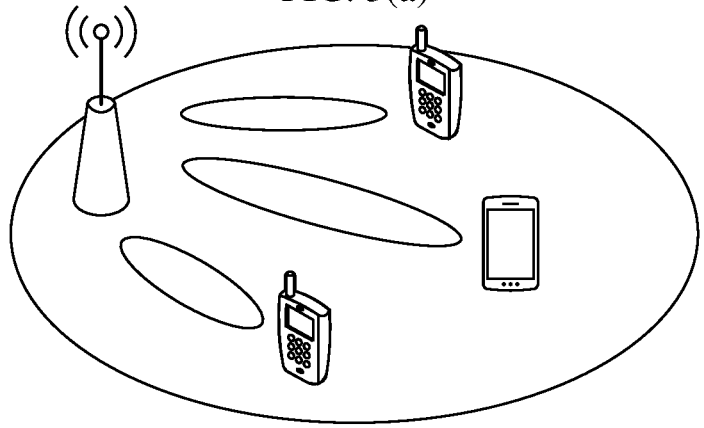

Perform LDPC encoding on an information bit sequence based on a first check matrix, to obtain a first codeword at a first code rate, where the first check matrix is obtained by reading i rows and j columns from a mother matrix, the mother matrix includes a basic matrix, an extension matrix, a first fixed matrix, and a second fixed matrix, $i = p + k$, $j = q + k$, p and q are respectively a quantity of rows and a quantity of columns in the basic matrix, $k \geq 0$, and k, p, q, i, and j are all integers — 410

Send the first codeword — 420

LOW DENSITY PARITY CHECK CODE ENCODING METHOD AND COMMUNICATION APPARATUS

CROSS-REFERENCE TO RELATED APPLICATIONS

This application is a continuation of U.S. patent application Ser. No. 17/856,645, filed on Jul. 1, 2022, which is a continuation of International Application No. PCT/CN2020/142584, filed on Dec. 31, 2020. The International Application claims priority to Chinese Patent Application No. 202010006366.5, filed on Jan. 3, 2020. All of the aforementioned patent applications are hereby incorporated by reference in their entireties.

TECHNICAL FIELD

This application relates to channel coding, and in particular, to an LDPC code encoding method and a communication apparatus.

BACKGROUND

In the channel coding field, a low-density parity-check (LDPC) code is a most mature and widely applied channel coding scheme. The LDPC code has performance close to the Shannon limit, and has many advantages. Therefore, in protocols IEEE 802.11n, 802.11ac, 802.11ax, and the like, the LDPC code is used as a standard channel coding scheme for a wireless local area network (WLAN). Currently, a total of 12 check matrices of the LDPC code are used in the protocol 802.11ac/ax. There are three types of code lengths, and each code length supports four code rates. A transmit device selects a corresponding check matrix from the 12 check matrices based on a target code length and code rate, to perform LDPC encoding.

To further improve a throughput of a communication system, it is proposed in the next-generation WLAN 802.11be standard that an incremental redundancy-hybrid automatic repeat request (IR-HARQ) mechanism is introduced based on the 802.11ax standard. In the IR-HARQ mechanism, it is expected to increase redundant bits through retransmission, to decrease a channel coding rate, so as to improve a success rate of decoding at a receive end, and obtain a better decoding effect.

However, in the coding scheme used in the existing WLAN standard, a requirement of increasing redundant bits through retransmission in the IR-HARQ mechanism to decrease a channel coding rate cannot be met.

SUMMARY

This application provides an LDPC code encoding method and a communication apparatus, to meet a requirement of increasing redundant bits through retransmission in an IR-HARQ mechanism, so as to decrease a channel coding rate, and improve decoding performance of an LDPC code.

According to a first aspect, this application provides an LDPC code encoding method. The method includes: performing low-density parity-check LDPC encoding on an information bit sequence based on a first check matrix, to obtain a first codeword at a first code rate, where the first check matrix is obtained by reading i rows and j columns from a mother matrix, the mother matrix includes a basic matrix, an extension matrix, a first fixed matrix, and a second fixed matrix, the basic matrix is located at the top-left corner of the mother matrix, the extension matrix is located at the bottom-left corner of the mother matrix, the first fixed matrix is located at the top-right corner of the mother matrix, the second fixed matrix is located at the bottom-right corner of the mother matrix, a quantity of rows in the basic matrix is equal to a quantity of rows in the first fixed matrix, a quantity of rows in the extension matrix is equal to a quantity of rows in the second fixed matrix, a quantity of columns in the extension matrix is equal to a quantity of columns in the basic matrix, a quantity of columns in the first fixed matrix is equal to a quantity of columns in the second fixed matrix, $i=p+k$, $j=q+k$, p and q are respectively the quantity of rows and the quantity of columns in the basic matrix, $k \geq 0$, and i, j, p, q, and k are all integers; and sending the first codeword.

In the technical solution in this application, a check matrix of an LDPC code is used as a basic matrix, and the basic matrix is extended to obtain a mother matrix compatible with a plurality of code rates. Check matrices of different sizes read from the mother matrix correspond to different code rates. During LDPC encoding, a transmit device reads, from the mother matrix, a check matrix corresponding to a required code rate, and performs LDPC encoding on the information bit sequence based on the read check matrix. In an IR-HARQ mechanism, during a retransmission, a check matrix corresponding to a lower code rate (compared with a code rate of an initial transmission) is read to encode the information bit sequence, to obtain a larger quantity of redundant bits. This can decrease a channel coding rate.

It may be understood that because the channel coding rate is decreased, a decoding success rate of a receive device is increased. This can decrease a quantity of retransmissions and reduce a retransmission delay.

With reference to the first aspect, in some implementations of the first aspect, the method further includes: receiving retransmission indication information; performing LDPC encoding on the information bit sequence based on a second check matrix, to obtain a second codeword at a second code rate, where the second check matrix is obtained by reading w rows and z columns from the mother matrix, $w=p+h$, $z=q+h$, $h>k$, and w, z, and h are all positive integers; and sending the second codeword.

According to a second aspect, this application provides an LDPC code decoding method. The method includes: receiving a first channel receive sequence from a transmit device; decoding, based on a first check matrix, a first LLR sequence corresponding to the first channel receive sequence, where the first check matrix is obtained by reading i rows and j columns from a mother matrix, the mother matrix includes a basic matrix, an extension matrix, a first fixed matrix, and a second fixed matrix, the basic matrix is located at the top-left corner of the mother matrix, the extension matrix is located at the bottom-left corner of the mother matrix, the first fixed matrix is located at the top-right corner of the mother matrix, the second fixed matrix is located at the bottom-right corner of the mother matrix, a quantity of rows in the basic matrix is equal to a quantity of rows in the first fixed matrix, a quantity of rows in the extension matrix is equal to a quantity of rows in the second fixed matrix, a quantity of columns in the extension matrix is equal to a quantity of columns in the basic matrix, a quantity of columns in the first fixed matrix is equal to a quantity of columns in the second fixed matrix, $i=p+k$, $j=q+k$, p and q are respectively the quantity of rows and the quantity of columns in the basic matrix, $k \geq 0$, and i, j, p, q, and k are all integers; and outputting a decoding result when the first LLR sequence is successfully decoded based on the first check matrix.

With reference to the second aspect, in some implementations of the second aspect, the method further includes: when the first LLR sequence is unsuccessfully decoded based on the first check matrix, sending retransmission indication information to the transmit device; receiving a second channel receive sequence from the transmit device; and decoding a combined LLR sequence based on a second check matrix, where the combined LLR sequence is obtained by combining the first LLR sequence and a second LLR sequence that corresponds to the second channel receive sequence, the second check matrix is obtained by reading w rows and z columns from the mother matrix, w=p+h, z=q+h, h>k, and w; z, and h are all positive integers.

In some implementations of the first aspect or the second aspect, a code rate corresponding to the basic matrix is 1/2, and the mother matrix is shown as follows:

$$H(1/2) = \begin{bmatrix} H_{MC}(1/2) & 0_{12 \times r} \\ H_{IR}(1/2) & I_{r \times r} \end{bmatrix},$$

where
H(1/2) indicates the mother matrix, $H_{MC}(1/2)$ indicates the basic matrix, $H_{IR}(1/2)$ indicates the extension matrix, a size of $H_{IR}(1/2)$ is r rows and 24 columns, 1/2 indicates the code rate, $0_{12 \times r}$ indicates the first fixed matrix, $I_{r \times r}$ indicates the second fixed matrix, $0_{12 \times r}$ indicates an all-zero matrix with a size of 12 rows and r columns, $I_{r \times r}$ indicates an identity matrix with a size of r rows and r columns, r≥1, k≤r, and r is an integer; and for $H_{MC}(1/2)$, refer to the specification.

In an implementation, $H_{IR}(1/2)$ is obtained by reading r rows and 24 columns from a first matrix, a size of the first matrix is 100 rows and 24 columns, the r rows in $H_{IR}(1/2)$ are any r rows in the 100 rows in the first matrix, and the first matrix may be represented by Table A.

In another implementation, $H_{IR}(1/2)$ is obtained by reading r rows and 24 columns from a second matrix, a size of the second matrix is 100 rows and 24 columns, the r rows in $H_{IR}(1/2)$ are any r rows in the 100 rows in the second matrix, and the second matrix may be represented by Table B.

In some implementations of the first aspect or the second aspect, a code rate corresponding to the basic matrix is 2/3, and the mother matrix is shown as follows:

$$H(2/3) = \begin{bmatrix} H_{MC}(2/3) & 0_{8 \times r} \\ H_{IR}(2/3) & I_{r \times r} \end{bmatrix},$$

where
H(2/3) indicates the mother matrix, $H_{MC}(2/3)$ indicates the basic matrix, $H_{IR}(2/3)$ indicates the extension matrix, a size of $H_{IR}(2/3)$ is r rows and 8 columns, 2/3 indicates the code rate, $0_{8 \times r}$ indicates the first fixed matrix, $I_{r \times r}$ indicates the second fixed matrix, $0_{8 \times r}$ indicates an all-zero matrix with a size of 8 rows and r columns, $I_{r \times r}$ indicates an identity matrix with a size of r rows and r columns, r≥1, k≤r, and r is an integer; and for $H_{MC}(2/3)$, refer to the specification.

In an implementation, $H_{IR}(2/3)$ is obtained by reading r rows and 24 columns from a third matrix, a size of the third matrix is 100 rows and 24 columns, the r rows in $H_{IR}(2/3)$ are any r rows in the 100 rows in the third matrix, and the third matrix may be represented by Table C.

In another implementation, $H_{IR}(2/3)$ is obtained by reading r rows and 24 columns from a fourth matrix, a size of the fourth matrix is 100 rows and 24 columns, the r rows in $H_{IR}(2/3)$ are any r rows in the 100 rows in the fourth matrix, and the fourth matrix may be represented by Table D.

In some implementations of the first aspect or the second aspect, a code rate corresponding to the basic matrix is 3/4, and the mother matrix is shown as follows:

$$H(3/4) = \begin{bmatrix} H_{MC}(3/4) & 0_{6 \times r} \\ H_{IR}(3/4) & I_{r \times r} \end{bmatrix},$$

where
H(3/4) indicates the mother matrix, $H_{MC}(3/4)$ indicates the basic matrix, $H_{IR}(3/4)$ indicates the extension matrix, a size of $H_{IR}(3/4)$ is r rows and 24 columns, 3/4 indicates the code rate, $0_{6 \times r}$ indicates the first fixed matrix, $I_{r \times r}$ indicates the second fixed matrix, $0_{6 \times r}$ indicates an all-zero matrix with a size of 6 rows and r columns, $I_{r \times r}$ indicates an identity matrix with a size of r rows and r columns, r≥1, k≤r, and r is an integer; and for $H_{MC}(3/4)$, refer to the specification.

In an implementation, $H_{IR}(3/4)$ is obtained by reading r rows and 24 columns from a fifth matrix, a size of the fifth matrix is 100 rows and 24 columns, the r rows in $H_{IR}(2/3)$ are any r rows in the 100 rows in the fifth matrix, and the fifth matrix may be represented by Table E.

In an implementation, $H_{IR}(3/4)$ is obtained by reading r rows and 24 columns from a sixth matrix, a size of the sixth matrix is 100 rows and 24 columns, the r rows in $H_{IR}(2/3)$ are any r rows in the 100 rows in the sixth matrix, and the sixth matrix may be represented by Table F.

In some implementations of the first aspect or the second aspect, a code rate corresponding to the basic matrix is 5/6, and the mother matrix is shown as follows:

$$H(5/6) = \begin{bmatrix} H_{MC}(5/6) & 0_{4 \times r} \\ H_{IR}(5/6) & I_{r \times r} \end{bmatrix},$$

where
H(5/6) indicates the mother matrix, $H_{MC}(5/6)$ indicates the basic matrix, $H_{IR}(5/6)$ indicates the extension matrix, a size of $H_{IR}(5/6)$ is r rows and 24 columns, 5/6 indicates the code rate, $0_{4 \times r}$ indicates the first fixed matrix, $I_{r \times r}$ indicates the second fixed matrix, $0_{4 \times r}$ indicates an all-zero matrix with a size of 4 rows and r columns, $I_{r \times r}$ indicates an identity matrix with a size of r rows and r columns, r≥1, k≤r, and r is an integer; and for $H_{MC}(5/6)$, refer to the specification.

In an implementation, $H_{IR}(5/6)$ is obtained by reading r rows and 24 columns from a seventh matrix, a size of the seventh matrix is 100 rows and 24 columns, the r rows in $H_{IR}(5/6)$ are any r rows in the 100 rows in the seventh matrix, and the seventh matrix may be represented by Table G.

In another implementation, $H_{IR}(5/6)$ is obtained by reading r rows and 24 columns from an eighth matrix, a size of the eighth matrix is 100 rows and 24 columns, the r rows in $H_{IR}(5/6)$ are any r rows in the 100 rows in the eighth matrix, and the eighth matrix may be represented by Table H.

Table A corresponds to Table 1 in the specification, Table B corresponds to Table 4, Table C corresponds to Table 5, Table D corresponds to Table 6, Table E corresponds to Table 7, Table F corresponds to Table 8, Table G corresponds to Table 9, and Table H corresponds to Table 10.

According to a third aspect, this application provides a communication apparatus, configured to perform the method in any one of the first aspect or the possible implementations of the first aspect. Specifically, the communication apparatus includes corresponding units configured to perform the method in any one of the first aspect or the possible implementations of the first aspect.

In an implementation, the communication apparatus may include a memory and a processor. The memory is configured to store a computer program or instructions, and the processor reads, from the memory, and runs the computer program or the instructions, to implement the method in any one of the first aspect or the possible implementations of the first aspect.

Optionally, the memory may be a physically independent unit, or may be integrated with the processor.

In another implementation, the communication apparatus includes an input interface circuit, a logic circuit, and an output interface circuit. The input interface circuit is configured to obtain a to-be-encoded information bit sequence. The logic circuit is configured to perform the LDPC encoding method in any one of the first aspect or the possible implementations of the first aspect, to generate a codeword at a corresponding code rate. The output interface circuit is configured to output the codeword.

Optionally, the input interface circuit and the output interface circuit may be integrated together, and referred to as an interface circuit.

According to a fourth aspect, this application provides a communication apparatus, configured to perform the method in any one of the second aspect or the possible implementations of the second aspect. Specifically, the communication apparatus includes corresponding units configured to perform the method in any one of the second aspect or the possible implementations of the second aspect.

In an implementation, the communication apparatus may include a memory and a processor. The memory is configured to store a computer program or instructions, and the processor reads, from the memory, and runs the computer program or the instructions, to implement the method in any one of the second aspect or the possible implementations of the second aspect.

Optionally, the memory may be a physically independent unit, or may be integrated with the processor.

In another implementation, the communication apparatus includes an input interface circuit, a logic circuit, and an output interface circuit. The input interface circuit is configured to obtain a to-be-encoded information bit sequence. The logic circuit is configured to perform the LDPC encoding method in any one of the second aspect or the possible implementations of the second aspect, to generate a codeword at a corresponding code rate. The output interface circuit is configured to output the codeword.

Optionally, the input interface circuit and the output interface circuit may be integrated together, and referred to as an interface circuit.

According to a fifth aspect, this application provides a communication apparatus, including an interface circuit and a processor. The interface circuit is configured to receive computer code or instructions, and transmit the computer code or the instructions to the processor; and the processor runs the computer code or the instructions, to implement the method in any one of the first aspect or the implementations of the first aspect.

According to a sixth aspect, this application provides a communication apparatus, including an interface circuit and a processor. The interface circuit is configured to receive computer code or instructions, and transmit the computer code or the instructions to the processor; and the processor runs the computer code or the instructions, to implement the method in any one of the second aspect or the implementations of the second aspect.

According to a seventh aspect, this application provides a communication device, including at least one processor. The at least one processor is coupled to at least one memory, the at least one memory is configured to store a computer program or instructions, and the at least one processor is configured to invoke, from the at least one memory, and run the computer program or the instructions, to implement the method in any one of the first aspect or the possible implementations of the first aspect.

According to an eighth aspect, this application provides a communication device, including at least one processor. The at least one processor is coupled to at least one memory, the at least one memory is configured to store a computer program or instructions, and the at least one processor is configured to invoke, from the at least one memory, and run the computer program or the instructions, to implement the method in any one of the second aspect or the possible implementations of the second aspect.

According to a ninth aspect, this application provides a computer-readable storage medium. The computer-readable storage medium stores computer instructions, and when the computer instructions are run on a computer, the method in any one of the first aspect or the possible implementations of the first aspect is implemented.

According to a tenth aspect, this application provides a computer-readable storage medium. The computer-readable storage medium stores computer instructions, and when the computer instructions are run on a computer, the method in any one of the second aspect or the possible implementations of the second aspect is implemented.

According to an eleventh aspect, this application provides a computer program product, including computer code or instructions, and when the computer code or the instructions is/are run on a computer, the method in any one of the first aspect or the possible implementations of the first aspect is implemented.

According to a twelfth aspect, this application provides a computer program product, including computer code or instructions, and when the computer code or the instructions is/are run on a computer, the method in any one of the second aspect or the possible implementations of the second aspect is implemented.

According to a thirteenth aspect, this application provides a wireless communication system, including the communication device in the seventh aspect and the communication device in the eighth aspect.

BRIEF DESCRIPTION OF DRAWINGS

FIG. 3(a) and FIG. 3(b) are diagrams of architectures of systems to which an embodiment of this application is applicable:

FIG. 4 is a flowchart of an LDPC code encoding method 400 according to this application;

FIG. 5 shows an example of a check matrix obtained by extending $H_{MC}(5/6)$;

DESCRIPTION OF EMBODIMENTS

Figures 1, 2:
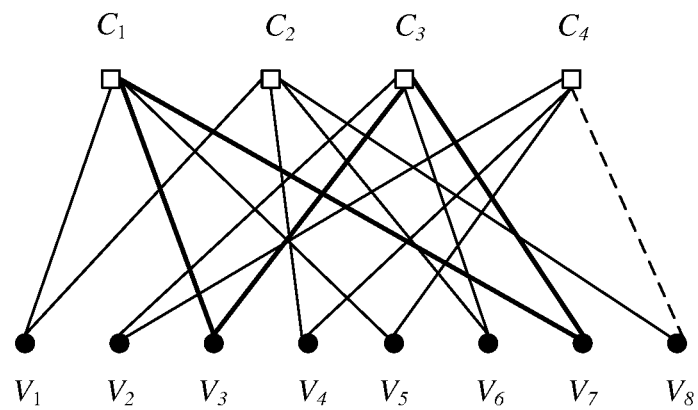
FIG. 1 shows a check matrix H of an LDPC code.
FIG. 2 is a Tanner graph of a check matrix H of an LDPC code.

The following describes technical solutions of this application with reference to the accompanying drawings.

In the channel coding field, a low-density parity-check (LDPC) code is a most mature and widely applied channel coding scheme. The LDPC code has performance close to the Shannon limit, and has many advantages, for example, having good bit error performance without deep interleaving, having good frame error rate performance, and a small decoding delay due to supporting of parallel decoding. Therefore, in protocols IEEE 802.11n, 802.11ac, 802.11ax, and the like, the LDPC code is used as a standard channel coding scheme for a wireless local area network (WLAN).

In a next-generation 802.11be standard of the WLAN 802.11ax standard, it is proposed that a hybrid automatic repeat request (HARQ) mechanism is introduced, to further improve a throughput of a system. In the HARQ mechanism, when incorrectly decoding data sent by a transmit end, a receive end stores the data that is incorrectly received and requests the transmit end to retransmit data. The receive end combines the retransmitted data and the previously stored data, and performs decoding. This process has specific diversity gains, so that a quantity of retransmissions can be decreased and a delay can be reduced.

The HARQ mechanism may include two types: chase combining (CC) and incremental redundancy (IR). In a HARQ-only mechanism, the receive end directly discards data packets that are incorrectly received. However, although the data packets that are incorrectly received cannot be correctly decoded independently, the data packets still include a part of useful information. This part of information is used in the CC-HARQ, to store the data packets that are incorrectly received into a memory, and combine the data packets with a retransmitted data packet for decoding. This improves transmission efficiency. The IR-HARQ mechanism means that the transmit end sends an information bit and some redundant bits during an initial transmission, and sends additional redundant bits during a retransmission. If decoding fails during the initial transmission, the transmit end retransmits more redundant bits, to decrease a code rate of a channel, so as to increase a decoding success rate. If the receive end still cannot correctly perform decoding based on redundant bits in a first retransmission, the transmit end performs retransmission again. As a quantity of retransmissions increases, redundant bits continuously increase, and a channel coding rate is continuously decreased, to achieve better decoding effects.

If the IR-HARQ mechanism is introduced into the next-generation WLAN standard, an LDPC coding scheme supporting compatibility with a plurality of rates is required for support, so that a new incremental redundant bit can be introduced during a retransmission.

To facilitate understanding of the solutions of this application, concepts related to an LDPC code are first described.

The LDPC code is a linear block code, and a check matrix of the LDPC code is a sparse matrix. In the check matrix of the LDPC code, a quantity of zero elements is far greater than a quantity of non-zero elements. Alternatively, a row weight and a column weight of the check matrix are much less than a code length of the LDPC code. An LDPC code whose information bit sequence length is equal to k and whose code length is equal to n may be uniquely determined based on a check matrix of the LDPC code.

In 1981, Tanner represented a codeword of an LDPC code in a graph. This graph now is referred to as a Tanner graph, and the Tanner graph and the check matrix are in a one-to-one correspondence. The Tanner graph includes two types of vertices. One type of vertex indicates a codeword bit and is referred to as a variable node. The other type of vertex is a check node and indicates a check constraint relationship. Each check node indicates one check constraint relationship. The following provides description with reference to FIG. 1 and FIG. 2.

FIG. 1 shows a check matrix H of an LDPC code. In FIG. 1, $\{Vi\}$ indicates a variable node set, and $\{Ci\}$ indicates a check node set. In the check matrix H, each row indicates one check equation, and each column indicates one codeword bit. In FIG. 1, there are eight variable nodes and four check nodes. If a codeword bit is included in a corresponding check equation, related bit nodes and check nodes are connected by using a connection line, to obtain a Tanner graph.

FIG. 2 is a Tanner graph of the check matrix H of the LDPC code. As shown in FIG. 2, the Tanner graph represents the check matrix H of the LDPC code. For example, for the check matrix H with a size of m rows and n columns, the Tanner graph includes two types of nodes: n bit nodes and m check nodes. The n bit nodes respectively correspond to the n columns in the check matrix H, and the m check nodes respectively correspond to the m rows in the check matrix H. A cycle in the Tanner graph includes interconnected vertices. The cycle uses one of the vertices as both a start point and an end point, and passes through each node only once. A length of the cycle is defined as a quantity of connection lines included in the cycle. A girth of the graph may also be referred to as a size of the graph, and is defined as a minimum cycle length in the graph. As shown by bold connection lines in FIG. 2, the girth is 6.

An LDPC code used in the IEEE 802.11ac standard and the 802.11ax standard is a quasi-cyclic low-density parity-check (QC-LDPC) code. The QC-LDPC code is a structured LDPC code. Due to a unique structure of a check matrix of the QC-LDPC code, a simple feedback shift register can be used for encoding, to decrease encoding complexity of the LDPC code.

In the IEEE 802.11ac standard and the 802.11ax standard, a total of 12 check matrices of the LDPC code are used, and three code lengths are supported. The three code lengths are respectively 648, 1296, and 1944. Each code length supports four code rates: 1/2, 2/3, 3/4, and 5/6. Check bit parts of the 12 check matrices all have a same structure.

For example, a check matrix H of the LDPC code with a code length of 1944 and at a code rate of 5/6 in the 802.11ac standard is shown as follows:

$$\begin{bmatrix} 13 & 48 & 80 & 66 & 4 & 74 & 7 & 30 & 76 & 52 & 37 & 60 & - & 49 & - & 73 & 31 & 74 & 73 & 23 & 1 & 0 & - & - \\ 69 & 63 & 74 & 56 & 64 & 77 & 57 & 65 & 6 & 16 & 51 & - & 64 & - & 64 & 68 & 9 & 48 & 62 & 54 & - & 0 & 0 & - \\ 51 & 15 & 0 & 80 & 24 & 25 & 42 & 54 & 44 & 71 & 71 & 9 & 67 & 35 & 67 & - & 58 & - & 29 & - & 0 & - & 0 & 0 \\ 16 & 29 & 36 & 41 & 44 & 56 & 59 & 37 & 50 & 24 & - & 65 & 4 & 65 & 4 & 52 & - & 4 & - & 73 & 1 & - & - & 0 \end{bmatrix}$$

It can be learned that a size of H is 4 rows and 24 columns, each element in the matrix indicates a z=N/24-order square matrix, 0 in the matrix indicates an all-zero square matrix with a size of z×z, $P_z^i$ indicates a circulant shift matrix, i indicates a cyclic shift value, $0 \leq i \leq z-1$, and i is an integer. In addition, "-" in the matrix indicates an all-zero matrix, and "0" indicates an identity matrix.

For example, $P_z^1$ is shown as follows:

$$\begin{bmatrix} 0 & 1 & 0 & \ldots & 0 \\ 0 & 0 & 1 & \ldots & 0 \\ \vdots & \vdots & \vdots & \ddots & \vdots \\ 0 & 0 & 0 & \ldots & 1 \\ 1 & 0 & 0 & \ldots & 0 \end{bmatrix}$$

When LDPC code encoding in the WLAN is performed, the transmit end selects a corresponding check matrix from the 12 check matrices based on a target code length and a target code rate. The 12 check matrices are different from each other.

To improve WLAN transmission reliability, an IR-HARQ mechanism is introduced into the IEEE 802.11be standard based on the previous 802.11ax standard. For the IR-HARQ mechanism, to obtain a higher throughput, a rate-compatible LDPC code needs to be introduced into the WLAN, to obtain incremental redundant bits during a retransmission. In this way, the receive end obtains performance gains by combining initially received bits and retransmitted incremental redundant bits.

The following describes the technical solutions of this application with reference to the accompanying drawings.

The technical solutions of this application are mainly applied to a wireless communication system. The wireless communication system may comply with a wireless communication standard of the Third Generation Partnership Project (3GPP), or may comply with another wireless communication standard, for example, a wireless communication standard in the 802 series (e.g., 802.11, 802.15, or 802.20) of the Institute of Electrical and Electronics Engineers (IEEE).

FIG. 3(a) and FIG. 3(b) are diagrams of architectures of systems to which an embodiment of this application is applicable. The wireless communication system includes at least one network device and one or more terminal devices. The at least one network device communicates with the one or more terminal devices by using a wireless communication technology. For example, FIG. 3(a) shows that a network device communicates with a single terminal device. FIG. 3(b) shows that a network device communicates with a plurality of terminal devices. Optionally, communication between the network device and the terminal device may further include downlink transmission in which the network device sends a signal to the terminal device, and uplink transmission in which the terminal device sends a signal to the network device. This is not limited in this specification.

The terminal device in embodiments of this application is also referred to as user equipment (UE), a terminal, a mobile phone, a tablet computer, a laptop computer, a wearable device (e.g., a smart watch, a smart band, a smart helmet, or smart glasses), another device that has a wireless access capability, for example, an intelligent vehicle, any Internet of things (IOT) device including any smart home device (e.g., a smart meter or a smart home appliance) and smart city device (e.g., a security or monitoring device, or an intelligent transportation facility), a terminal device in a 5G system or a future communication system, or the like.

The network device in embodiments of this application may be a base station. The base station is sometimes also referred to as a wireless access point (AP), a transmission reception point (TRP), or a transmission point (TP). Optionally, the base station may be a next generation NodeB (gNB) in a 5th generation (5G) system or an evolved NodeB (eNB) in a long term evolution (LTE) system. In addition, base stations may be classified into a macro base station or a micro base station based on different physical forms or transmit power of the base stations. The micro base station is sometimes also referred to as a small base station or a small cell. In addition, the network device may alternatively be a network node that constitutes a gNB or a TRP, for example, a baseband unit (BBU), a centralized unit (CU), or a distributed unit (DU).

FIG. 4 is a flowchart of an LDPC code encoding method 400 according to this application.

Optionally, the method 400 may be performed by a transmit device, or a chip or a circuit system disposed in a transmit device. The circuit system may be, for example, an integrated circuit or a logic circuit. For example, the chip may be a system on a chip (SoC) chip or a baseband modem chip. This is not limited in this specification. The following uses a transmit device as an example for description. The transmit device may be a terminal device or a network device. It should be understood that the transmit device in this embodiment of this application is also an encoding device.

410: The transmit device performs LDPC encoding on an information bit sequence based on a first check matrix, to obtain a first codeword at a first code rate.

The first check matrix is obtained by reading i rows and j columns from a mother matrix. The mother matrix includes a basic matrix, an extension matrix, a first fixed matrix, and a second fixed matrix. The basic matrix is located at the top-left corner of the mother matrix, the extension matrix is located at the bottom-left corner of the mother matrix, the first fixed matrix is located at the top-right corner of the mother matrix, and the second fixed matrix is located at the bottom-right corner of the mother matrix. A quantity of columns in the basic matrix is equal to a quantity of columns in the extension matrix, and a quantity of columns in the first fixed matrix is equal to a quantity of columns in the second fixed matrix. A quantity of rows in the basic matrix is equal to a quantity of rows in the first fixed matrix, and a quantity of rows in the extension matrix is equal to a quantity of rows in the second fixed matrix.

Specifically, the first fixed matrix is an all-zero matrix, and the second fixed matrix is an identity matrix.

In other words, the mother matrix is a large matrix, and check matrices of different sizes may be read from the mother matrix. The check matrices of different sizes correspond to different code rates.

The first check matrix is obtained by reading i rows and j columns from the mother matrix, i=p+k, j=q+k, p and q are respectively the quantity of rows and the quantity of columns in the basic matrix, k≥0), and i, j, p, q, and k are all integers.

Optionally, when k=0), the first check matrix is the basic matrix. When k>0), the first check matrix includes the basic matrix, and is obtained by extending the basic matrix to the right by k columns and then extending the basic matrix downward by k rows, where k>0, and k is an integer. For example, k=1, 2, 4, 50, or the like.

Check matrices of different sizes read from the mother matrix correspond to different code rates. For example, when the basic matrix is read from the mother matrix, the basic matrix is the first check matrix. In this case, the first check matrix corresponds to a maximum code rate. When the entire mother matrix is read, the mother matrix is the first check matrix. In this case, the first check matrix corresponds to a minimum code rate.

For ease of description, in the following, a corresponding code rate when the first check matrix is the basic matrix is referred to as a maximum code rate, and a corresponding code rate when the first check matrix is the mother matrix is referred to as a minimum code rate.

A check matrix corresponding to any code rate between the maximum code rate and the minimum code rate may be read from the mother matrix. Alternatively, when a value of k varies, the information bit sequence is encoded based on the first check matrix, to obtain first codewords at different code rates.

420: The transmit device sends the first codeword.

After LDPC encoding is performed on the information bit sequence, to obtain the first codeword, the transmit device sends the first codeword.

In this embodiment of this application, the basic matrix is extended, to obtain check matrices corresponding to different code rates. Because the check matrices corresponding to different code rates are obtained by extending the basic matrix on a basis that the basic matrix is fixed, LDPC encoding performed based on the check matrices can support compatibility with a plurality of code rates, and diversity gains can be obtained. This improves encoding performance.

In this embodiment of this application, for LDPC codes with code lengths of 1944 and at code rates of 1/2, 2/3, 3/4, and 5/6, check matrices (namely, basic matrices) of the LDPC codes are extended, to obtain mother matrices. Maximum code rates that can be supported by the mother matrices are respectively 1/2, 2/3, 3/4, and 5/6, namely, the foregoing maximum code rate. Minimum code rates that can be supported by the mother matrices are respectively 12/124=0.097, 16/124=0.129, 18/124=0.145, 20/124=0.161, namely, the foregoing minimum code rate. The following provides several examples of the mother matrix.

For brevity of description, check matrices of LDPC codes with code lengths of 1944 and at code rates of 1/2, 2/3, 3/4, and 5/6 that are used in a WLAN are first provided.

$$H_{MC}(1/2) \begin{bmatrix} 57 & - & - & - & 50 & - & 11 & - & 50 & - & 79 & - & 1 & 0 & - & - & - & - & - & - & - & - & - & - \\ 3 & - & 28 & - & 0 & - & - & - & 55 & 7 & - & - & - & 0 & 0 & - & - & - & - & - & - & - & - & - \\ 30 & - & - & - & 24 & 37 & - & - & 56 & 14 & - & - & - & - & 0 & 0 & - & - & - & - & - & - & - & - \\ 62 & 53 & - & - & 53 & - & - & 3 & 35 & - & - & - & - & - & - & 0 & 0 & - & - & - & - & - & - & - \\ 40 & - & - & 20 & 66 & - & - & 22 & 28 & - & - & - & - & - & - & - & 0 & 0 & - & - & - & - & - & - \\ 0 & - & - & - & 8 & - & 42 & - & 50 & - & - & 8 & - & - & - & - & - & 0 & 0 & - & - & - & - & - \\ 69 & 79 & 79 & - & - & - & 56 & - & 52 & - & - & - & 0 & - & - & - & - & - & 0 & 0 & - & - & - & - \\ 65 & - & - & - & 38 & 57 & - & - & 72 & - & 27 & - & - & - & - & - & - & - & - & 0 & 0 & - & - & - \\ 64 & - & - & - & 14 & 52 & - & - & 30 & - & - & 32 & - & - & - & - & - & - & - & - & 0 & 0 & - & - \\ - & 45 & - & 70 & 0 & - & - & - & 77 & 9 & - & - & - & - & - & - & - & - & - & - & - & 0 & 0 & - \\ 2 & 56 & - & 57 & 35 & - & - & - & - & 12 & - & - & - & - & - & - & - & - & - & - & - & - & 0 & 0 \\ 24 & - & 61 & - & 60 & - & - & 27 & 51 & - & - & 16 & 1 & - & - & - & - & - & - & - & - & - & - & 0 \end{bmatrix} \quad (1)$$

$H_{MC}(1/2)$ is used as an example. $H_{MC}(1/2)$ indicates a matrix with a size of 12 rows and 24 columns. Each element in the matrix indicates a $z=N/24$-order square matrix. 0 indicates an all-zero matrix with a size of z×z. Each item i in the matrix indicates a circulant shift matrix with a size of z×z, and i indicates a cyclic shift value. For example, when N=1944, z=1944/24=81. An element of i=0 in the matrix indicates an identity matrix with a size of 81×81. For another example, an element of i=1 indicates a cyclic shift matrix with a size of 81×81:

$$\begin{bmatrix} 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ 1 & 0 & 0 & \cdots & 0 \end{bmatrix}$$

Figure 5:
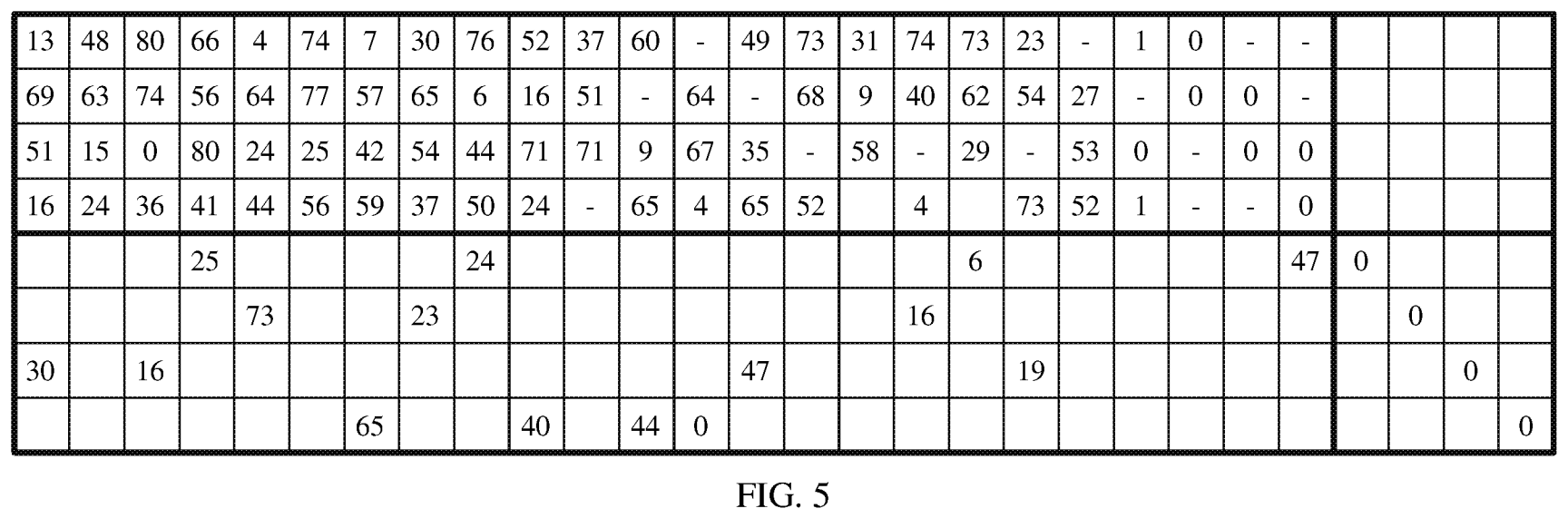

FIG. 5 shows an example of the check matrix obtained by extending $H_{MC}(5/6)$. As shown in FIG. 5, the matrix $H_{MC}(5/6)$ is located at the top-left corner of the matrix. $H_{MC}(5/6)$ is extended to the right by 4 columns, and HA (5/6) is extended downward by 4 rows, to obtain a mother matrix shown in FIG. 5. Each blank grid in FIG. 5 indicates an all-zero matrix with a size of 81×81, the matrix $H_{MC}(5/6)$ with a size of 4×24 is located at the top-left corner of the mother matrix, and a first fixed matrix is located at the top-right corner and is an all-zero matrix with a size of 4×4.

$$H_{MC}(2/3) = \begin{bmatrix} 61 & 75 & 4 & 63 & 56 & - & - & - & - & - & - & 8 & - & 2 & 17 & 25 & 1 & 0 & - & - & - & - & - & - \\ 56 & 74 & 77 & 20 & - & - & - & 64 & 24 & 4 & 67 & - & 7 & - & - & - & - & 0 & 0 & - & - & - & - & - \\ 28 & 21 & 68 & 10 & 7 & 14 & 65 & - & - & - & 23 & - & - & - & 75 & - & - & - & 0 & 0 & - & - & - & - \\ 48 & 38 & 43 & 78 & 76 & - & - & - & - & 5 & 36 & - & 15 & 72 & - & - & - & - & - & 0 & 0 & - & - & - \\ 40 & 2 & 53 & 25 & - & 52 & 62 & - & 20 & - & - & 44 & - & - & - & - & - & - & - & - & 0 & 0 & - & - \\ 69 & 23 & 64 & 10 & 22 & - & 21 & - & - & - & - & - & 68 & 23 & 29 & - & - & - & - & - & - & 0 & 0 & - \\ 12 & 0 & 68 & 20 & 55 & 61 & - & 40 & - & - & - & 52 & - & - & - & 44 & - & - & - & - & - & - & 0 & 0 \\ 58 & 8 & 34 & 64 & 78 & - & - & 11 & 78 & 24 & - & - & - & - & - & 58 & - & - & - & - & - & - & - & 0 \end{bmatrix} \quad (2)$$

$$H_{MC}(3/4) = \begin{bmatrix} 48 & 29 & 28 & 39 & 9 & 61 & - & - & - & 63 & 45 & 80 & - & - & - & 91 & 32 & 22 & 1 & 0 & - & - & - & - \\ 4 & 49 & 42 & 48 & 11 & 30 & - & - & - & 49 & 17 & 41 & 37 & 15 & - & 54 & - & - & - & 0 & 0 & - & - & - \\ 35 & 76 & 78 & 51 & 37 & 35 & 21 & - & 17 & 64 & - & - & - & 59 & 7 & - & - & 32 & - & - & 0 & 0 & - & - \\ 9 & 65 & 44 & 9 & 54 & 56 & 73 & 34 & 42 & - & - & - & 35 & - & - & - & 46 & 39 & 0 & - & - & 0 & 0 & - \\ 3 & 62 & 7 & 80 & 68 & 26 & - & 80 & 55 & - & 36 & - & 26 & - & 9 & - & 72 & - & - & - & - & - & 0 & 0 \\ 26 & 75 & 33 & 21 & 69 & 59 & 3 & 38 & - & - & - & 35 & - & 62 & 36 & 26 & - & - & 1 & - & - & - & - & 0 \end{bmatrix} \quad (3)$$

$$H_{MC}(5/6) = \begin{bmatrix} 13 & 48 & 80 & 66 & 4 & 74 & 7 & 30 & 76 & 52 & 37 & 60 & - & 49 & - & 73 & 31 & 74 & 73 & 23 & 1 & 0 & - & - \\ 69 & 63 & 74 & 56 & 64 & 77 & 57 & 65 & 6 & 16 & 51 & - & 64 & - & 64 & 68 & 9 & 48 & 62 & 54 & - & 0 & 0 & - \\ 51 & 15 & 0 & 8/0 & 24 & 25 & 42 & 54 & 44 & 71 & 71 & 9 & 67 & 35 & 67 & - & 58 & - & 29 & - & 0 & - & 0 & 0 \\ 16 & 29 & 36 & 41 & 44 & 56 & 59 & 37 & 50 & 24 & - & 65 & 4 & 65 & 4 & 52 & - & 4 & - & 73 & 1 & - & - & 0 \end{bmatrix} \quad (4)$$

Herein, meanings of elements in the check matrices $H_{MC}(2/3)$, $H_{MC}(3/4)$, and $H_{MC}(5/6)$ are the same as meanings of elements in $H_{MC}(1/2)$ described above. Details are not described again.

In this embodiment of this application, a location of the basic matrix is first fixed, and then the basic matrix is extended row by row and column by column. Each time the basic matrix is extended to the right by one column, the basic matrix is extended downward by one row, to seek optimal performance of the LDPC code. In this way, a current code rate of the LDPC code is optimal, to obtain an extension matrix. Then, the extension matrix is extended to the right by one row; and extended downward by one column, to seek optimal performance of the LDPC code. In this way, a current code rate of the LDPC code is optimal. A similar process is performed, and the matrix is gradually extended, to obtain the mother matrix.

For example, a code rate corresponding to $H_{MC}(5/6)$ is 5/6. If the basic matrix $H_{MC}(5/6)$ is expected to be extended to obtain a lower code rate, to increase incremental redundant bits in a retransmission process in an IR-HARQ mechanism, $H_{MC}(5/6)$ may be extended based on a required code rate.

For example, if the code rate corresponding to $H_{MC}(5/6)$ needs to be decreased from 5/6 to 4/7, or 324 incremental redundant bits need to be increased based on $H_{MC}(5/6)$, $H_{MC}(5/6)$ needs to be extended, based on H(5/6), to the right by several columns, and extended downward by several rows. A check matrix obtained through extension is shown in FIG. 5.

A matrix $H_{IR}(5/6)$ is located at the bottom-left corner of the mother matrix, and a second fixed matrix is located at the bottom-right corner of the mother matrix and is an identity matrix with a size of 4×4.

As shown in FIG. 5, a size of the extension matrix is 8×28. As described above, a code length N is equal to 1944. $H_{MC}(5/6)$ is extended, and each element in the extension matrix is a cyclic shift matrix with a size of 81×81. Therefore, the matrix shown in FIG. 5 is extended, to obtain the mother matrix, and an actual size of the mother matrix may be 648×2268.

In the foregoing, HA (5/6) is extended, so that a code rate corresponding to the check matrix is decreased from 5/6 to 4/7. If a check matrix corresponding to a code rate other than 4/7 is required, the transmit device reads, at the top-left corner of the mother matrix H(5/6), a matrix with a corresponding size, and uses the matrix as the check matrix.

For example, if 81·v incremental redundant bits need to be generated in addition to codeword bits of an LDPC code corresponding to $H_{MC}(5/6)$, a matrix with a size of (4+v)× (24+v) is read from the mother matrix H(5/6) shown in FIG. 5, and is used as the check matrix, v is a positive integer.

The foregoing describes a process of extending from the basic matrix to the mother matrix by using the check matrix $H_{MC}(5/6)$ corresponding to the code rate of 5/6 as an example. A process of extending a basic matrix corresponding to another code rate is also based on a same design concept.

The following separately describes mother matrices obtained through extension based on check matrices with a code rate of 1/2, 2/3, 3/4, and 5/6.

In an embodiment, a mother matrix obtained by extending a basic matrix at a code rate of 1/2 is shown in a formula (1):

$$H(1/2) = \begin{bmatrix} H_{MC}(1/2) & 0_{12 \times r} \\ H_{IR}(1/2) & I_{r \times r} \end{bmatrix} \quad (1)$$

In the formula (1), H(1/2) indicates the mother matrix, HA (1/2) indicates the basic matrix, $H_{IR}(1/2)$ indicates the extension matrix, a size of $H_{IR}(1/2)$ is r rows and 24 columns, 1/2 indicates the code rate, $0_{12 \times r}$ indicates the first fixed matrix, $I_{r \times r}$ indicates the second fixed matrix, $0_{12 \times r}$ indicates an all-zero matrix with a size of 12 rows and r columns, $I_{r \times r}$ indicates an identity matrix with a size of r rows and r columns, r≥1, and r is an integer. For $H_{MC}(1/2)$, refer to the foregoing description.

It should be noted that H(1/2) indicates the mother matrix, and indicates that the mother matrix is obtained by extending the check matrix at the code rate of 1/2 as a basic matrix.

Table 1 indicates a matrix with a size of 100 rows and 24 columns, and the matrix is referred to as a first matrix in the following. $H_{IR}(1/2)$ is obtained by reading r rows and 24 columns from the first matrix, and the r rows are any r rows in the 100 rows in the first matrix. In other words, r rows and 24 columns are read from 100 rows in the first matrix indicated by Table 1, to form $H_{IR}(1/2)$.

It should be understood that, when r rows in the first matrix are read, 24 columns of elements that are corresponding to the r rows and that are in the first matrix are also uniquely determined, and a formed matrix is $H_{IR}(1/2)$.

Table 1 is shown as follows:

TABLE 1

| | | | n | | |
|---|---|---|---|---|---|
| d | 1 | 2 | 3 | 4 | 5 |
| 5 | 0.22 | 1.34 | 4.39 | 8.29 | 11.80 |
| 5 | 0.7 | 1.60 | 4.20 | 8.7 | 13.15 |
| 5 | 0.56 | 4.2 | 7.77 | 8.69 | 9.8 |
| 5 | 0.79 | 1.49 | 4.72 | 8.75 | 10.58 |
| 5 | 1.47 | 4.18 | 7.22 | 8.38 | 9.75 |
| 5 | 1.63 | 4.80 | 8.21 | 9.50 | 10.32 |
| 4 | 3.30 | 4.44 | 8.55 | 10.21 | |
| 4 | 0.26 | 4.67 | 5.2 | 8.36 | |
| 4 | 4.9 | 5.14 | 6.73 | 8.67 | |
| 4 | 0.44 | 4.35 | 8.78 | 22.63 | |
| 4 | 0.67 | 4.18 | 8.8 | 23.53 | |
| 4 | 0.56 | 4.45 | 5.9 | 6.5 | |
| 4 | 0.50 | 4.50 | 8.25 | 15.45 | |
| 4 | 0.4 | 6.76 | 8.28 | 23.34 | |
| 4 | 0.8 | 4.50 | 5.40 | 6.62 | |
| 4 | 0.80 | 4.20 | 6.32 | 13.13 | |
| 4 | 0.38 | 4.47 | 8.38 | 11.0 | |
| 4 | 0.55 | 5.45 | 8.57 | 15.71 | |
| 3 | 0.49 | 4.67 | 17.7 | | |
| 3 | 4.33 | 8.79 | 17.27 | | |
| 4 | 4.76 | 8.47 | 11.17 | 23.58 | |
| 4 | 0.68 | 8.39 | 11.19 | 15.26 | |
| 4 | 4.3 | 6.31 | 8.43 | 17.6 | |
| 3 | 4.24 | 8.69 | 13.76 | | |
| 4 | 0.42 | 4.1 | 8.40 | 21.10 | |
| 3 | 0.26 | 8.34 | 21.37 | | |
| 4 | 0.63 | 2.66 | 4.47 | 8.74 | |
| 3 | 4.59 | 11.46 | 21.3 | | |
| 3 | 0.67 | 4.67 | 22.53 | | |
| 3 | 0.69 | 11.47 | 17.35 | | |
| 3 | 0.54 | 8.56 | 9.36 | | |
| 3 | 0.24 | 3.26 | 4.17 | | |
| 3 | 2.32 | 4.43 | 17.77 | | |
| 3 | 0.78 | 2.7 | 8.76 | | |
| 3 | 4.36 | 11.3 | 17.9 | | |

TABLE 1-continued

| | | | n | | |
|---|---|---|---|---|---|
| d | 1 | 2 | 3 | 4 | 5 |
| 3 | 0.45 | 4.14 | 19.39 | | |
| 3 | 0.4 | 3.0 | 8.59 | | |
| 3 | 0.4 | 8.31 | 19.31 | | |
| 3 | 0.33 | 8.54 | 9.34 | | |
| 3 | 2.32 | 3.39 | 13.48 | | |
| 3 | 0.69 | 8.6 | 21.47 | | |
| 2 | 5.22 | 6.46 | | | |
| 3 | 5.10 | 6.64 | 17.77 | | |
| 2 | 6.66 | 23.42 | | | |
| 2 | 5.62 | 11.65 | | | |
| 3 | 6.43 | 11.23 | 17.43 | | |
| 2 | 9.48 | 17.16 | | | |
| 3 | 6.23 | 11.29 | 17.6 | | |
| 2 | 1.44 | 11.70 | | | |
| 2 | 3.11 | 6.3 | | | |
| 2 | 9.59 | 11.34 | | | |
| 2 | 2.49 | 11.16 | | | |
| 2 | 3.1 | 5.10 | | | |
| 2 | 2.19 | 17.8 | | | |
| 3 | 1.77 | 3.17 | 11.17 | | |
| 3 | 6.20 | 11.17 | 17.18 | | |
| 2 | 6.44 | 13.16 | | | |
| 3 | 6.69 | 11.71 | 17.4 | | |
| 3 | 3.36 | 11.27 | 17.18 | | |
| 2 | 6.0 | 22.52 | | | |
| 3 | 1.56 | 11.42 | 17.39 | | |
| 3 | 5.43 | 6.14 | 11.9 | | |
| 3 | 3.80 | 11.50 | 17.31 | | |
| 2 | 1.22 | 3.38 | | | |
| 2 | 7.34 | 17.64 | | | |
| 2 | 6.80 | 21.59 | | | |
| 3 | 5.43 | 6.31 | 17.77 | | |
| 2 | 6.71 | 10.48 | | | |
| 3 | 1.21 | 6.54 | 17.22 | | |
| 3 | 5.65 | 6.58 | 17.41 | | |
| 2 | 7.56 | 17.78 | | | |
| 2 | 6.47 | 21.21 | | | |
| 3 | 1.70 | 3.13 | 17.41 | | |
| 3 | 2.22 | 6.19 | 17.8 | | |
| 3 | 5.63 | 6.74 | 11.14 | | |
| 3 | 6.58 | 10.59 | 17.17 | | |
| 3 | 1.29 | 3.29 | 5.59 | | |
| 3 | 6.72 | 10.71 | 17.32 | | |
| 2 | 9.21 | 17.24 | | | |
| 3 | 2.46 | 11.79 | 17.46 | | |
| 3 | 1.19 | 6.51 | 17.75 | | |
| 2 | 6.53 | 15.34 | | | |
| 3 | 6.28 | 11.34 | 22.24 | | |
| 3 | 3.73 | 6.64 | 11.79 | | |
| 2 | 11.25 | 13.49 | | | |
| 3 | 6.48 | 7.72 | 11.64 | | |
| 3 | 6.41 | 10.18 | 11.1 | | |
| 2 | 6.32 | 21.41 | | | |
| 3 | 3.9 | 5.45 | 6.74 | | |
| 3 | 1.18 | 3.25 | 17.50 | | |
| 2 | 12.72 | 17.11 | | | |
| 3 | 10.43 | 11.75 | 17.40 | | |
| 3 | 3.29 | 9.57 | 11.34 | | |
| 3 | 10.76 | 11.67 | 17.71 | | |
| 2 | 17.54 | 23.74 | | | |
| 3 | 6.23 | 11.5 | 17.66 | | |
| 2 | 6.70 | 18.17 | | | |
| 2 | 3.59 | 22.41 | | | |
| 3 | 1.72 | 3.3 | 17.74 | | |
| 3 | 3.25 | 9.31 | 11.68 | | |

In Table 1, an $m^{th}$ element from top to bottom in a column in which d is located indicates a row weight of row m in the first matrix, an $n^{th}$ element (a, b) from left to right in row m in the first matrix indicates that a cyclic shift coefficient of a cyclic shift matrix in row m and column (a+n) in the first matrix is b, all remaining locations in the first matrix are all-zero matrices, n∈{1, 2, 3, 4, 5}, and m, n, a, and b are all positive integers.

It should be understood that the row weight of row m in the first matrix indicates a quantity of elements "1" in row m in the first matrix.

For example, a value of the first element from top to bottom in column 1 in Table 1 is 5. It indicates that a row weight of row 1 in the first matrix is 5. The first element from left to right in row 1 is (0, 22). It indicates that a cyclic shift value of a cyclic shift matrix in column (0+1) and row 1 in the first matrix is 22. Elements in remaining columns and row 1 in the first matrix indicate all-zero matrices.

For another example, a value of the tenth element from top to bottom in column 1 in Table 1 is 4. It indicates that a row weight of row 10 in the first matrix is 4. The third element from left to right in row 10 is (8, 78). It indicates that a cyclic shift value of column (8+3) in the first matrix is 78. In other words, a cyclic shift value of a cyclic shift matrix in row 10 and column 11 in the first matrix is 78. Elements in remaining columns and row 10 in the first matrix indicate all-zero matrices.

Optionally, in an embodiment, H(1/2) is extended to the right by 100 columns, and extended downward by 100 rows, and an obtained mother matrix is shown in a formula (2):

$$H(1/2) = \begin{bmatrix} H_{MC}(1/2) & 0_{12 \times 100} \\ H_{IR}(1/2) & I_{100 \times 100} \end{bmatrix} \quad (2)$$

In the formula (2), H(1/2) indicates the mother matrix, and $H_{MC}(1/2)$ indicates a basic matrix with a size of 12 rows and 24 columns. For details, refer to the foregoing description. $H_{IR}(1/2)$ indicates the extension matrix, 1/2 indicates the code rate, $0_{12 \times 100}$ indicates the first fixed matrix, and $I_{12 \times 100}$ indicates the second fixed matrix. Specifically, $0_{12 \times 100}$ indicates an all-zero matrix with a size of 12 rows and 100 columns, and $I_{100 \times 100}$ indicates an identity matrix with a size of 100 rows and 100 columns.

It may be understood that, when r=100 in the formula (1), the formula (2) is obtained. As shown in Table 1, a size of $H_{IR}(1/2)$ in the formula (2) is 100 rows and 24 columns.

Optionally, when 1≤r<100, a matrix $H_{IR}(1/2)$ with a size of r rows and 24 columns may be determined according to Table 1, and a mother matrix with a size of (12+100) rows and (24+100) columns may further be obtained based on $H_{MC}(1/2)$, $0_{12 \times r}$, and $I_{r \times r}$. Specifically, $H_{IR}(1/2)$ may be obtained by reading r rows and 24 columns from Table 1.

In an embodiment, r rows and 24 columns are read from Table 1 in ascending order of row indexes, to obtain $H_{IR}(1/2)$, where the r rows are r rows with consecutive row indexes in the first matrix.

For example, when r=4, 4 rows and 24 columns are read from the first matrix indicated by Table 1, to obtain $H_{IR}(1/2)$, where the 4 rows are row 1 to row 4 in the first matrix, as shown in Table 2.

TABLE 2

| d | n | | | | |
|---|---|---|---|---|---|
|   | 1 | 2 | 3 | 4 | 5 |
| 5 | 0.29 | 4.22 | 6.80 | 8.34 | 10.39 |
| 3 | 1.60 | 7.20 | 11.15 | | |
| 3 | 2.7 | 5.7 | 12.77 | | |
| 2 | 9.56 | 13.69 | | | |

For another example, when r=50, $H_{IR}(1/2)$ is a matrix with a size of 50×24. 50 rows and 24 columns are read from the first matrix in ascending order of row indexes, to obtain $H_{IR}(1/2)$. The 50 rows are row 1 to row 50 in the first matrix. In this case, $H_{IR}(1/2)$ is shown in Table 3.

TABLE 3

| d | n | | | | |
|---|---|---|---|---|---|
|   | 1 | 2 | 3 | 4 | 5 |
| 5 | 0.22 | 1.34 | 4.39 | 8.29 | 11.80 |
| 5 | 0.7 | 1.60 | 4.20 | 8.7 | 13.15 |
| 5 | 0.56 | 4.2 | 7.77 | 8.69 | 9.8 |
| 5 | 0.79 | 1.49 | 4.72 | 8.75 | 10.58 |
| 5 | 1.47 | 4.18 | 7.22 | 8.38 | 9.75 |
| 5 | 1.63 | 4.80 | 8.21 | 9.50 | 10.32 |
| 4 | 3.30 | 4.44 | 8.55 | 10.21 | |
| 4 | 0.26 | 4.67 | 5.2 | 8.36 | |
| 4 | 4.9 | 5.14 | 6.73 | 8.67 | |
| 4 | 0.44 | 4.35 | 8.78 | 22.63 | |
| 4 | 0.67 | 4.18 | 8.8 | 23.53 | |
| 4 | 0.56 | 4.45 | 5.9 | 6.5 | |
| 4 | 0.50 | 4.50 | 8.25 | 15.45 | |
| 4 | 0.4 | 6.76 | 8.28 | 23.34 | |
| 4 | 0.8 | 4.50 | 5.40 | 6.62 | |
| 4 | 0.80 | 4.20 | 6.32 | 13.13 | |
| 4 | 0.38 | 4.47 | 8.38 | 11.0 | |
| 4 | 0.55 | 5.45 | 8.57 | 15.71 | |
| 3 | 0.49 | 4.67 | 17.7 | | |
| 3 | 4.33 | 8.79 | 17.27 | | |
| 4 | 4.76 | 8.47 | 11.17 | 23.58 | |
| 4 | 0.68 | 8.39 | 11.19 | 15.26 | |
| 4 | 4.3 | 6.31 | 8.43 | 17.6 | |
| 3 | 4.24 | 8.69 | 13.76 | | |
| 4 | 0.42 | 4.1 | 8.40 | 21.10 | |
| 3 | 0.26 | 8.34 | 21.37 | | |
| 4 | 0.63 | 2.66 | 4.47 | 8.74 | |
| 3 | 4.59 | 11.46 | 21.3 | | |
| 3 | 0.67 | 4.67 | 22.53 | | |
| 3 | 0.69 | 11.47 | 17.35 | | |
| 3 | 0.54 | 8.56 | 9.36 | | |
| 3 | 0.24 | 3.26 | 4.17 | | |
| 3 | 2.32 | 4.43 | 17.77 | | |
| 3 | 0.78 | 2.7 | 8.76 | | |
| 3 | 4.36 | 11.3 | 17.9 | | |
| 3 | 0.45 | 4.14 | 19.39 | | |
| 3 | 0.4 | 3.0 | 8.59 | | |
| 3 | 0.4 | 8.31 | 19.31 | | |
| 3 | 0.33 | 8.54 | 9.34 | | |
| 3 | 2.32 | 3.39 | 13.48 | | |
| 3 | 0.69 | 8.6 | 21.47 | | |
| 2 | 5.22 | 6.46 | | | |
| 3 | 5.10 | 6.64 | 17.77 | | |
| 2 | 6.66 | 23.42 | | | |
| 2 | 5.62 | 11.65 | | | |
| 3 | 6.43 | 11.23 | 17.43 | | |
| 2 | 9.48 | 17.16 | | | |
| 3 | 6.23 | 11.29 | 17.6 | | |
| 2 | 1.44 | 11.70 | | | |
| 2 | 3.11 | 6.3 | | | |

Optionally, in another embodiment, according to another reading rule, r rows are read from Table 1, and used as the r rows in $H_{IR}(1/2)$. For example, 4 rows are randomly read from 100 rows in Table 1, or 4 rows are randomly read from rows whose indexes are even numbers.

Optionally, in another embodiment, Table 4 indicates a matrix with a size of 100 rows and 24 columns, and the matrix is referred to as a second matrix in the following. $H_{IR}(1/2)$ is obtained by reading r rows and 24 columns from the second matrix, and the r rows are any r rows in the 100 rows in the second matrix. Table 4 is shown as follows:

TABLE 4

| d | 1 | 2 | 3 | 4 | 5 |
|---|---|---|---|---|---|
| 5 | 0.29 | 4.22 | 6.80 | 8.34 | 10.39 |
| 3 | 1.60 | 7.20 | 11.15 | | |
| 3 | 2.7 | 5.7 | 12.77 | | |
| 2 | 9.56 | 13.69 | | | |
| 2 | 14.2 | 15.8 | | | |
| 2 | 3.49 | 16.75 | | | |
| 2 | 17.79 | 20.72 | | | |
| 2 | 19.58 | 21.22 | | | |
| 5 | 4.47 | 4.80 | 18.75 | 22.18 | 23.38 |
| 2 | 0.21 | 8.50 | | | |
| 2 | 5.32 | 6.63 | | | |
| 2 | 1.30 | 7.55 | | | |
| 2 | 9.21 | 11.44 | | | |
| 2 | 2.67 | 12.36 | | | |
| 2 | 13.26 | 14.2 | | | |
| 2 | 15.14 | 16.67 | | | |
| 2 | 3.9 | 17.73 | | | |
| 2 | 18.35 | 20.78 | | | |
| 2 | 21.63 | 22.44 | | | |
| 4 | 0.67 | 8.53 | 19.8 | 23.18 | |
| 2 | 4.9 | 8.56 | | | |
| 2 | 1.5 | 5.45 | | | |
| 2 | 7.50 | 9.25 | | | |
| 2 | 6.50 | 15.45 | | | |
| 2 | 2.76 | 11.4 | | | |
| 2 | 12.34 | 14.28 | | | |
| 2 | 13.62 | 16.8 | | | |
| 2 | 3.50 | 17.40 | | | |
| 2 | 20.32 | 23.13 | | | |
| 2 | 18.20 | 21.80 | | | |
| 4 | 8.38 | 8.47 | 19.0 | 22.38 | |
| 2 | 0.71 | 4.57 | | | |
| 2 | 1.55 | 7.45 | | | |
| 2 | 5.49 | 11.67 | | | |
| 2 | 6.7 | 9.79 | | | |
| 2 | 15.27 | 16.33 | | | |
| 2 | 2.76 | 3.47 | | | |
| 2 | 14.17 | 17.58 | | | |
| 2 | 12.39 | 19.26 | | | |
| 2 | 13.68 | 21.19 | | | |
| 2 | 22.3 | 23.31 | | | |
| 4 | 8.69 | 8.76 | 18.43 | 20.6 | |
| 2 | 0.24 | 4.1 | | | |
| 2 | 1.40 | 7.42 | | | |
| 2 | 5.10 | 9.37 | | | |
| 2 | 3.26 | 11.34 | | | |
| 2 | 15.66 | 16.63 | | | |
| 2 | 6.47 | 20.74 | | | |
| 2 | 2.59 | 14.46 | | | |
| 2 | 17.53 | 21.3 | | | |
| 2 | 13.67 | 18.67 | | | |
| 2 | 12.69 | 22.47 | | | |
| 3 | 4.36 | 19.54 | 23.35 | | |
| 2 | 0.17 | 8.56 | | | |
| 2 | 1.24 | 9.26 | | | |
| 2 | 7.32 | 11.77 | | | |
| 2 | 5.7 | 15.43 | | | |
| 2 | 3.78 | 10.76 | | | |
| 2 | 2.3 | 20.9 | | | |
| 2 | 16.36 | 19.14 | | | |
| 2 | 6.45 | 14.39 | | | |
| 2 | 12.0 | 23.59 | | | |
| 2 | 13.4 | 17.4 | | | |
| 2 | 21.31 | 22.31 | | | |
| 3 | 8.33 | 8.34 | 18.54 | | |
| 2 | 0.32 | 1.39 | | | |
| 2 | 3.6 | 7.48 | | | |
| 2 | 5.47 | 9.69 | | | |
| 2 | 11.46 | 18.22 | | | |
| 2 | 2.10 | 15.77 | | | |
| 2 | 6.66 | 10.64 | | | |
| 2 | 12.42 | 23.65 | | | |
| 2 | 16.62 | 17.23 | | | |
| 2 | 14.43 | 20.43 | | | |
| 2 | 13.16 | 19.48 | | | |
| 3 | 8.23 | 21.29 | 22.6 | | |
| 2 | 0.44 | 4.70 | | | |
| 2 | 1.3 | 7.11 | | | |
| 2 | 9.34 | 11.59 | | | |
| 2 | 3.49 | 5.16 | | | |
| 2 | 15.10 | 18.1 | | | |
| 2 | 2.19 | 21.8 | | | |
| 2 | 14.77 | 16.17 | | | |
| 2 | 6.17 | 17.20 | | | |
| 2 | 10.18 | 20.17 | | | |
| 2 | 12.44 | 23.16 | | | |
| 2 | 13.69 | 22.4 | | | |
| 3 | 8.27 | 8.36 | 19.71 | | |
| 2 | 1.18 | 4.0 | | | |
| 2 | 7.52 | 9.39 | | | |
| 2 | 3.42 | 5.56 | | | |
| 2 | 11.43 | 21.9 | | | |
| 2 | 10.14 | 15.31 | | | |
| 2 | 19.50 | 20.80 | | | |
| 2 | 6.22 | 18.38 | | | |
| 2 | 12.64 | 14.34 | | | |
| 2 | 2.80 | 16.59 | | | |
| 2 | 22.43 | 23.31 | | | |
| 3 | 8.71 | 13.77 | 17.48 | | |
| 2 | 0.22 | 4.21 | | | |

In Table 4, an $m^{th}$ element from top to bottom in a column in which d is located indicates a row weight of row m in the second matrix, an $n^{th}$ element (a, b) from left to right in row m in the second matrix indicates that a cyclic shift coefficient of a cyclic shift matrix in row m and column (a+n) in the second matrix is b, all remaining locations in the second matrix are all-zero matrices, $n \in \{1, 2, 3, 4, 5\}$, and m, a, and b are all positive integers. In another embodiment, a mother matrix obtained by extending a basic matrix $H_{MC}(2/3)$ may be shown in a formula (3):

$$H(2/3) = \begin{bmatrix} H_{MC}(2/3) & 0_{8 \times r} \\ H_{IR}(2/3) & I_{r \times r} \end{bmatrix} \quad (3)$$

$H(2/3)$ indicates the mother matrix, $H_{MC}(2/3)$ indicates the basic matrix, $H_{IR}(2/3)$ indicates the extension matrix, a size of $H_{IR}(2/3)$ is r rows and 8 columns, 2/3 indicates the code rate, $0_{8 \times r}$ indicates the first fixed matrix, $I_{r \times r}$ indicates the second fixed matrix, $0_{8 \times r}$ indicates an all-zero matrix with a size of 8 rows and r columns, $I_{r \times r}$ indicates an identity matrix with a size of r rows and r columns, $r \geq 1$, $k \leq r$, and r is an integer. For $H_{MC}(2/3)$ refer to the foregoing description.

Optionally, $H_{IR}(2/3)$ may be obtained by reading r rows from Table 5 or Table 6.

In an implementation, r rows are read from Table 5 or Table 6 in order of row indexes from top to bottom. In some other embodiments, r rows are randomly read from Table 5 or Table 6, to obtain $H_{IR}(2/3)$.

TABLE 5

| | n | | | | | | |
|---|---|---|---|---|---|---|---|
| d | 1 | 2 | 3 | 4 | 5 | 6 | 7 |
| 6 | 1.39 | 2.34 | 3.22 | 4.80 | 7.29 | 12.15 | |
| 6 | 0.77 | 1.7 | 2.7 | 3.20 | 7.69 | 12.60 | |
| 7 | 0.75 | 1.2 | 2.49 | 3.8 | 7.72 | 12.79 | 13.56 |
| 7 | 0.38 | 2.18 | 3.22 | 4.75 | 8.80 | 12.47 | 13.58 |

TABLE 5-continued

| d | 1 | 2 | 3 | 4 | 5 | 6 | 7 |
|---|---|---|---|---|---|---|---|
| 7 | 0.21 | 2.32 | 3.63 | 4.50 | 8.21 | 12.55 | 14.30 |
| 6 | 0.67 | 1.67 | 2.26 | 3.36 | 7.2 | 18.44 | |
| 6 | 1.9 | 2.35 | 3.78 | 5.73 | 8.14 | 12.44 | |
| 5 | 0.18 | 1.63 | 2.67 | 3.53 | 17.8 | | |
| 5 | 1.45 | 2.5 | 3.56 | 7.50 | 11.9 | | |
| 6 | 0.28 | 1.76 | 2.50 | 3.25 | 7.45 | 21.4 | |
| 6 | 0.32 | 1.40 | 2.34 | 3.50 | 12.62 | 19.8 | |
| 5 | 0.38 | 1.80 | 3.0 | 6.20 | 12.13 | | |
| 5 | 1.71 | 2.47 | 3.57 | 12.55 | 23.38 | | |
| 5 | 0.45 | 1.79 | 2.7 | 10.49 | 12.67 | | |
| 5 | 0.27 | 1.47 | 2.17 | 3.76 | 22.33 | | |
| 5 | 0.58 | 1.68 | 2.26 | 12.39 | 16.19 | | |
| 4 | 0.31 | 1.3 | 3.43 | 20.6 | | | |
| 5 | 0.40 | 2.69 | 3.76 | 12.24 | 15.1 | | |
| 5 | 1.34 | 2.26 | 3.42 | 12.37 | 20.10 | | |
| 4 | 0.66 | 2.63 | 3.74 | 9.47 | | | |
| 5 | 0.67 | 1.53 | 3.59 | 5.46 | 20.3 | | |
| 4 | 2.47 | 3.67 | 12.69 | 17.35 | | | |
| 4 | 0.54 | 1.56 | 3.17 | 11.36 | | | |
| 5 | 1.43 | 2.24 | 3.77 | 6.26 | 10.32 | | |
| 4 | 0.76 | 2.7 | 3.78 | 5.3 | | | |
| 4 | 0.9 | 1.45 | 6.14 | 23.36 | | | |
| 4 | 1.4 | 2.0 | 3.39 | 14.59 | | | |
| 4 | 0.4 | 2.54 | 3.31 | 16.31 | | | |
| 4 | 1.34 | 3.33 | 9.32 | 16.39 | | | |
| 3 | 2.6 | 3.48 | 22.47 | | | | |
| 4 | 1.46 | 2.69 | 3.22 | 21.77 | | | |
| 4 | 1.64 | 2.66 | 3.42 | 19.10 | | | |
| 4 | 1.43 | 3.65 | 9.23 | 14.62 | | | |
| 4 | 0.16 | 1.6 | 3.48 | 15.43 | | | |
| 4 | 1.44 | 2.23 | 3.70 | 11.29 | | | |
| 3 | 2.34 | 10.3 | 11.11 | | | | |
| 3 | 0.59 | 1.49 | 18.16 | | | | |
| 3 | 1.10 | 2.8 | 14.1 | | | | |
| 4 | 1.17 | 2.19 | 5.17 | 21.77 | | | |
| 4 | 1.44 | 2.20 | 5.17 | 15.18 | | | |
| 3 | 1.4 | 2.69 | 14.16 | | | | |
| 4 | 0.27 | 7.18 | 13.36 | 14.71 | | | |
| 3 | 0.0 | 9.39 | 12.52 | | | | |
| 3 | 0.43 | 5.56 | 14.42 | | | | |
| 3 | 0.31 | 6.9 | 21.14 | | | | |
| 2 | 0.80 | 9.50 | | | | | |
| 3 | 0.64 | 9.22 | 10.38 | | | | |
| 3 | 0.34 | 14.59 | 16.80 | | | | |
| 3 | 0.43 | 11.31 | 14.77 | | | | |
| 3 | 0.71 | 6.22 | 9.48 | | | | |
| 3 | 0.21 | 11.54 | 16.41 | | | | |
| 3 | 5.78 | 9.58 | 14.65 | | | | |
| 2 | 14.47 | 15.56 | | | | | |
| 3 | 12.21 | 14.13 | 16.41 | | | | |
| 3 | 10.19 | 12.70 | 16.8 | | | | |
| 3 | 9.74 | 11.63 | 14.22 | | | | |
| 3 | 9.17 | 12.14 | 20.59 | | | | |
| 2 | 11.58 | 12.29 | | | | | |
| 3 | 6.29 | 14.59 | 16.32 | | | | |
| 2 | 5.72 | 6.71 | | | | | |
| 3 | 11.79 | 14.24 | 15.21 | | | | |
| 2 | 9.46 | 10.46 | | | | | |
| 3 | 9.75 | 15.51 | 16.19 | | | | |
| 3 | 9.34 | 12.28 | 14.53 | | | | |
| 3 | 6.24 | 7.64 | 14.34 | | | | |
| 2 | 5.73 | 16.79 | | | | | |
| 2 | 11.49 | 13.25 | | | | | |
| 3 | 9.64 | 12.72 | 14.48 | | | | |
| 3 | 15.18 | 16.41 | 18.1 | | | | |
| 3 | 11.45 | 12.41 | 14.32 | | | | |
| 3 | 6.9 | 12.25 | 14.74 | | | | |
| 3 | 8.50 | 12.18 | 14.72 | | | | |
| 3 | 5.75 | 9.43 | 14.11 | | | | |
| 3 | 12.34 | 14.40 | 21.57 | | | | |
| 3 | 12.76 | 13.71 | 14.29 | | | | |
| 3 | 6.67 | 11.54 | 14.74 | | | | |
| 2 | 12.23 | 13.5 | | | | | |
| 3 | 5.66 | 10.17 | 14.70 | | | | |
| 3 | 7.59 | 12.72 | 14.41 | | | | |
| 3 | 12.3 | 14.74 | 15.31 | | | | |
| 3 | 9.25 | 14.68 | 23.54 | | | | |
| 3 | 5.65 | 10.18 | 14.15 | | | | |
| 3 | 5.11 | 6.21 | 14.29 | | | | |
| 3 | 7.30 | 9.33 | 12.29 | | | | |
| 3 | 6.80 | 12.50 | 16.79 | | | | |
| 2 | 4.41 | 14.51 | | | | | |
| 2 | 14.41 | 20.45 | | | | | |
| 3 | 9.18 | 11.51 | 15.77 | | | | |
| 3 | 5.67 | 11.3 | 12.6 | | | | |
| 3 | 10.58 | 14.56 | 15.34 | | | | |
| 3 | 6.64 | 12.30 | 16.14 | | | | |
| 3 | 4.69 | 11.11 | 12.58 | | | | |
| 2 | 11.59 | 21.74 | | | | | |
| 3 | 5.38 | 7.52 | 14.48 | | | | |
| 3 | 5.16 | 7.58 | 12.41 | | | | |
| 3 | 6.2 | 14.80 | 15.63 | | | | |
| 3 | 6.25 | 12.8 | 20.35 | | | | |
| 3 | 10.26 | 11.64 | 15.4 | | | | |
| 3 | 7.39 | 14.68 | 15.61 | | | | |
| 3 | 10.26 | 12.66 | 15.50 | | | | |

In Table 5, an $m^{th}$ element from top to bottom in a column in which d is located indicates a row weight of row m in a third matrix, an $n^{th}$ element (a, b) from left to right in row m in the third matrix indicates that a cyclic shift coefficient of a cyclic shift matrix in row m and column (a+n) in the third matrix is b, all remaining locations in the third matrix are all-zero matrices, $n \in \{1, 2, 3, 4, 5, 6, 7\}$, and m, a, and b are all positive integers.

TABLE 6

| d | 1 | 2 | 3 | 4 | 5 |
|---|---|---|---|---|---|
| 5 | 0.34 | 1.39 | 2.22 | 3.80 | 4.29 |
| 5 | 7.15 | 11.20 | 14.7 | 15.60 | 16.7 |
| 4 | 5.77 | 8.2 | 9.56 | 13.69 | |
| 3 | 6.8 | 10.49 | 12.75 | | |
| 3 | 17.79 | 18.58 | 19.72 | | |
| 5 | 3.47 | 20.22 | 21.18 | 22.38 | 23.75 |
| 4 | 0.32 | 1.21 | 2.80 | 4.50 | |
| 3 | 13.63 | 14.30 | 15.55 | | |
| 3 | 7.21 | 11.67 | 16.44 | | |
| 3 | 5.26 | 8.2 | 9.36 | | |
| 3 | 6.9 | 10.14 | 12.67 | | |
| 2 | 22.73 | 23.78 | | | |
| 2 | 20.44 | 21.35 | | | |
| 5 | 0.53 | 1.67 | 17.8 | 18.63 | 19.18 |
| 2 | 0.56 | 3.9 | | | |
| 3 | 4.50 | 13.45 | 14.5 | | |
| 3 | 11.50 | 15.45 | 16.25 | | |
| 3 | 7.28 | 8.76 | 9.4 | | |
| 3 | 5.8 | 10.34 | 12.62 | | |
| 2 | 6.40 | 19.50 | | | |
| 2 | 17.13 | 18.32 | | | |
| 5 | 0.47 | 20.20 | 21.0 | 22.80 | 23.38 |
| 3 | 1.57 | 3.71 | 4.38 | | |
| 2 | 2.55 | 13.45 | | | |
| 3 | 11.7 | 14.49 | 15.67 | | |
| 2 | 7.79 | 16.27 | | | |
| 3 | 5.47 | 8.76 | 9.33 | | |
| 3 | 6.17 | 10.39 | 12.58 | | |
| 3 | 17.19 | 18.68 | 19.26 | | |
| 2 | 20.3 | 23.31 | | | |
| 4 | 1.69 | 1.76 | 21.6 | 22.43 | |
| 3 | 0.1 | 2.24 | 3.40 | | |
| 2 | 13.10 | 14.42 | | | |
| 3 | 11.34 | 15.26 | 16.37 | | |
| 2 | 9.63 | 12.66 | | | |
| 3 | 5.47 | 7.74 | 8.59 | | |
| 2 | 10.46 | 22.3 | | | |

TABLE 6-continued

| | n | | | | |
|---|---|---|---|---|---|
| d | 1 | 2 | 3 | 4 | 5 |
| 2 | 6.53 | 21.67 | | | |
| 2 | 17.47 | 18.67 | | | |
| 4 | 0.36 | 19.54 | 20.35 | 23.69 | |
| 2 | 1.56 | 3.17 | | | |
| 2 | 2.26 | 4.24 | | | |
| 3 | 13.32 | 14.77 | 15.43 | | |
| 2 | 11.78 | 16.7 | | | |
| 2 | 5.3 | 8.76 | | | |
| 3 | 7.36 | 9.9 | 10.14 | | |
| 2 | 6.45 | 22.39 | | | |
| 2 | 12.59 | 23.0 | | | |
| 2 | 20.4 | 21.4 | | | |
| 4 | 0.34 | 17.31 | 18.31 | 19.54 | |
| 3 | 1.39 | 2.32 | 3.33 | | |
| 2 | 4.6 | 13.48 | | | |
| 2 | 5.69 | 15.47 | | | |
| 2 | 7.46 | 14.22 | | | |
| 2 | 8.10 | 11.77 | | | |
| 2 | 9.66 | 19.64 | | | |
| 2 | 16.65 | 17.42 | | | |
| 2 | 6.62 | 10.23 | | | |
| 2 | 12.43 | 18.43 | | | |
| 2 | 20.16 | 23.48 | | | |
| 4 | 1.23 | 1.44 | 21.29 | 22.6 | |
| 2 | 0.3 | 2.70 | | | |
| 2 | 4.11 | 13.34 | | | |
| 2 | 15.16 | 21.59 | | | |
| 2 | 7.49 | 14.1 | | | |
| 2 | 5.10 | 22.8 | | | |
| 3 | 6.19 | 8.17 | 12.77 | | |
| 2 | 9.20 | 16.17 | | | |
| 2 | 11.18 | 20.17 | | | |
| 2 | 10.16 | 19.44 | | | |
| 4 | 3.27 | 17.71 | 18.69 | 23.4 | |
| 2 | 0.18 | 1.36 | | | |
| 2 | 2.0 | 4.52 | | | |
| 3 | 7.56 | 11.39 | 13.42 | | |
| 3 | 14.9 | 15.43 | 21.14 | | |
| 2 | 8.50 | 22.31 | | | |
| 2 | 9.80 | 17.38 | | | |
| 3 | 5.64 | 6.22 | 12.34 | | |
| 2 | 16.59 | 19.80 | | | |
| 2 | 10.31 | 18.43 | | | |
| 4 | 1.22 | 1.71 | 20.77 | 23.48 | |
| 2 | 0.54 | 2.21 | | | |
| 2 | 4.41 | 5.65 | | | |
| 3 | 11.58 | 13.78 | 14.56 | | |
| 2 | 15.47 | 21.21 | | | |
| 2 | 12.13 | 23.41 | | | |
| 3 | 6.8 | 9.19 | 10.70 | | |
| 3 | 7.74 | 8.22 | 16.63 | | |
| 2 | 20.17 | 22.14 | | | |
| 4 | 1.59 | 17.58 | 18.29 | 19.59 | |
| 2 | 0.32 | 3.29 | | | |
| 2 | 2.72 | 4.71 | | | |
| 3 | 5.79 | 6.24 | 13.21 | | |
| 2 | 11.46 | 15.46 | | | |
| 3 | 9.19 | 12.75 | 22.51 | | |
| 2 | 14.34 | 16.53 | | | |
| 2 | 18.34 | 23.28 | | | |

TABLE 6-continued

| | n | | | | |
|---|---|---|---|---|---|
| d | 1 | 2 | 3 | 4 | 5 |
| 3 | 7.24 | 8.64 | 10.79 | | |
| 3 | 19.73 | 20.25 | 21.49 | | |
| 3 | 1.64 | 1.72 | 17.48 | | |

In Table 6, an $m^{th}$ element from top to bottom in a column in which d is located indicates a row weight of row m in a fourth matrix, an $n^{th}$ element (a, b) from left to right in row m in the fourth matrix indicates that a cyclic shift coefficient of a cyclic shift matrix in row m and column (a+n) in the fourth matrix is b, all remaining locations in the fourth matrix are all-zero matrices, $n^{\in}\{1, 2, 3, 4, 5\}$, and m, a, and b are all positive integers.

Optionally, in an embodiment, $H_{MC}(2/3)$ is extended to the right by 100 columns, and extended downward by 100 rows, and an obtained mother matrix is shown in a formula (4):

$$H(2/3) = \begin{bmatrix} H_{MC}(2/3) & 0_{8 \times 100} \\ H_{IR}(2/3) & I_{100 \times 100} \end{bmatrix} \quad (4)$$

$H_{MC}(2/3)$ with a size of 100 rows and 24 columns may be the third matrix indicated by Table 5, or the fourth matrix indicated by Table 6.

Optionally, in an embodiment, a mother matrix obtained by extending a basic matrix $H_{MC}(3/4)$ is shown in a formula (5):

$$H(3/4) = \begin{bmatrix} H_{MC}(3/4) & 0_{6 \times r} \\ H_{IR}(3/4) & I_{r \times r} \end{bmatrix} \quad (5)$$

In the formula (5), H(3/4) indicates the mother matrix, $H_{MC}(3/4)$ indicates the basic matrix, $H_{IR}(3/4)$ indicates the extension matrix, a size of $H_{IR}(3/4)$ is r rows and 24 columns, 3/4 indicates the code rate, $0_{12 \times r}$ indicates the first fixed matrix, $I_{r \times r}$ indicates the second fixed matrix, $0_{6 \times r}$ indicates an all-zero matrix with a size of 12 rows and r columns, $I_{r \times r}$ indicates an identity matrix with a size of r rows and r columns, r≥1, and r is an integer. For $H_{MC}(3/4)$, refer to the foregoing description.

Table 7 indicates a matrix with a size of 100 rows and 24 columns, and the matrix is referred to as a fifth matrix in the following, r rows and 24 columns are read from the fifth matrix, to obtain $H_{IR}(3/4)$. The r rows are any r rows in the 100 rows.

Optionally, the r rows are the first 50 rows in the 100 rows in the fifth matrix.

Table 7 is shown as follows:

TABLE 7

| | j | | | | | | | | |
|---|---|---|---|---|---|---|---|---|---|
| d | 1 | 2 | 3 | 4 | 5 | 6 | 7 | 8 | 9 |
| 9 | 0.22 | 1.20 | 2.7 | 3.29 | 4.15 | 5.60 | 9.39 | 17.34 | 19.80 |
| 7 | 0.8 | 2.2 | 3.69 | 5.75 | 9.7 | 17.56 | 19.77 | | |
| 7 | 1.58 | 2.72 | 3.38 | 4.18 | 5.49 | 11.79 | 19.22 | | |
| 8 | 1.30 | 2.75 | 3.21 | 4.80 | 5.32 | 9.47 | 10.50 | 17.63 | |
| 8 | 0.21 | 2.67 | 3.2 | 4.44 | 5.36 | 10.26 | 14.67 | 19.55 | |
| 7 | 1.73 | 2.63 | 3.35 | 5.44 | 7.14 | 17.78 | 19.9 | | |
| 7 | 0.9 | 1.67 | 2.8 | 3.18 | 5.56 | 8.5 | 9.53 | | |

TABLE 7-continued

| | i | | | | | | | | |
|---|---|---|---|---|---|---|---|---|---|
| d | 1 | 2 | 3 | 4 | 5 | 6 | 7 | 8 | 9 |
| 6 | 3.50 | 4.45 | 5.25 | 6.76 | 17.50 | 19.45 | | | |
| 6 | 0.28 | 1.62 | 2.34 | 3.8 | 5.4 | 12.40 | | | |
| 5 | 0.32 | 2.50 | 5.20 | 17.80 | 23.13 | | | | |
| 6 | 0.38 | 2.71 | 3.57 | 5.47 | 13.0 | 17.38 | | | |
| 5 | 0.67 | 2.49 | 3.55 | 5.7 | 21.45 | | | | |
| 5 | 2.33 | 3.76 | 5.47 | 17.79 | 18.27 | | | | |
| 6 | 0.26 | 2.39 | 3.58 | 4.17 | 5.68 | 22.19 | | | |
| 6 | 0.69 | 2.3 | 3.31 | 13.6 | 17.43 | 19.76 | | | |
| 5 | 0.42 | 2.40 | 5.1 | 15.24 | 17.10 | | | | |
| 6 | 0.74 | 3.26 | 5.34 | 16.66 | 17.63 | 19.37 | | | |
| 6 | 0.67 | 2.46 | 3.47 | 5.59 | 14.53 | 17.3 | | | |
| 5 | 0.54 | 5.35 | 15.47 | 17.67 | 21.69 | | | | |
| 5 | 0.17 | 2.26 | 5.24 | 8.56 | 17.36 | | | | |
| 5 | 0.32 | 2.78 | 3.77 | 5.7 | 20.43 | | | | |
| 5 | 0.3 | 2.36 | 3.14 | 17.9 | 22.76 | | | | |
| 5 | 2.59 | 3.0 | 5.39 | 8.45 | 18.4 | | | | |
| 4 | 0.4 | 3.31 | 5.31 | 7.54 | | | | | |
| 4 | 2.34 | 3.39 | 6.33 | 17.32 | | | | | |
| 5 | 0.48 | 3.6 | 5.47 | 16.69 | 17.22 | | | | |
| 5 | 2.77 | 5.46 | 11.10 | 17.66 | 21.64 | | | | |
| 5 | 0.62 | 3.42 | 5.23 | 12.43 | 17.65 | | | | |
| 5 | 0.29 | 2.43 | 3.16 | 15.6 | 18.48 | | | | |
| 4 | 0.23 | 2.70 | 17.44 | 23.3 | | | | | |
| 4 | 2.16 | 5.34 | 10.11 | 17.59 | | | | | |
| 5 | 0.19 | 2.10 | 5.8 | 6.49 | 7.1 | | | | |
| 4 | 0.17 | 3.77 | 11.17 | 17.20 | | | | | |
| 4 | 2.17 | 5.18 | 6.16 | 7.44 | | | | | |
| 4 | 3.4 | 5.71 | 17.69 | 20.27 | | | | | |
| 4 | 0.0 | 2.52 | 3.36 | 14.18 | | | | | |
| 4 | 2.39 | 3.43 | 10.42 | 18.56 | | | | | |
| 3 | 0.9 | 3.14 | 12.31 | | | | | | |
| 4 | 3.50 | 5.38 | 11.80 | 16.22 | | | | | |
| 4 | 0.80 | 3.64 | 5.59 | 13.34 | | | | | |
| 3 | 6.31 | 14.43 | 17.77 | | | | | | |
| 3 | 6.22 | 16.48 | 17.71 | | | | | | |
| 4 | 0.21 | 3.41 | 5.65 | 9.54 | | | | | |
| 3 | 0.58 | 12.56 | 18.78 | | | | | | |
| 3 | 5.47 | 11.21 | 12.13 | | | | | | |
| 3 | 2.41 | 5.8 | 10.70 | | | | | | |
| 3 | 3.19 | 8.22 | 11.63 | | | | | | |
| 3 | 3.14 | 17.17 | 22.74 | | | | | | |
| 3 | 0.58 | 13.29 | 16.59 | | | | | | |
| 3 | 2.32 | 15.29 | 17.59 | | | | | | |
| 4 | 2.71 | 6.72 | 8.21 | 12.24 | | | | | |
| 3 | 0.46 | 2.46 | 10.79 | | | | | | |
| 3 | 6.19 | 17.75 | 20.51 | | | | | | |
| 3 | 0.53 | 7.28 | 16.34 | | | | | | |
| 3 | 0.24 | 2.34 | 4.64 | | | | | | |
| 3 | 11.79 | 12.49 | 17.73 | | | | | | |
| 3 | 0.48 | 10.72 | 16.25 | | | | | | |
| 3 | 11.1 | 18.64 | 21.18 | | | | | | |
| 3 | 11.41 | 16.41 | 17.32 | | | | | | |
| 2 | 17.45 | 22.74 | | | | | | | |
| 3 | 4.9 | 10.50 | 17.25 | | | | | | |
| 3 | 10.11 | 15.72 | 16.18 | | | | | | |
| 3 | 8.40 | 16.75 | 17.43 | | | | | | |
| 3 | 10.29 | 12.34 | 17.57 | | | | | | |
| 3 | 11.76 | 12.71 | 17.67 | | | | | | |
| 3 | 4.74 | 6.54 | 18.23 | | | | | | |
| 2 | 17.66 | 20.5 | | | | | | | |
| 3 | 7.17 | 10.70 | 17.41 | | | | | | |
| 3 | 7.59 | 15.72 | 18.74 | | | | | | |
| 2 | 10.3 | 16.31 | | | | | | | |
| 3 | 4.25 | 6.54 | 11.68 | | | | | | |
| 3 | 11.65 | 13.18 | 16.15 | | | | | | |
| 3 | 10.11 | 12.21 | 16.29 | | | | | | |
| 3 | 4.33 | 10.29 | 16.30 | | | | | | |
| 3 | 8.80 | 13.50 | 16.79 | | | | | | |
| 2 | 11.51 | 12.41 | | | | | | | |
| 2 | 6.41 | 13.45 | | | | | | | |
| 3 | 4.18 | 10.77 | 12.51 | | | | | | |
| 3 | 12.67 | 16.6 | 18.3 | | | | | | |
| 3 | 4.58 | 7.56 | 10.34 | | | | | | |
| 3 | 11.30 | 13.64 | 20.14 | | | | | | |
| 3 | 4.58 | 6.11 | 12.69 | | | | | | |
| 3 | 10.48 | 11.74 | 12.59 | | | | | | |

TABLE 7-continued

|   | i | | | | | | | | |
|---|---|---|---|---|---|---|---|---|---|
| d | 1 | 2 | 3 | 4 | 5 | 6 | 7 | 8 | 9 |
| 2 | 4.38 | 8.52 | | | | | | | |
| 3 | 1.16 | 11.41 | 12.58 | | | | | | |
| 2 | 7.80 | 11.63 | | | | | | | |
| 3 | 12.25 | 16.2 | 18.8 | | | | | | |
| 3 | 4.35 | 6.4 | 13.64 | | | | | | |
| 3 | 8.26 | 11.61 | 12.68 | | | | | | |
| 3 | 6.39 | 8.50 | 12.66 | | | | | | |
| 3 | 4.31 | 6.11 | 12.26 | | | | | | |
| 3 | 6.80 | 12.73 | 14.18 | | | | | | |
| 2 | 6.28 | 14.44 | | | | | | | |
| 3 | 6.68 | 9.54 | 10.0 | | | | | | |
| 2 | 10.55 | 15.53 | | | | | | | |
| 3 | 6.42 | 11.72 | 15.3 | | | | | | |
| 2 | 6.73 | 18.65 | | | | | | | |
| 3 | 8.11 | 11.54 | 16.69 | | | | | | |
| 2 | 9.70 | 16.15 | | | | | | | |
| 3 | 10.61 | 11.44 | 13.48 | | | | | | |

In Table 7, an $m^{th}$ element from top to bottom in a column in which d is located indicates a row weight of row m in the fifth matrix, an $n^{th}$ element (a, b) from left to right in row m in the fifth matrix indicates that a cyclic shift coefficient of a cyclic shift matrix in row m and column (a+n) in the fifth matrix is b, all remaining locations in the fifth matrix are all-zero matrices, $n \in \{1, 2, 3, 4, 5, 6, 7, 8, 9\}$, and m, a, and b are all positive integers.

TABLE 8

|   | i | | | | |
|---|---|---|---|---|---|
| d | 1 | 2 | 3 | 4 | 5 |
| 5 | 0.34 | 1.39 | 2.22 | 3.80 | 4.29 |
| 5 | 5.7 | 9.15 | 10.60 | 13.20 | 15.7 |
| 5 | 11.8 | 12.77 | 16.2 | 17.69 | 18.56 |
| 4 | 6.49 | 7.79 | 8.75 | 14.72 | |
| 4 | 19.58 | 20.38 | 21.22 | 23.18 | |
| 5 | 0.21 | 1.47 | 4.50 | 4.80 | 22.75 |
| 5 | 1.63 | 5.32 | 9.21 | 13.55 | 15.30 |
| 4 | 10.26 | 11.67 | 17.36 | 22.44 | |
| 4 | 12.2 | 14.14 | 16.67 | 18.9 | |
| 3 | 6.35 | 7.73 | 8.78 | | |
| 5 | 0.53 | 19.8 | 20.44 | 21.18 | 23.63 |
| 4 | 1.56 | 2.5 | 3.67 | 4.9 | |
| 4 | 5.50 | 9.45 | 13.45 | 15.25 | |
| 3 | 10.76 | 11.4 | 22.50 | | |
| 4 | 12.34 | 16.28 | 17.62 | 18.8 | |
| 4 | 6.13 | 7.50 | 8.32 | 14.40 | |
| 5 | 1.47 | 19.80 | 20.38 | 21.0 | 23.20 |
| 4 | 0.71 | 2.55 | 3.57 | 4.38 | |
| 3 | 5.67 | 9.45 | 15.49 | | |
| 3 | 10.7 | 13.79 | 22.27 | | |
| 3 | 11.33 | 16.47 | 18.76 | | |
| 3 | 12.58 | 14.17 | 17.39 | | |
| 3 | 6.68 | 7.26 | 8.19 | | |
| 2 | 21.31 | 23.3 | | | |
| 4 | 4.69 | 4.76 | 19.6 | 20.43 | |
| 3 | 0.24 | 2.40 | 3.1 | | |
| 3 | 5.42 | 9.37 | 13.10 | | |
| 3 | 10.34 | 15.26 | 20.66 | | |
| 3 | 11.74 | 19.63 | 22.47 | | |
| 3 | 12.46 | 16.59 | 18.3 | | |
| 3 | 14.67 | 17.53 | 23.67 | | |
| 5 | 4.36 | 6.47 | 7.35 | 8.69 | 21.54 |
| 3 | 0.56 | 2.17 | 3.26 | | |
| 2 | 1.24 | 5.77 | | | |
| 3 | 9.32 | 13.43 | 15.7 | | |
| 3 | 10.76 | 19.3 | 20.78 | | |
| 3 | 11.14 | 12.9 | 22.36 | | |
| 3 | 16.45 | 17.39 | 18.0 | | |
| 3 | 6.4 | 7.4 | 8.59 | | |

TABLE 8-continued

|   | i | | | | |
|---|---|---|---|---|---|
| d | 1 | 2 | 3 | 4 | 5 |
| 4 | 4.34 | 14.31 | 21.31 | 23.54 | |
| 3 | 0.32 | 2.39 | 3.33 | | |
| 3 | 1.6 | 5.47 | 15.48 | | |
| 3 | 9.69 | 10.22 | 13.46 | | |
| 2 | 14.10 | 20.77 | | | |
| 2 | 6.64 | 19.66 | | | |
| 3 | 16.62 | 17.65 | 18.42 | | |
| 3 | 11.43 | 12.23 | 22.43 | | |
| 3 | 7.6 | 8.48 | 21.16 | | |
| 3 | 4.23 | 4.44 | 23.29 | | |
| 2 | 0.3 | 2.70 | | | |
| 3 | 1.11 | 5.59 | 13.34 | | |
| 3 | 9.1 | 10.49 | 15.16 | | |
| 3 | 12.10 | 17.8 | 22.19 | | |
| 3 | 14.17 | 16.77 | 23.17 | | |
| 3 | 11.17 | 19.20 | 20.18 | | |
| 2 | 7.16 | 18.44 | | | |
| 4 | 4.27 | 6.4 | 8.69 | 21.71 | |
| 2 | 0.18 | 3.36 | | | |
| 3 | 1.0 | 2.39 | 5.52 | | |
| 3 | 9.43 | 13.56 | 15.42 | | |
| 3 | 10.14 | 18.31 | 20.9 | | |
| 2 | 14.80 | 23.50 | | | |
| 2 | 8.22 | 22.38 | | | |
| 3 | 11.64 | 12.80 | 16.34 | | |
| 2 | 19.59 | 21.43 | | | |
| 4 | 4.71 | 6.77 | 7.31 | 17.48 | |
| 3 | 0.22 | 2.21 | 5.54 | | |
| 2 | 1.41 | 9.65 | | | |
| 3 | 3.78 | 10.58 | 15.56 | | |
| 2 | 13.21 | 17.47 | | | |
| 2 | 6.13 | 16.41 | | | |
| 3 | 8.8 | 11.70 | 12.19 | | |
| 2 | 7.63 | 23.22 | | | |
| 3 | 14.14 | 18.17 | 22.74 | | |
| 4 | 0.59 | 19.59 | 20.29 | 21.58 | |
| 2 | 2.32 | 4.29 | | | |
| 3 | 1.71 | 3.72 | 5.24 | | |
| 3 | 9.79 | 10.46 | 15.21 | | |
| 2 | 11.46 | 13.51 | | | |
| 3 | 6.53 | 12.19 | 17.75 | | |
| 2 | 8.34 | 14.28 | | | |
| 2 | 18.24 | 19.34 | | | |
| 3 | 7.64 | 20.79 | 23.73 | | |
| 4 | 0.72 | 16.49 | 21.25 | 22.48 | |
| 3 | 2.18 | 4.64 | 5.1 | | |
| 2 | 1.41 | 3.41 | | | |
| 3 | 9.74 | 13.45 | 15.32 | | |
| 2 | 10.25 | 17.9 | | | |

TABLE 8-continued

| | i | | | | |
|---|---|---|---|---|---|
| d | 1 | 2 | 3 | 4 | 5 |
| 3 | 11.72 | 12.18 | 23.50 | | |
| 2 | 16.11 | 20.75 | | | |
| 3 | 6.43 | 14.40 | 22.34 | | |
| 3 | 8.29 | 18.71 | 19.57 | | |
| 3 | 4.54 | 7.67 | 21.76 | | |
| 2 | 0.74 | 5.23 | | | |
| 2 | 1.5 | 2.66 | | | |
| 3 | 3.41 | 9.17 | 15.70 | | |
| 3 | 7.59 | 11.74 | 17.72 | | |
| 3 | 10.25 | 13.31 | 18.3 | | |
| 3 | 12.54 | 14.65 | 20.68 | | |
| 2 | 6.15 | 21.18 | | | |

In Table 8, an $m^{th}$ element from top to bottom in a column in which d is located indicates a row weight of row m in a sixth matrix, an $n^{th}$ element (a, b) from left to right in row m in the sixth matrix indicates that a cyclic shift coefficient of a cyclic shift matrix in row m and column (a+n) in the sixth matrix is b, all remaining locations in the sixth matrix are all-zero matrices, $n \in \{1, 2, 3, 4, 5\}$, and m, a, and b are all positive integers.

Optionally, in an embodiment, $H_{IR}(3/4)$ is extended to the right by 100 columns, and extended downward by 100 rows, and an obtained mother matrix is shown in a formula (6):

$$H(3/4) = \begin{bmatrix} H_{MC}(3/4) & 0_{6 \times 100} \\ H_{IR}(3/4) & I_{100 \times 100} \end{bmatrix} \quad (6)$$

H(3/4) indicates the mother matrix, $H_{MC}(3/4)$ indicates the basic matrix, $H_{IR}(3/4)$ indicates the extension matrix, 3/4 indicates the code rate, $0_{6 \times 100}$ and $I_{100 \times 100}$ are fixed matrices, $0_{6 \times 100}$ indicates an all-zero matrix with a size of 6 rows and 100 columns, $I_{100 \times 100}$ indicates an identity matrix with a size of 100 rows and 100 columns, and $H_{IR}(3/4)$ may be the fifth matrix shown in Table 7 or the sixth matrix shown in Table 8.

Optionally, in an embodiment, a mother matrix obtained by extending a basic matrix $H_{MC}(5/6)$ may be shown in a formula (7):

$$H(5/6) = \begin{bmatrix} H_{MC}(5/6) & 0_{4 \times r} \\ H_{IR}(5/6) & I_{r \times r} \end{bmatrix} \quad (7)$$

H(5/6) indicates the mother matrix, $H_{MC}(5/6)$ indicates the basic matrix, $H_{IR}(5/6)$ indicates the extension matrix, a size of $H_{IR}(5/6)$ is r rows and 24 columns, 5/6 indicates the code rate, $0_{12 \times r}$ indicates the first fixed matrix, Ix, indicates the second fixed matrix, $0_{4 \times r}$ indicates an all-zero matrix with a size of 12 rows and r columns, $I_{r \times r}$ indicates an identity matrix with a size of r rows and r columns, r≥1, and r is an integer. For $H_{MC}(5/6)$, refer to the foregoing description.

Table 9 indicates a matrix with a size of 100 rows and 24 columns, and the matrix is referred to as a seventh matrix. r rows are read from the 100 rows in the seventh matrix, to obtain $H_{IR}(5/6)$.

Table 9 is shown as follows:

TABLE 9

| | i | | | | | | | | | | |
|---|---|---|---|---|---|---|---|---|---|---|---|
| d | 1 | 2 | 3 | 4 | 5 | 6 | 7 | 8 | 9 | 10 | 11 |
| 11 | 0.60 | 1.15 | 3.34 | 4.80 | 5.20 | 6.29 | 7.39 | 9.22 | 11.77 | 12.7 | 18.7 |
| 10 | 0.72 | 2.79 | 3.69 | 4.49 | 5.75 | 6.8 | 9.2 | 11.56 | 12.22 | 14.58 | |
| 8 | 1.18 | 2.47 | 4.21 | 5.80 | 6.38 | 7.50 | 9.75 | 11.32 | | | |
| 9 | 0.21 | 1.26 | 2.30 | 3.36 | 4.44 | 5.67 | 6.63 | 7.2 | 11.55 | | |
| 9 | 0.18 | 2.63 | 3.78 | 4.44 | 6.67 | 8.14 | 9.35 | 11.73 | 14.9 | | |
| 9 | 1.56 | 2.5 | 3.9 | 5.45 | 6.67 | 7.50 | 9.25 | 17.8 | 19.53 | | |
| 8 | 0.45 | 1.28 | 3.50 | 4.62 | 6.34 | 7.8 | 9.4 | 20.76 | | | |
| 7 | 2.80 | 3.50 | 4.13 | 5.40 | 6.32 | 9.0 | 10.20 | | | | |
| 8 | 1.47 | 2.38 | 3.55 | 4.45 | 6.67 | 7.71 | 9.57 | 23.38 | | | |
| 7 | 1.47 | 2.79 | 3.7 | 4.76 | 6.27 | 9.33 | 21.49 | | | | |
| 7 | 1.58 | 2.19 | 3.26 | 4.31 | 5.39 | 9.68 | 15.17 | | | | |
| 6 | 2.6 | 3.76 | 5.24 | 6.69 | 7.3 | 16.43 | | | | | |
| 6 | 1.40 | 3.34 | 6.37 | 7.42 | 9.1 | 13.10 | | | | | |
| 6 | 1.59 | 2.47 | 3.66 | 6.63 | 9.74 | 17.26 | | | | | |
| 6 | 2.47 | 3.3 | 4.53 | 5.67 | 7.67 | 22.46 | | | | | |
| 6 | 3.69 | 4.56 | 5.35 | 6.36 | 9.54 | 18.17 | | | | | |
| 6 | 3.7 | 6.26 | 7.77 | 9.24 | 16.43 | 22.32 | | | | | |
| 5 | 1.36 | 2.9 | 3.76 | 6.3 | 8.78 | | | | | | |
| 5 | 1.14 | 2.45 | 6.0 | 7.59 | 19.39 | | | | | | |
| 5 | 1.4 | 3.4 | 6.54 | 8.31 | 13.31 | | | | | | |
| 5 | 1.48 | 2.39 | 3.33 | 6.32 | 10.34 | | | | | | |
| 5 | 1.46 | 4.47 | 6.6 | 13.69 | 20.22 | | | | | | |
| 5 | 1.66 | 3.64 | 6.10 | 9.77 | 23.42 | | | | | | |
| 5 | 1.23 | 2.62 | 6.65 | 15.43 | 16.43 | | | | | | |
| 5 | 1.6 | 2.48 | 3.16 | 6.29 | 12.23 | | | | | | |
| 5 | 2.3 | 3.11 | 6.44 | 8.34 | 16.70 | | | | | | |
| 4 | 1.59 | 2.49 | 3.16 | 14.1 | | | | | | | |
| 5 | 2.77 | 3.19 | 6.8 | 13.10 | 21.17 | | | | | | |
| 5 | 1.44 | 2.20 | 3.18 | 14.17 | 19.17 | | | | | | |
| 4 | 3.71 | 6.16 | 9.4 | 10.69 | | | | | | | |
| 4 | 2.27 | 3.18 | 12.36 | 14.0 | | | | | | | |
| 5 | 1.52 | 3.43 | 6.42 | 8.39 | 20.56 | | | | | | |
| 4 | 1.31 | 6.14 | 8.50 | 22.9 | | | | | | | |
| 4 | 3.22 | 6.38 | 9.64 | 18.80 | | | | | | | |

TABLE 9-continued

| | | | | | j | | | | | | |
|---|---|---|---|---|---|---|---|---|---|---|---|
| d | 1 | 2 | 3 | 4 | 5 | 6 | 7 | 8 | 9 | 10 | 11 |
| 4 | 1.43 | 2.80 | 3.59 | 17.34 | | | | | | | |
| 5 | 2.48 | 3.31 | 6.22 | 15.77 | 16.71 | | | | | | |
| 4 | 3.21 | 6.54 | 10.41 | 13.65 | | | | | | | |
| 4 | 3.58 | 6.78 | 14.47 | 18.56 | | | | | | | |
| 5 | 1.70 | 3.21 | 6.13 | 11.8 | 13.41 | | | | | | |
| 4 | 1.22 | 6.19 | 18.63 | 21.74 | | | | | | | |
| 4 | 1.59 | 2.58 | 6.17 | 12.14 | | | | | | | |
| 5 | 1.59 | 3.72 | 6.32 | 15.29 | 20.29 | | | | | | |
| 4 | 1.71 | 2.79 | 14.21 | 20.24 | | | | | | | |
| 4 | 2.46 | 3.46 | 16.19 | 17.51 | | | | | | | |
| 4 | 1.53 | 2.75 | 13.34 | 22.28 | | | | | | | |
| 4 | 0.79 | 1.24 | 2.34 | 8.64 | | | | | | | |
| 3 | 1.73 | 2.25 | 10.49 | | | | | | | | |
| 4 | 1.48 | 2.18 | 17.64 | 19.72 | | | | | | | |
| 3 | 0.41 | 2.41 | 10.1 | | | | | | | | |
| 3 | 1.32 | 12.74 | 15.45 | | | | | | | | |
| 3 | 2.9 | 12.50 | 19.25 | | | | | | | | |
| 4 | 1.72 | 2.18 | 12.75 | 21.11 | | | | | | | |
| 3 | 0.40 | 1.34 | 2.43 | | | | | | | | |
| 4 | 1.57 | 2.71 | 8.76 | 11.29 | | | | | | | |
| 3 | 0.74 | 10.67 | 15.54 | | | | | | | | |
| 3 | 7.5 | 8.23 | 14.66 | | | | | | | | |
| 3 | 10.70 | 12.41 | 13.17 | | | | | | | | |
| 3 | 10.59 | 12.72 | 14.74 | | | | | | | | |
| 3 | 0.3 | 8.25 | 14.31 | | | | | | | | |
| 3 | 8.54 | 14.65 | 22.68 | | | | | | | | |
| 3 | 0.15 | 12.18 | 13.29 | | | | | | | | |
| 3 | 0.11 | 8.21 | 19.33 | | | | | | | | |
| 3 | 0.30 | 13.29 | 19.80 | | | | | | | | |
| 3 | 0.50 | 8.41 | 16.79 | | | | | | | | |
| 3 | 12.51 | 14.41 | 22.45 | | | | | | | | |
| 2 | 8.18 | 17.77 | | | | | | | | | |
| 3 | 0.3 | 4.51 | 8.6 | | | | | | | | |
| 3 | 8.34 | 10.58 | 14.67 | | | | | | | | |
| 3 | 10.14 | 17.30 | 18.56 | | | | | | | | |
| 2 | 14.69 | 18.64 | | | | | | | | | |
| 3 | 9.58 | 12.59 | 15.11 | | | | | | | | |
| 3 | 0.74 | 12.48 | 14.38 | | | | | | | | |
| 3 | 0.41 | 10.52 | 15.16 | | | | | | | | |
| 3 | 12.58 | 16.63 | 20.80 | | | | | | | | |
| 3 | 0.8 | 12.2 | 18.25 | | | | | | | | |
| 2 | 0.64 | 20.35 | | | | | | | | | |
| 3 | 0.68 | 11.4 | 12.26 | | | | | | | | |
| 3 | 0.39 | 12.66 | 22.61 | | | | | | | | |
| 3 | 11.26 | 12.50 | 18.31 | | | | | | | | |
| 2 | 14.11 | 16.18 | | | | | | | | | |
| 3 | 9.73 | 10.80 | 19.44 | | | | | | | | |
| 2 | 11.54 | 13.28 | | | | | | | | | |
| 3 | 0.68 | 14.0 | 19.55 | | | | | | | | |
| 3 | 0.53 | 7.3 | 15.42 | | | | | | | | |
| 3 | 0.65 | 10.72 | 16.73 | | | | | | | | |
| 3 | 0.54 | 12.11 | 23.69 | | | | | | | | |
| 3 | 0.44 | 12.15 | 17.70 | | | | | | | | |
| 3 | 12.57 | 16.48 | 18.61 | | | | | | | | |
| 3 | 7.48 | 14.30 | 18.72 | | | | | | | | |
| 2 | 7.80 | 10.47 | | | | | | | | | |
| 3 | 0.4 | 12.23 | 19.72 | | | | | | | | |
| 3 | 9.59 | 13.4 | 17.69 | | | | | | | | |
| 2 | 9.66 | 18.22 | | | | | | | | | |
| 3 | 12.52 | 16.53 | 19.60 | | | | | | | | |
| 2 | 8.35 | 21.13 | | | | | | | | | |
| 3 | 7.65 | 9.44 | 16.68 | | | | | | | | |
| 3 | 12.16 | 13.9 | 17.9 | | | | | | | | |
| 3 | 7.10 | 12.3 | 14.7 | | | | | | | | |
| 2 | 17.50 | 22.5 | | | | | | | | | |
| 3 | 9.62 | 16.20 | 17.80 | | | | | | | | |

In Table 9, an $m^{th}$ element from top to bottom in a column in which d is located indicates a row weight of row m in the seventh matrix, an $n^{th}$ element (a, b) from left to right in row m in the seventh matrix indicates that a cyclic shift coefficient of a cyclic shift matrix in row m and column (a+n) in the seventh matrix is b, all remaining locations in the seventh matrix are all-zero matrices, n∈{1, 2, 3, 4, 5, 6, 7, 8, 9, 10, 11}, and m, n, a, and b are all positive integers.

Optionally, in another embodiment, Table 10 indicates a matrix with a size of 100 rows and 24 columns, and the matrix is referred to as an eighth matrix. r rows and 24 columns are read from the 100 rows in the eighth matrix, to obtain $H_{IR}(5/6)$. Optionally, the r rows are any r rows in the eighth matrix. Optionally, the r rows are row 1 to row r in the eighth matrix.

Table 10 is shown as follows:

TABLE 10

| | j | | | | | | | | | | |
|---|---|---|---|---|---|---|---|---|---|---|---|
| d | 1 | 2 | 3 | 4 | 5 | 6 | 7 | 8 | 9 | 10 | 11 |
| 11 | 0.60 | 1.15 | 3.34 | 4.80 | 5.20 | 6.29 | 7.39 | 9.22 | 11.77 | 12.7 | 18.7 |
| 10 | 0.72 | 2.79 | 3.69 | 4.49 | 5.75 | 6.8 | 9.2 | 11.56 | 12.22 | 14.58 | |
| 8 | 1.18 | 2.47 | 4.21 | 5.80 | 6.38 | 7.50 | 9.75 | 11.32 | | | |
| 9 | 0.21 | 1.26 | 2.30 | 3.36 | 4.44 | 5.67 | 6.63 | 7.2 | 11.55 | | |
| 9 | 0.18 | 2.63 | 3.78 | 4.44 | 6.67 | 8.14 | 9.35 | 11.73 | 14.9 | | |
| 9 | 1.56 | 2.5 | 3.9 | 5.45 | 6.67 | 7.50 | 9.25 | 17.8 | 19.53 | | |
| 8 | 0.45 | 1.28 | 3.50 | 4.62 | 6.34 | 7.8 | 9.4 | 20.76 | | | |
| 7 | 2.80 | 3.50 | 4.13 | 5.40 | 6.32 | 9.0 | 10.20 | | | | |
| 8 | 1.47 | 2.38 | 3.55 | 4.45 | 6.67 | 7.71 | 9.57 | 23.38 | | | |
| 7 | 1.47 | 2.79 | 3.7 | 4.76 | 6.27 | 9.33 | 21.49 | | | | |
| 7 | 1.58 | 2.19 | 3.26 | 4.31 | 5.39 | 9.68 | 15.17 | | | | |
| 6 | 2.6 | 3.76 | 5.24 | 6.69 | 7.3 | 16.43 | | | | | |
| 6 | 1.40 | 3.34 | 6.37 | 7.42 | 9.1 | 13.10 | | | | | |
| 6 | 1.59 | 2.47 | 3.66 | 6.63 | 9.74 | 17.26 | | | | | |
| 6 | 2.47 | 3.3 | 4.53 | 5.67 | 7.67 | 22.46 | | | | | |
| 6 | 3.69 | 4.56 | 5.35 | 6.36 | 9.54 | 18.17 | | | | | |
| 6 | 3.7 | 6.26 | 7.77 | 9.24 | 16.43 | 22.32 | | | | | |
| 5 | 1.36 | 2.9 | 3.76 | 6.3 | 8.78 | | | | | | |
| 5 | 1.14 | 2.45 | 6.0 | 7.59 | 19.39 | | | | | | |
| 5 | 1.4 | 3.4 | 6.54 | 8.31 | 13.31 | | | | | | |
| 5 | 1.48 | 2.39 | 3.33 | 6.32 | 10.34 | | | | | | |
| 5 | 1.46 | 4.47 | 6.6 | 13.69 | 20.22 | | | | | | |
| 5 | 1.66 | 3.64 | 6.10 | 9.77 | 23.42 | | | | | | |
| 5 | 1.23 | 2.62 | 6.65 | 15.43 | 16.43 | | | | | | |
| 5 | 1.6 | 2.48 | 3.16 | 6.29 | 12.23 | | | | | | |
| 5 | 2.3 | 3.11 | 6.44 | 8.34 | 16.70 | | | | | | |
| 4 | 1.59 | 2.49 | 3.16 | 14.1 | | | | | | | |
| 5 | 2.77 | 3.19 | 6.8 | 13.10 | 21.17 | | | | | | |
| 5 | 1.44 | 2.20 | 3.18 | 14.17 | 19.17 | | | | | | |
| 4 | 3.71 | 6.16 | 9.4 | 10.69 | | | | | | | |
| 4 | 2.27 | 3.18 | 12.36 | 14.0 | | | | | | | |
| 5 | 1.52 | 3.43 | 6.42 | 8.39 | 20.56 | | | | | | |
| 4 | 1.31 | 6.14 | 8.50 | 22.9 | | | | | | | |
| 4 | 3.22 | 6.38 | 9.64 | 18.80 | | | | | | | |
| 4 | 1.43 | 2.80 | 3.59 | 17.34 | | | | | | | |
| 5 | 2.48 | 3.31 | 6.22 | 15.77 | 16.71 | | | | | | |
| 4 | 3.21 | 6.54 | 10.41 | 13.65 | | | | | | | |
| 4 | 3.58 | 6.78 | 14.47 | 18.56 | | | | | | | |
| 5 | 1.70 | 3.21 | 6.13 | 11.8 | 13.41 | | | | | | |
| 4 | 1.22 | 6.19 | 18.63 | 21.74 | | | | | | | |
| 4 | 1.59 | 2.58 | 6.17 | 12.14 | | | | | | | |
| 5 | 1.59 | 3.72 | 6.32 | 15.29 | 20.29 | | | | | | |
| 4 | 1.71 | 2.79 | 14.21 | 20.24 | | | | | | | |
| 4 | 2.46 | 3.46 | 16.19 | 17.51 | | | | | | | |
| 4 | 1.53 | 2.75 | 13.34 | 22.28 | | | | | | | |
| 4 | 0.79 | 1.24 | 2.34 | 8.64 | | | | | | | |
| 3 | 1.73 | 2.25 | 10.49 | | | | | | | | |
| 4 | 1.48 | 2.18 | 17.64 | 19.72 | | | | | | | |
| 3 | 0.41 | 2.41 | 10.1 | | | | | | | | |
| 3 | 1.32 | 12.74 | 15.45 | | | | | | | | |
| 3 | 2.9 | 12.50 | 19.25 | | | | | | | | |
| 4 | 1.72 | 2.18 | 12.75 | 21.11 | | | | | | | |
| 3 | 0.40 | 1.34 | 2.43 | | | | | | | | |
| 4 | 1.57 | 2.71 | 8.76 | 11.29 | | | | | | | |
| 3 | 0.74 | 10.67 | 15.54 | | | | | | | | |
| 3 | 7.5 | 8.23 | 14.66 | | | | | | | | |
| 3 | 10.70 | 12.41 | 13.17 | | | | | | | | |
| 3 | 10.59 | 12.72 | 14.74 | | | | | | | | |
| 3 | 0.3 | 8.25 | 14.31 | | | | | | | | |
| 3 | 8.54 | 14.65 | 22.68 | | | | | | | | |
| 3 | 0.15 | 12.18 | 13.29 | | | | | | | | |
| 3 | 0.11 | 8.21 | 19.33 | | | | | | | | |
| 3 | 0.30 | 13.29 | 19.80 | | | | | | | | |
| 3 | 0.50 | 8.41 | 16.79 | | | | | | | | |
| 3 | 12.51 | 14.41 | 22.45 | | | | | | | | |

TABLE 10-continued

| d | 1 | 2 | 3 | 4 | 5 | 6 | 7 | 8 | 9 | 10 | 11 |
|---|---|---|---|---|---|---|---|---|---|----|----|
| 2 | 8.18 | 17.77 | | | | | | | | | |
| 3 | 0.3 | 4.51 | 8.6 | | | | | | | | |
| 3 | 8.34 | 10.58 | 14.67 | | | | | | | | |
| 3 | 10.14 | 17.30 | 18.56 | | | | | | | | |
| 2 | 14.69 | 18.64 | | | | | | | | | |
| 3 | 9.58 | 12.59 | 15.11 | | | | | | | | |
| 3 | 0.74 | 12.48 | 14.38 | | | | | | | | |
| 3 | 0.41 | 10.52 | 15.16 | | | | | | | | |
| 3 | 12.58 | 16.63 | 20.80 | | | | | | | | |
| 3 | 0.8 | 12.2 | 18.25 | | | | | | | | |
| 2 | 0.64 | 20.35 | | | | | | | | | |
| 3 | 0.68 | 11.4 | 12.26 | | | | | | | | |
| 3 | 0.39 | 12.66 | 22.61 | | | | | | | | |
| 3 | 11.26 | 12.50 | 18.31 | | | | | | | | |
| 2 | 14.11 | 16.18 | | | | | | | | | |
| 3 | 9.73 | 10.80 | 19.44 | | | | | | | | |
| 2 | 11.54 | 13.28 | | | | | | | | | |
| 3 | 0.68 | 14.0 | 19.55 | | | | | | | | |
| 3 | 0.53 | 7.3 | 15.42 | | | | | | | | |
| 3 | 0.65 | 10.72 | 16.73 | | | | | | | | |
| 3 | 0.54 | 12.11 | 23.69 | | | | | | | | |
| 3 | 0.44 | 12.15 | 17.70 | | | | | | | | |
| 3 | 12.57 | 16.48 | 18.61 | | | | | | | | |
| 3 | 7.48 | 14.30 | 18.72 | | | | | | | | |
| 2 | 7.80 | 10.47 | | | | | | | | | |
| 3 | 0.4 | 12.23 | 19.72 | | | | | | | | |
| 3 | 9.59 | 13.4 | 17.69 | | | | | | | | |
| 2 | 9.66 | 18.22 | | | | | | | | | |
| 3 | 12.52 | 16.53 | 19.60 | | | | | | | | |
| 2 | 8.35 | 21.13 | | | | | | | | | |
| 3 | 7.65 | 9.44 | 16.68 | | | | | | | | |
| 3 | 12.16 | 13.9 | 17.9 | | | | | | | | |
| 3 | 7.10 | 12.3 | 14.7 | | | | | | | | |
| 2 | 17.50 | 22.5 | | | | | | | | | |
| 3 | 9.62 | 16.20 | 17.80 | | | | | | | | |

In Table 10, an $m^{th}$ element from top to bottom in a column in which d is located indicates a row weight of row m in the eighth matrix, an $n^{th}$ element (a, b) from left to right in row m in the eighth matrix indicates that a cyclic shift coefficient of a cyclic shift matrix in row m and column (a+n) in the eighth matrix is b, all remaining locations in the eighth matrix are all-zero matrices, $n \in \{1, 2, 3, 4, 5, 6, 7, 8, 9, 10, 11\}$, and m, n, a, and b are all positive integers.

Optionally, in an embodiment, $H_{MC}(5/6)$ is extended to the right by 100 columns, and extended downward by 100 rows, and an obtained mother matrix is shown in a formula (8):

$$H(5/6) = \begin{bmatrix} H_{MC}(5/6) & 0_{4 \times r} \\ H_{IR}(5/6) & I_{r \times r} \end{bmatrix} \quad (8)$$

In the formula (8), H(5/6) indicates the mother matrix, $H_{MC}(5/6)$ indicates the basic matrix with a size of 12 rows and 24 columns, $H_{IR}(5/6)$ is the extension matrix, 5/6 indicates the code rate, $0_{4 \times 100}$ indicates the first fixed matrix, and $I_{100 \times 100}$ indicates the second fixed matrix. Specifically, $0_{12 \times 100}$ indicates an all-zero matrix with a size of 12 rows and 100 columns, and $I_{100 \times 100}$ indicates an identity matrix with a size of 100 rows and 100 columns. $H_{IR}(5/6)$ may be the seventh matrix indicated by Table 9 or the eighth matrix indicated by Table 10.

The foregoing describes the mother matrix provided in this application. In the IR-HARQ mechanism, mother matrices are obtained through extension based on different code rates, and incremental redundant bits are retransmitted, to decrease a channel coding rate, and improve a receiving success rate of a receive device. The following uses an example for description.

Figure 6:
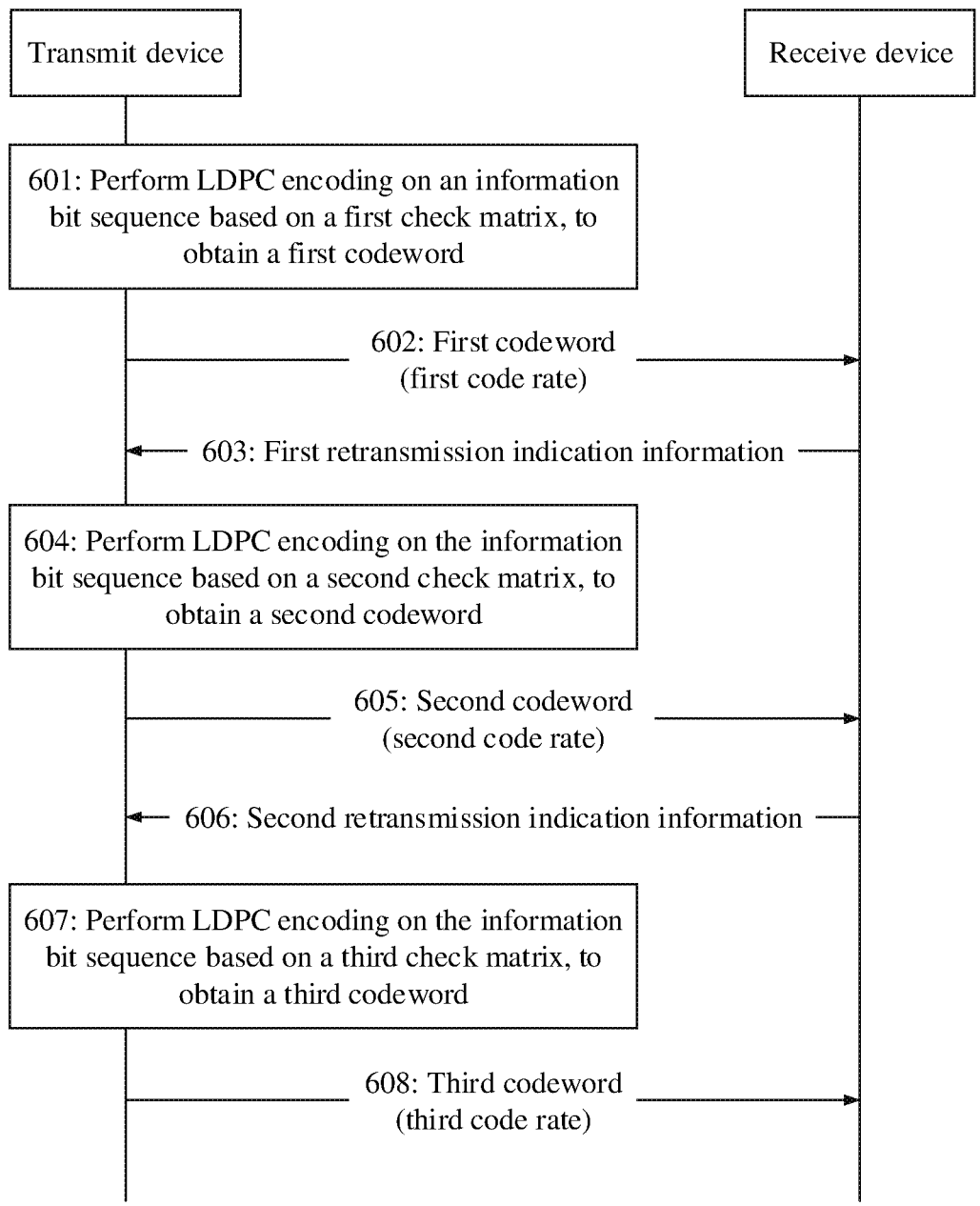
FIG. 6 shows an example of an LDPC code encoding method according to this application.

FIG. 6 shows an example of an LDPC code encoding method according to this application.

601: A transmit device performs LDPC encoding on an information bit sequence based on a first check matrix, to obtain a first codeword at a first code rate.

The first check matrix is obtained by reading i rows and j columns from a mother matrix, i=p+k, j=q+k, p and q are respectively a quantity of rows and a quantity of columns in a basic matrix, k≥0, and i, j, p, q, and k are all integers.

Optionally, the mother matrix may be any one of the following: H(1/2) obtained by extending H(1/2), H(2/3) obtained by extending $H_{MC}(2/3)$, H(3/4) obtained by extending $H_{MC}(3/4)$, or H(5/6) obtained by extending $H_{MC}(5/6)$. This is not limited.

Herein, H(5/6) shown in the formula (7) is used as the mother matrix, where $H_{IR}(5/6)$ is obtained by reading r rows and 24 columns from the eighth matrix indicated by Table 10. The r rows are row 1 to row r in the eighth matrix.

For example, the first check matrix is obtained from 4 rows and 24 columns, that is, p=4, q=24, k=0, and the first check matrix is $H_{MC}(5/6)$. It can be learned that when LDPC encoding is performed on the information bit sequence based on the first check matrix, the first code rate of the obtained first codeword is 5/6.

602: The transmit device sends the first codeword.

603: The transmit device receives first retransmission indication information from a receive device.

604: The transmit device performs LDPC encoding on the information bit sequence based on a second check matrix, to obtain a second codeword at a second code rate.

The second check matrix is obtained by reading w rows and z columns from the mother matrix, w=p+h, z=q+h, h>k, and w; z, and h are all positive integers.

In this application, the first check matrix and the second check matrix are read from the same mother matrix.

For example, w rows and z columns are read from H(5/6), where p=4, q=24, and h=50. In other words, 54 rows and 74 columns are read from the eighth matrix, to obtain the second check matrix. LDPC encoding is performed on the information bit sequence based on the second check matrix, to obtain the second codeword.

605: The transmit device sends the second codeword.

In a procedure shown in FIG. 6, the first codeword may be data in an initial transmission, and the second codeword is data in an initial retransmission. It may be understood that, if the receive device still incorrectly performs decoding based on the initially received data and the retransmitted data, the receive device may request the transmit device to perform a second retransmission. Further, the method 600 may further include step 606 to step 608.

606: The transmit device receives second retransmission indication information from the receive device.

607: The transmit device performs LDPC encoding on the information bit sequence based on a third check matrix, to obtain a third codeword at a third code rate.

The third check matrix is read from the mother matrix. A size of the third check matrix may be (p+y) rows and (q+y) columns, where y>h, and y is an integer. In addition, the (p+y) rows are row 1 to row (p+y) in the eighth matrix.

For example, p=4, q=24, and y=100. In other words, 104 rows and 124 columns are read from the eighth matrix, to obtain the third check matrix. LDPC encoding is performed on the information bit sequence based on the third check matrix, to obtain the third codeword. The code rate of the third codeword is 20/124.

It should be understood that the third check matrix, the second check matrix, and the first check matrix are read from the same mother matrix.

It can be learned that, as a quantity of retransmissions increases, a quantity of check bits continuously increases, and a channel coding rate is continuously decreased. This can increase a decoding success rate of the receive device.

608: The transmit device sends the third codeword.

The following describes the procedure shown in FIG. 6 by using an example.

For example, in step 601, the transmit device reads the first check matrix from the mother matrix, and performs LDPC encoding on the information bit sequence with a length of K, to obtain $M_1$ check bits. A length of the first codeword sent by the transmit device is N, where $N=K+M_1$. In other words, the first codeword includes K information bits and the $M_1$ check bits.

If the receive device incorrectly decodes a receive codeword corresponding to the first codeword, the receive device requests the transmit device to perform retransmission. In step 604, the transmit device reads the second check matrix from the mother matrix, and performs LDPC encoding on the K information bits based on the second check matrix, to obtain the $M_1$ check bits. Further, the transmit device encodes the $(K+M_1)$ bits based on an extended row and column in the second check matrix compared with the first check matrix, to obtain $M_2$ check bits. The transmit device retransmits the $M_2$ check bits. In other words, the $M_2$ check bits are the second codeword.

Optionally, in another implementation, the transmit device stores the $M_1$ check bits after sending the first codeword. If the first codeword is incorrectly decoded, the transmit device performs retransmission. Specifically, the transmit device performs LDPC encoding on the $(K+M_1)$ bits based on the second check matrix, to obtain the $M_2$ check bits. The transmit device sends the $M_2$ check bits.

In this embodiment of this application, after one transmission fails, the transmit device reads, from the mother matrix, a check matrix corresponding to a lower code rate, and encodes the information bit sequence by using the check matrix corresponding to the lower code rate, to increase redundant bits, and decrease a code rate of an encoded codeword. This increases a decoding success rate of the receive device.

A similar process is performed. As a quantity of retransmissions increases, the channel coding rate is continuously decreased until the receive device successfully decodes data or a specified maximum quantity of retransmissions is reached.

It may be understood that a process in which the transmit device reads, from the mother matrix, the check matrix corresponding to the lower code rate is actually a process of continuously extending the basic matrix to obtain a matrix that includes the basic matrix and that has more columns obtained by extending the basic matrix to the right and more rows obtained by extending the basic matrix downward.

For example, the mother matrices shown in the formula (1) to the formula (8) are used as an example. When the transmit device reads only the basic matrix as the check matrix, a code rate of a codeword obtained by the transmit device by performing LDPC encoding on the information bit sequence is the largest. For example, the code rate corresponding to the basic matrix in the formula (1) or the formula (2) is 1/2, the code rate corresponding to the basic matrix in the formula (3) or the formula (4) is 2/3, the code rate corresponding to the basic matrix in the formula (5) or the formula (6) is 3/4, and the code rate corresponding to the basic matrix in the formula (7) or the formula (8) is 5/6. When the transmit device reads the entire mother matrix as the check matrix, a code rate of a codeword obtained by the transmit device by performing LDPC encoding on the information bit sequence is the smallest. For example, the code rate corresponding to the mother matrix in the formula (2) is 12/124=0.097, the code rate corresponding to the mother matrix in the formula (4) is 16/124=0.129, the code rate corresponding to the mother matrix in the formula (6) is 18/124=0.145, and the code rate corresponding to the mother matrix in the formula (8) is 20/124=0.161.

It should be understood that the mother matrix provided in this application is also applicable to decoding performed by the receive device.

For each transmission (initial transmission or retransmission), the receive device performs decoding by using a same check matrix as that used by the transmit end. The following provides description with reference to FIG. 7.

Figure 7:
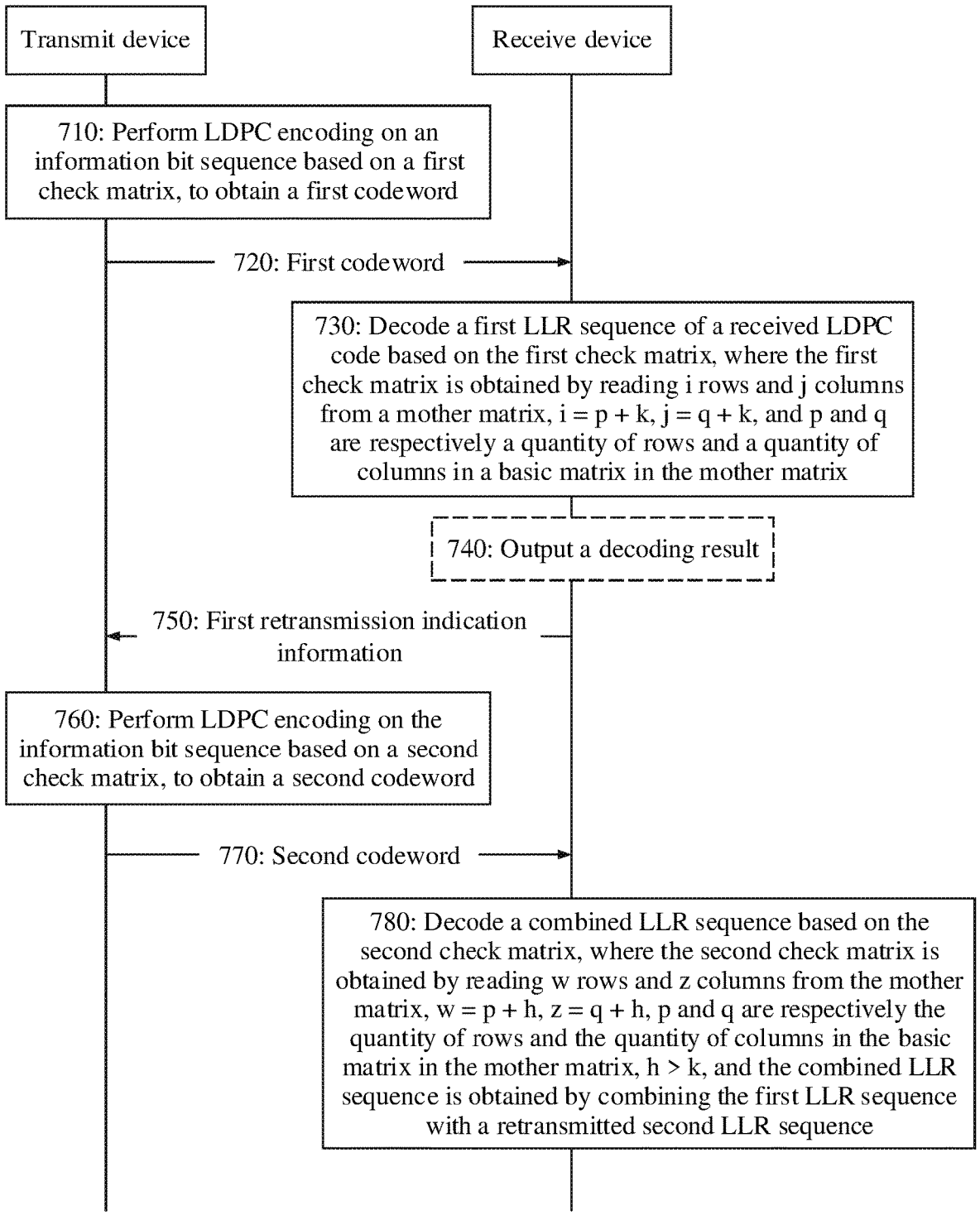
FIG. 7 is a flowchart of LDPC code encoding and decoding according to this application.

FIG. 7 is a flowchart of LDPC code encoding and decoding according to this application.

Optionally, an operation or processing performed by a receive device in a method 700 may be performed by the receive device or by a chip or a circuit system disposed in the receive device. The circuit system may be, for example, an integrated circuit or a logic circuit. For example, the chip may be a system on a chip (SoC) chip, a baseband modem chip, or the like. This is not limited in this specification. The following uses the receive device as an example for description.

The receive device may be a terminal device or a network device. It should be understood that the receive device in this embodiment of this application is also a decoding device. For example, in uplink transmission, a transmit device is a terminal device, and the receive device is a network device. In downlink transmission, a transmit device is a network device, and the receive device is a terminal device.

710: The transmit device performs LDPC encoding on an information bit sequence based on a first check matrix, to obtain a first codeword.

720: The transmit device sends the first codeword.

The receive device receives a first channel receive sequence from the transmit device.

For step 710 and step 720, refer to step 601 and step 602 in FIG. 6. Details are not described again.

730: The receive device determines a first log likelihood ratio (LLR) sequence corresponding to the first channel receive sequence, and decodes the first LLR sequence based on the first check matrix.

The first check matrix is obtained by reading i rows and j columns from a mother matrix. The mother matrix includes a basic matrix, an extension matrix, a first fixed matrix, and a second fixed matrix. The basic matrix is located at the top-left corner of the mother matrix, the extension matrix is located at the bottom-left corner of the mother matrix, the first fixed matrix is located at the top-right corner of the mother matrix, and the second fixed matrix is located at the bottom-right corner of the mother matrix. A quantity of columns in the basic matrix is equal to a quantity of columns in the extension matrix, and a quantity of columns in the first fixed matrix is equal to a quantity of columns in the second fixed matrix. A quantity of rows in the basic matrix is equal to a quantity of row in the first fixed matrix, a quantity of rows in the extension matrix is equal to a quantity of rows in the second fixed matrix, $i=p+k$, $j=q+k$, p and q are respectively the quantity of rows and the quantity of columns in the basic matrix, $k \geq 0$, and i, j, p, q, and k are all integers.

740: If decoding succeeds, the receive device outputs a decoding result.

Optionally, if the receive device incorrectly performs decoding, the receive device sends retransmission indication information to the transmit device, to request the transmit device to perform retransmission, as shown in step 750 to step 770 in the following.

In addition, if decoding fails, the receive device stores the first LLR sequence, to combine the first LLR sequence with a retransmitted LLR sequence that is subsequently received, and perform decoding.

750: The receive device sends the retransmission indication information to the transmit device. The transmit device receives the retransmission indication information from the receive device.

760: The transmit device performs LDP encoding on the information bit sequence based on a second check matrix, to obtain a second codeword.

770: The transmit device sends the second codeword.

Correspondingly, the receive device receives a second channel receive sequence.

For step 760 and step 770, refer to step 604 and step 605 in FIG. 6. Details are not described again.

780: The receive device determines a second LLR sequence corresponding to the second channel receive sequence, and decodes a combined LLR sequence based on the second check matrix.

The combined LLR sequence is obtained by combining the first LLR sequence with the retransmitted second LLR sequence. Specifically, the first LLR sequence and the second LLR sequence are combined by bit location. In the second LLR sequence and the first LLR sequence, LLR values at a same index location are combined, and LLR values at different index locations remain unchanged.

For example, a length of the first LLR sequence is 6, index locations are 1, 2, 3, 4, and 5, and LLR values corresponding to the index locations are respectively $LLR_{11}$, $LLR_{12}$, $LLR_{13}$, $LLR_{14}$, and $LLR_{15}$. A length of the second LLR sequence is 6, index locations are 3, 4, 5, 6, and 7, and LLR values corresponding to the index locations are respectively $LLR_{23}$, $LLR_{24}$, $LLR_{25}$, $LLR_{26}$, and $LLR_{27}$. Therefore, the combined LLR sequence is $\{LLR_{11}, LLR_{12}, LLR_{13}+LLR_{23}, LLR_{14}+LLR_{24}, LLR_{15}+LLR_{25}, LLR_{26}, LLR_{27}\}$, where addition of LLR values is binary addition.

The second check matrix is obtained by reading w rows and z columns from the mother matrix, $w=p+h$, $z=q+h$, $h>k$, and w; z, and h are all positive integers.

Further, if the receive device successfully decodes the combined LLR sequence based on the second check matrix, the receive device outputs the decoding result. If the receive device unsuccessfully decodes the combined LLR sequence based on the second check matrix, a next retransmission is performed.

A similar process is performed until decoding succeeds, or when a specified maximum quantity of retransmissions is reached, decoding fails.

It can be learned that, after one transmission fails, the transmit device reads, from the mother matrix, a check matrix corresponding to a lower code rate, and encodes the information bit sequence by using the check matrix corresponding to the lower code rate, to increase redundant bits, and decrease a code rate of an encoded codeword. Correspondingly, for an initial transmission of data, the receive end reads, from the mother matrix, a check matrix that is the same as that used by the transmit device, and decodes a received LLR sequence. If the initial transmission fails, the receive device reads, from the mother matrix, a check matrix corresponding to a code rate used by the transmit device for retransmission, and decodes a combined LLR sequence. Because during a retransmission, incremental redundant check bits increase based on the information bit sequence, and a channel coding rate is decreased, a decoding success rate of the receive device can be increased, a quantity of retransmissions can be reduced, a retransmission delay can be reduced, and decoding performance can be improved.

The foregoing describes in detail the LDPC encoding method provided in this application. The encoding method provided in this application can support compatibility with a plurality of code rates. In an IR-HARQ mechanism, a check matrix corresponding to a required code rate may be read from a mother matrix, to perform LDPC encoding. As a quantity of retransmissions increases, more incremental redundant bits may be obtained, to continuously decrease a code rate. This increases a decoding success rate of the receive device, and improves decoding performance.

Figure 8:
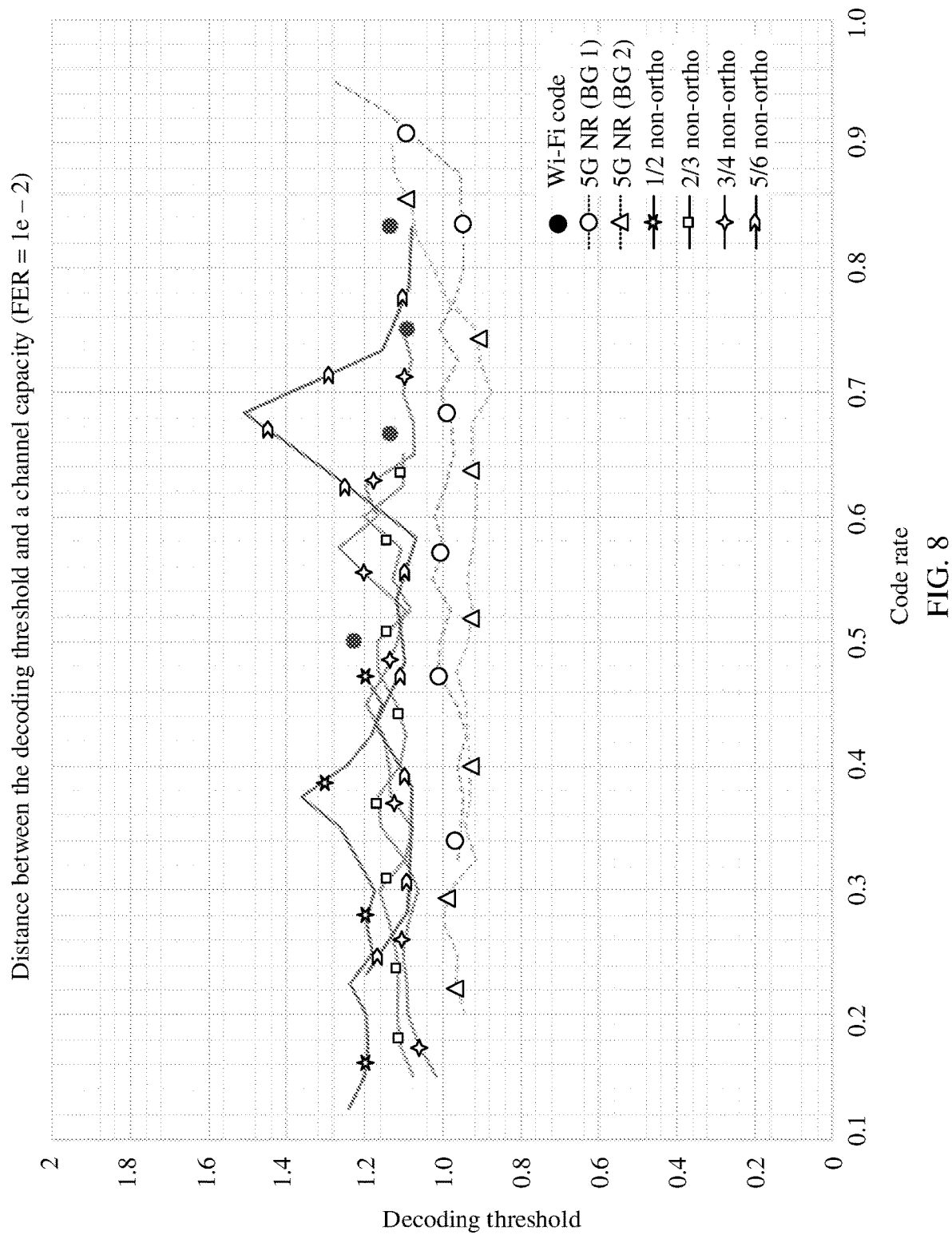
FIG. 8 shows performance curves at compatible code rates according to an embodiment of this application.

FIG. 8 shows performance curves at compatible code rates according to an embodiment of this application. As shown in FIG. 8, a horizontal coordinate indicates a corresponding code rate, and a vertical coordinate indicates a distance between a signal-to-noise ratio (SNR) required when a frame error rate (frame error rate, FER) is equal to $10^{-2}$ and a channel capacity of the corresponding code rate, namely, a distance between a decoding threshold and the channel capacity. In the embodiment in FIG. 8, a basic matrix $H_{MC}(1/2)$ corresponding to a code rate 1/2 is shown in Table 1, a basic matrix $H_{MC}(2/3)$ corresponding to a code rate 2/3 is shown in Table 5, a basic matrix $H_{MC}(3/4)$ corresponding to a code rate 3/4 is shown in Table 7, and a basic matrix $H_{MC}(5/6)$ corresponding to a code rate 5/6 is shown in Table 9.

Figure 9:
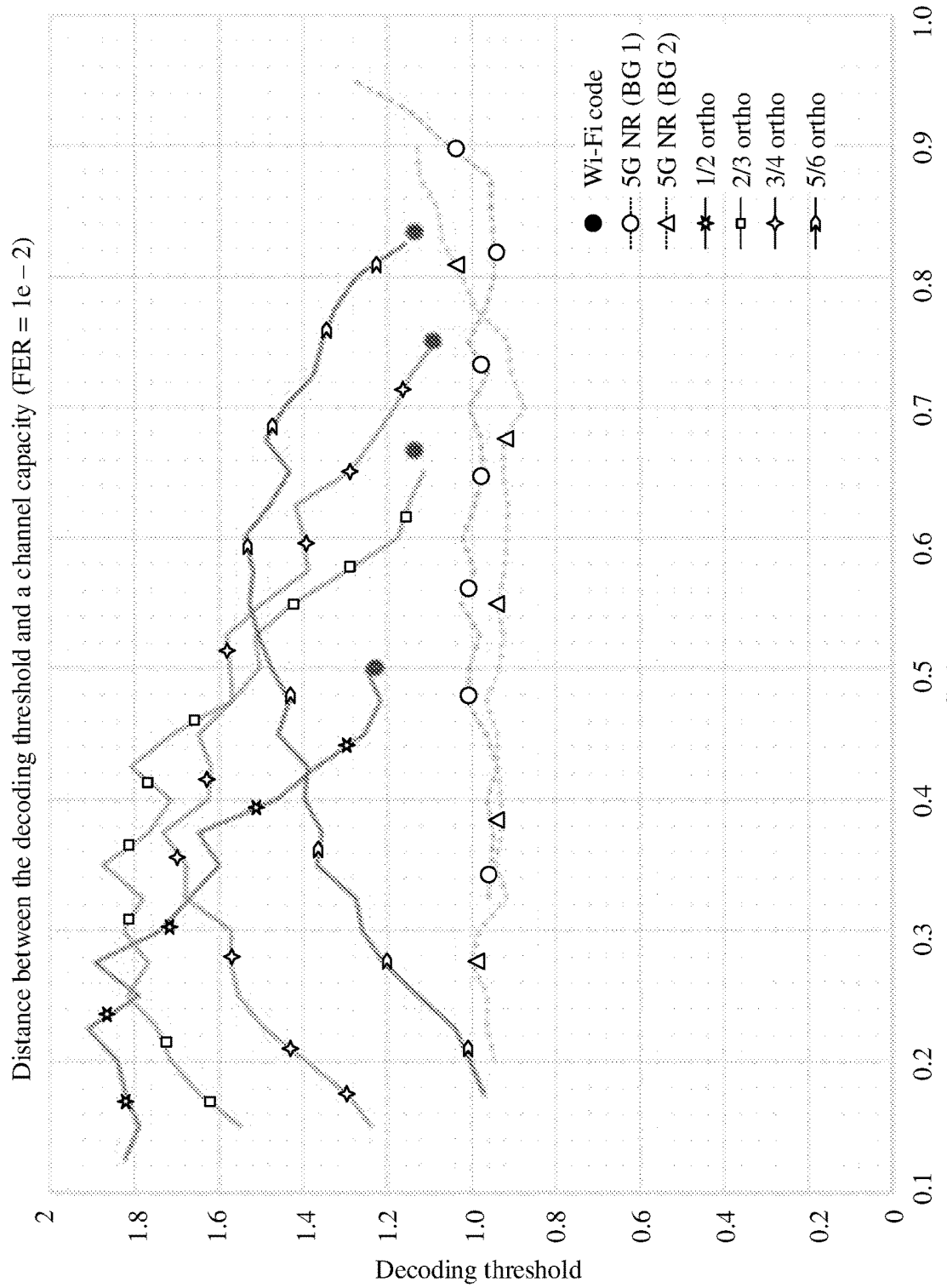
FIG. 9 shows performance curves at compatible code rates according to another embodiment of this application.

FIG. 9 shows performance curves at compatible code rates according to another embodiment of this application. As shown in FIG. 9, a horizontal coordinate indicates a corresponding code rate, and a vertical coordinate indicates a distance between an SNR required when an FER is equal to $10^{-2}$ and a channel capacity of the corresponding code rate. In the embodiment in FIG. 9, a basic matrix $H_{MC}(1/2)$ corresponding to a code rate 1/2 is shown in Table 4, a basic matrix $H_{MC}(2/3)$ corresponding to a code rate 2/3 is shown in Table 6, a basic matrix $H_{MC}(3/4)$ corresponding to a code rate 3/4 is shown in Table 8, and a basic matrix $H_{MC}(5/6)$ corresponding to a code rate 5/6 is shown in Table 10.

It can be learned from the performance curves shown in FIG. 8 and FIG. 9 that when LDPC encoding is performed by using the mother matrix provided in embodiments of this application, a rate compatibility solution of code rates is close to a throughput of 5G LDPC.

In FIG. 8 and FIG. 9, the throughput of the 5G LDPC is shown as a curve corresponding to 5G NR (BG 1) or 5G NR (BG 2) in FIG. 8 and FIG. 9. A BG 1 indicates that a cyclic shift matrix of a basic matrix of an LDPC code uses a BG 1 matrix, and a BG 2 indicates that a cyclic shift matrix of a basic matrix of an LDPC code uses a BG 2 matrix.

A channel in FIG. 8 or FIG. 9 may be a binary input additive white Gaussian noise (BAWAN) channel.

It should be understood that BG is an abbreviation of a base graph, and may be used to indicate a basic matrix of a cyclic shift matrix.

In addition, "ortho" is short for orthogonal, and "non-ortho" is short for non-orthogonal.

In addition, Wi-Fi codes show a performance curve of a Wi-Fi code that is obtained by using a coding scheme of the existing WLAN standard.

In addition, because a decoder in this application reuses an existing WLAN LDPC code as a kernel, implementation complexity can be effectively decreased.

The foregoing describes in detail the LDPC code encoding method provided in this application. The following describes a wireless communication apparatus provided in this application.

Figure 10:
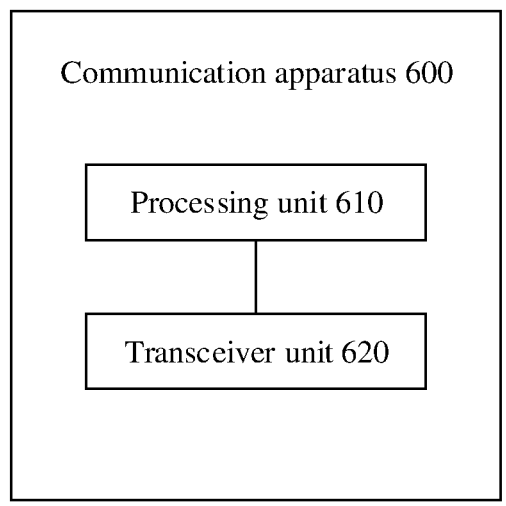
FIG. 10 is a schematic block diagram of a communication apparatus 600 according to this application.

FIG. 10 is a schematic block diagram of a communication apparatus 600 according to this application. As shown in FIG. 10, the communication apparatus 600 includes a processing unit 610 and a transceiver unit 620.

The processing unit 610 is configured to perform LDPC encoding on an information bit sequence based on a first check matrix, to obtain a first codeword at a first code rate, where the first check matrix is obtained by reading i rows and j columns from a mother matrix, the mother matrix includes a basic matrix, an extension matrix, a first fixed matrix, and a second fixed matrix, the basic matrix is located at the top-left corner of the mother matrix, the extension matrix is located at the bottom-left corner of the mother matrix, the first fixed matrix is located at the top-right corner of the mother matrix, the second fixed matrix is located at the bottom-right corner of the mother matrix, a quantity of rows in the basic matrix is equal to a quantity of rows in the first fixed matrix, a quantity of rows in the extension matrix is equal to a quantity of rows in the second fixed matrix, a quantity of columns in the extension matrix is equal to a quantity of columns in the basic matrix, a quantity of columns in the first fixed matrix is equal to a quantity of columns in the second fixed matrix, i=p+k, j=q+k, p and q are respectively the quantity of rows and the quantity of columns in the basic matrix, k≥0, and i, j, p, q, and k are all integers.

The transceiver unit 620 is configured to send the first codeword.

Optionally, in an embodiment, the transceiver unit 620 is further configured to receive retransmission indication information.

The processing unit 610 is further configured to perform LDPC encoding on the information bit sequence, to obtain a second codeword at a second code rate, where a second check matrix is obtained by reading w rows and z columns from the mother matrix, w=p+h, 7.=q+h, h>k, and w; z, and h are all positive integers.

The transceiver unit 620 is further configured to send the second codeword.

Optionally, the transceiver unit 620 may alternatively be replaced with a sending unit or a receiving unit. For example, when executing a sending action, the transceiver unit 620) may be replaced with the sending unit. When executing a receiving action, the transceiver unit 620 may be replaced with the receiving unit.

Optionally, the communication apparatus 600 may be a transmit device, or a component, a module, or the like that is inside a transmit device and that implements functions of the method embodiments.

In an implementation, the communication apparatus 600 is the transmit device in the foregoing method embodiments, and the communication apparatus 600 may have any function of the transmit device in the method embodiments. In this case, the processing unit 610 may be a processor. The transceiver unit 620 may be a transceiver. The transceiver may specifically include a receiver and a transmitter. The receiver is configured to execute a receiving function, and the transmitter is configured to execute a transmitting function.

Optionally, in another implementation, the communication apparatus 600 may be a circuit system in the transmit device. In this case, the processing unit 610 may be a chip, a logic circuit, an integrated circuit, a processing circuit, a system on a chip (SoC) chip, or the like. The transceiver unit 620 may be a communication interface, and the communication interface may be an interface circuit, an input/output interface, or the like.

In the foregoing embodiments, functions of the processing unit 610 may be implemented by hardware, or may be implemented by hardware executing corresponding software.

For example, the processing unit 610 may include one or more processors. The one or more processors are configured to read and execute a computer program or instructions stored in a memory, to enable the communication apparatus 600 to perform operations and/or processing performed by the transmit device in the method embodiments. The memory is located outside the one or more processors.

Further, the processing unit 610 may further include one or more memories. The one or more processors are connected to the one or more memories by using a circuit/electric line. The one or more processors can read a computer program or instructions stored in the one or more memories, to enable the communication apparatus 600 to perform operations and/or processing performed by the transmit device in the method embodiments of this application.

For another example, the processing unit 610) is a processor, and the transceiver unit 620 may be an interface circuit. The interface circuit is configured to receive computer code or instructions, and transmit the computer code or the instructions to the processor. The processor executes the computer code or the instructions, to enable the communication apparatus 600 to perform operations and/or processing performed by the transmit device in the method embodiments of this application.

Figure 11:
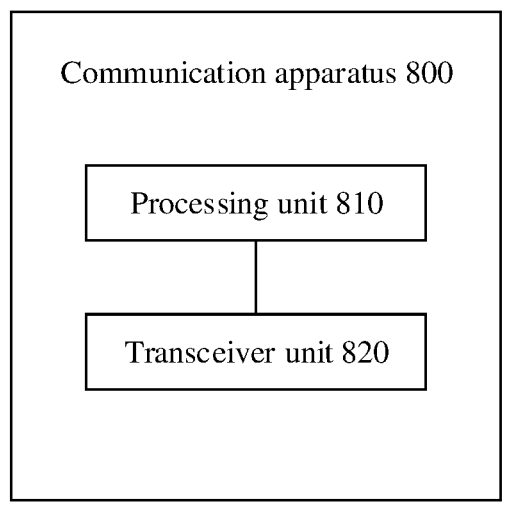
FIG. 11 is a schematic block diagram of a communication apparatus 800 according to this application.

FIG. 11 is a schematic block diagram of a communication apparatus 800 according to this application. As shown in FIG. 11, the communication apparatus 800 includes a processing unit 810 and a transceiver unit 820.

The transceiver unit 820 is configured to receive a first channel receive sequence from a transmit device.

The processing unit 810 is configured to decode, based on a first check matrix, a first LLR sequence corresponding to the first channel receive sequence, where the first check matrix is obtained by reading i rows and j columns from a mother matrix, the mother matrix includes a basic matrix, an extension matrix, a first fixed matrix, and a second fixed matrix, the basic matrix is located at the top-left corner of the mother matrix, the extension matrix is located at the bottom-left corner of the mother matrix, the first fixed matrix is located at the top-right corner of the mother matrix, the second fixed matrix is located at the bottom-right corner of the mother matrix, a quantity of rows in the basic matrix is equal to a quantity of rows in the first fixed matrix, a quantity of rows in the extension matrix is equal to a quantity of rows in the second fixed matrix, a quantity of columns in the extension matrix is equal to a quantity of columns in the basic matrix, a quantity of columns in the first fixed matrix is equal to a quantity of columns in the second fixed matrix, i=p+k, j=q+k, p and q are respectively the quantity of rows and the quantity of columns in the basic matrix, k≥0, and i, j, p, q, and k are all integers.

The transceiver unit 820 is further configured to output a decoding result when the processing unit 820 successfully decodes the first LLR sequence.

Optionally, in an embodiment, the transceiver unit 820 is further configured to: when the processing unit 810 unsuccessfully decodes the first LLR sequence, send retransmission indication information, and receive a second channel receive sequence from the transmit device.

The processing unit 810 is further configured to decode a combined LLR sequence based on a second check matrix, where the combined LLR sequence is obtained by combining the first LLR sequence and a second LLR sequence that corresponds to the second channel receive sequence, the second check matrix is obtained by reading w rows and z columns from the mother matrix, w=p+h, z=q+h, h>k, and w; z, and h are all positive integers.

Optionally, the transceiver unit 820 may alternatively be replaced with a sending unit or a receiving unit. For example, when executing a sending action, the transceiver unit 820 may be replaced with the sending unit. When executing a receiving action, the transceiver unit 820 may be replaced with the receiving unit.

Optionally, the communication apparatus 800 may be a receive device, or a component, a module, or the like that is inside a receive device and that implements functions of the method embodiments.

In an implementation, the communication apparatus 800 is the receive device in the foregoing method embodiments, and the communication apparatus 800 may have any function of the receive device in the method embodiments. In this case, the processing unit 810 may be a processor, and the transceiver unit 820 may be a transceiver. The transceiver may specifically include a receiver and a transmitter. The receiver is configured to execute a receiving function, and the transmitter is configured to execute a transmitting function.

In another implementation, the communication apparatus 800 may be a circuit system in the receive device. In this case, the processing unit 810 may be a chip, a logic circuit, an integrated circuit, a processing circuit, a system on a chip (SoC) chip, or the like. The transceiver unit 820 may be a communication interface, and the communication interface may be an interface circuit, an input/output interface, or the like.

In the foregoing embodiments, functions of the processing unit 810 may be implemented by hardware, or may be implemented by hardware executing corresponding software.

For example, the processing unit 810 may include one or more processors. The one or more processors are configured to read and execute a computer program or instructions stored in a memory; to enable the communication apparatus 800 to perform operations and/or processing performed by the receive device in the method embodiments. The memory is located outside the one or more processors.

Further, the processing unit 810 may further include one or more memories. The one or more processors are connected to the one or more memories by using a circuit/electric line. The one or more processors can read a computer program or instructions stored in the one or more memories, to enable the communication apparatus 800 to perform operations and/or processing performed by the receive device in the method embodiments of this application. For another example, the processing unit 810 is a processor, and the transceiver unit 820) is an interface circuit. The interface circuit is configured to receive computer code or instructions, and transmit the computer code or the instructions to the processor. The processor executes the computer code or the instructions, to enable the communication apparatus 800 to perform operations and/or processing performed by the receive device in the method embodiments of this application.

Optionally, the memory and the processor in the foregoing apparatus embodiments may be physically independent units, or the memory may be integrated with the processor.

In addition, this application further provides a computer-readable storage medium. The computer-readable storage medium stores computer instructions. When the computer instructions are run on a computer, the computer is enabled to perform operations and/or processing performed by the transmit device in the LDPC code encoding method provided in this application.

This application further provides a computer-readable storage medium. The computer-readable storage medium stores computer instructions. When the computer instructions are run on a computer, the computer is enabled to perform operations and/or processing performed by the receive device in the LDPC code decoding method in embodiments of this application.

This application further provides a computer program product. The computer program product includes computer code or instructions, and when the computer code or the instructions is/are run on a computer, the LDPC code encoding method in embodiments of this application is implemented.

This application further provides a computer program product. The computer program product includes computer code or instructions, and when the computer code or the instructions is/are run on a computer, the LDPC code decoding method in embodiments of this application is implemented.

This application further provides a communication apparatus, including a processor and an interface circuit. The interface circuit is configured to receive computer code or instructions, and transmit the computer code or the instructions to the processor. The processor is configured to run the computer code or the instructions, to enable the communication apparatus to perform operations and/or processing performed by the transmit device in the LDPC encoding method in this application.

This application further provides a communication apparatus, including a processor and an interface circuit. The interface circuit is configured to receive computer code or instructions, and transmit the computer code or the instructions to the processor. The processor is configured to run the computer code or the instructions, to enable the communication apparatus to perform operations and/or processing performed by the receive device in the LDPC encoding method in this application.

This application further provides a chip. The chip includes one or more processors. The one or more processors are configured to execute a computer program stored in a memory, to perform operations and/or processing performed by the transmit device in any method embodiment. The memory is disposed independently of the chip.

The chip may further include one or more communication interfaces. The one or more communication interfaces may be an input/output interface, an interface circuit, or the like. The chip may further include one or more memories.

This application further provides a chip. The chip includes one or more processors.

The one or more processors are configured to execute a computer program stored in a memory, to perform operations and/or processing performed by the receive device in any method embodiment. The memory is disposed independently of the chip.

The chip may further include one or more communication interfaces. The one or more communication interfaces may be an input/output interface, an interface circuit, or the like. The chip may further include one or more memories.

This application further provides a wireless communication system, including the transmit device and the receive device in embodiments of this application. Optionally, one of the transmit device and the receive device is a network device (e.g., a base station), and the other is a terminal device.

The processor in embodiments of this application may be an integrated circuit chip, and has a signal processing capability. In an implementation process, steps in the method embodiments can be implemented by using a hardware-integrated logical circuit in the processor, or by using instructions in a form of software. The processor may be a general-purpose processor, a digital signal processor (DSP), an application-specific integrated circuit (ASIC), a field programmable gate array (FPGA) or another programmable logic device, a discrete gate or a transistor logic device, or a discrete hardware component. The general-purpose processor may be a microprocessor, or the processor may be any conventional processor or the like. The steps of the methods disclosed in embodiments of this application may be directly executed and completed by using a hardware encoding processor, or may be executed and completed by using a combination of hardware and software modules in an encoding processor. The software module may be located in a mature storage medium in the field, such as a random access memory, a flash memory, a read-only memory, a programmable read-only memory, an electrically erasable programmable memory, or a register. The storage medium is located in the memory, and the processor reads information in the memory and completes the steps in the methods in combination with hardware of the processor.

The memory in embodiments of this application may be a volatile memory or a nonvolatile memory, or may include a volatile memory and a nonvolatile memory. The nonvolatile memory may be a read-only memory (ROM), a programmable read-only memory (programmable ROM. PROM), an erasable programmable read-only memory (erasable PROM, EPROM), an electrically erasable programmable read-only memory (electrically EPROM, EEPROM), or a flash memory. The volatile memory may be a random access memory (RAM), used as an external cache. Through examples but not limitative description. RAMs in many forms are available, for example, a static random access memory (static RAM. SRAM), a dynamic random access memory (dynamic RAM. DRAM), a synchronous dynamic random access memory (synchronous DRAM. SDRAM), a double data rate synchronous dynamic random access memory (double data rate SDRAM, DDR SDRAM), an enhanced synchronous dynamic random access memory (enhanced SDRAM. ESDRAM), a synchlink dynamic random access memory (synchlink DRAM. SLDRAM), and a direct rambus random access memory (direct rambus RAM, DRRAM). It should be noted that the memories in the system and method described in this specification include but are not limited to these memories and any memory of another suitable type.

The terms such as "unit", and "system" used in this specification are used to indicate computer-related entities, hardware, firmware, combinations of hardware and software, software, or software being executed. For example, a component may be, but is not limited to, a process that runs on a processor, a processor, an object, an executable file, a thread of execution, a program, and/or a computer. As shown in figures, both an application and a computing device that run on a computing device may be components. One or more components may reside within the process and/or the execution thread. The components may be located on one computer and/or distributed between two or more computers. In addition, these components may be executed from various computer-readable media that store various data structures. The components may communicate by using a local and/or remote process based on a signal having one or more data packets (e.g., data from two components interacting with another component in a local system, a distributed system, and/or a network such as the Internet interacting with another system by using the signal).

A person of ordinary skill in the art may be aware that, with reference to the examples described in embodiments disclosed in this specification, units and algorithm steps may be implemented by electronic hardware or a combination of computer software and electronic hardware. Whether the functions are executed by hardware or software depends on particular applications and design constraints of the technical solutions. A person skilled in the art may use different methods to implement the described functions for each particular application, but it should not be considered that the implementation goes beyond the scope of this application.

A person skilled in the art may clearly understand that, for the purpose of convenient and brief description, for a detailed working process of the foregoing system, apparatus, and unit, refer to a corresponding process in the foregoing method embodiments. Details are not described herein again.

In the several embodiments provided in this application, it should be understood that the disclosed system, apparatus, and method may be implemented in another manner. For example, the described apparatus embodiment is merely an example. For example, division into units is merely logical function division and may be other division during actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in an electronic form, a mechanical form, or another form.

The units described as separate parts may or may not be physically separate, and parts displayed as units may or may not be physical units, may be located in one position, or may be distributed on a plurality of network units. Some or all of the units may be selected based on actual requirements to achieve objectives of the solutions of the embodiments.

In addition, functional units in embodiments of this application may be integrated into one processing unit, or each of the units may exist alone physically, or two or more units may be integrated into one unit.

When the functions are implemented in a form of a software functional unit and sold or used as an independent product, the functions may be stored in a computer-readable storage medium. Based on such an understanding, the technical solutions of this application essentially, or the part contributing to the conventional technology, or some of the technical solutions may be implemented in a form of a software product. The computer software product is stored in a storage medium, and includes several instructions for instructing a computer device (which may be a personal computer, a server, or a network device) to perform all or some of the steps of the methods described in embodiments of this application. The foregoing storage medium includes any medium that can store program code, such as a USB flash drive, a removable hard disk, a read-only memory, a random access memory, a magnetic disk, or an optical disc.

The foregoing description is merely specific implementations of this application, but the protection scope of this application is not limited thereto. Any variation or replacement readily figured out by a person skilled in the art within the technical scope disclosed in this application shall fall within the protection scope of this application. Therefore, the protection scope of this application shall be subject to the protection scope of the claims.

The invention claimed is:

1. A non-transitory computer program product comprising programming instructions stored in a computer readable storage medium for enabling a computer to perform operations comprising:
   performing, based on a first check matrix, low-density parity-check (LDPC) code encoding on an information bit sequence to obtain a first codeword at a first code rate, wherein:
      the first check matrix is obtained by reading i rows and j columns from a mother matrix, and
      the mother matrix comprises: a basic matrix, an extension matrix, a first fixed matrix, and a second fixed matrix;
   and
   sending the first codeword.

2. The non-transitory computer program product according to claim 1, wherein the operations further comprises:
   receiving retransmission indication information;
   performing LDPC code encoding on the information bit sequence, based on a second check matrix, to obtain a second codeword at a second code rate, wherein the second check matrix is obtained by reading w rows and z columns from the mother matrix, where:
      w=p+h, z=q+h, h>k, and
      w, z, and h are all positive integers; and
   sending the second codeword.

3. The non-transitory computer program product according to claim 1, wherein a code rate corresponding to the basic matrix is 1/2, and
   wherein the mother matrix is shown as follows:

$$H(1/2) = \begin{bmatrix} H_{MC}(1/2) & 0_{12 \times r} \\ H_{IR}(1/2) & I_{r \times r} \end{bmatrix},$$

where:
   H(1/2) indicates the mother matrix, $H_{MC}(1/2)$ indicates the basic matrix, $H_{IR}(1/2)$ indicates the extension matrix, a size of $H_{IR}(1/2)$ is r rows and 24 columns, 1/2 indicates the code rate, $0_{12 \times r}$ indicates the first fixed matrix, $I_{r \times r}$ indicates the second fixed matrix, $0_{12 \times r}$ indicates an all-zero matrix with a size of 12 rows and r columns, $I_{r \times r}$ indicates an identity matrix with a size of r rows and r columns, r≥1, k≤r, and r is an integer; and $$H_{MC}(1/2) = \begin{bmatrix} 57 & - & - & - & 50 & - & 11 & - & 50 & - & 79 & - & 1 & 0 & - & - & - & - & - & - & - & - & - & - \\ 3 & - & 28 & - & 0 & - & - & - & 55 & 7 & - & - & - & 0 & 0 & - & - & - & - & - & - & - & - & - \\ 30 & - & - & - & 24 & 37 & - & - & 56 & 14 & - & - & - & - & 0 & 0 & - & - & - & - & - & - & - & - \\ 62 & 53 & - & - & 53 & - & - & 3 & 35 & - & - & - & - & - & - & 0 & 0 & - & - & - & - & - & - & - \\ 40 & - & - & 20 & 66 & - & - & 22 & 28 & - & - & - & - & - & - & - & 0 & 0 & - & - & - & - & - & - \\ 0 & - & - & - & 8 & - & 42 & - & 50 & - & - & 8 & - & - & - & - & - & 0 & 0 & - & - & - & - & - \\ 69 & 79 & 79 & - & - & - & 56 & - & 52 & - & - & - & 0 & - & - & - & - & - & 0 & 0 & - & - & - & - \\ 65 & - & - & - & 38 & 57 & - & - & 72 & - & 27 & - & - & - & - & - & - & - & - & 0 & 0 & - & - & - \\ 64 & - & - & - & 14 & 52 & - & - & 30 & - & - & 32 & - & - & - & - & - & - & - & - & 0 & 0 & - & - \\ - & 45 & - & 70 & 0 & - & - & - & 77 & 9 & - & - & - & - & - & - & - & - & - & - & - & 0 & 0 & - \\ 2 & 56 & - & 57 & 35 & - & - & - & - & 12 & - & - & - & - & - & - & - & - & - & - & - & - & 0 & 0 \\ 24 & - & 61 & - & 60 & - & - & 27 & 51 & - & - & 16 & 1 & - & - & - & - & - & - & - & - & - & - & 0 \end{bmatrix}$$

wherein "-" indicates an all-zero matrix; and wherein a Table A indicates a first matrix with a size of 100 rows and 24 columns, $H_{IR}(1/2)$ is obtained by reading r rows and 24 columns from the first matrix, the r rows are any r rows in the 100 rows in the first matrix, and Table A is shown as follows:

TABLE A

| nd | 1 | 2 | 3 | 4 | 5 |
|---|---|---|---|---|---|
| 5 | 0.22 | 1.34 | 4.39 | 8.29 | 11.80 |
| 5 | 0.7 | 1.60 | 4.20 | 8.7 | 13.15 |
| 5 | 0.56 | 4.2 | 7.77 | 8.69 | 9.8 |
| 5 | 0.79 | 1.49 | 4.72 | 8.75 | 10.58 |
| 5 | 1.47 | 4.18 | 7.22 | 8.38 | 9.75 |
| 5 | 1.63 | 4.80 | 8.21 | 9.50 | 10.32 |
| 4 | 3.30 | 4.44 | 8.55 | 10.21 | |
| 4 | 0.26 | 4.67 | 5.2 | 8.36 | |
| 4 | 4.9 | 5.14 | 6.73 | 8.67 | |
| 4 | 0.44 | 4.35 | 8.78 | 22.63 | |
| 4 | 0.67 | 4.18 | 8.8 | 23.53 | |
| 4 | 0.56 | 4.45 | 5.9 | 6.5 | |
| 4 | 0.50 | 4.50 | 8.25 | 15.45 | |
| 4 | 0.4 | 6.76 | 8.28 | 23.34 | |
| 4 | 0.8 | 4.50 | 5.40 | 6.62 | |
| 4 | 0.80 | 4.20 | 6.32 | 13.13 | |
| 4 | 0.38 | 4.47 | 8.38 | 11.0 | |
| 4 | 0.55 | 5.45 | 8.57 | 15.71 | |
| 3 | 0.49 | 4.67 | 17.7 | | |
| 3 | 4.33 | 8.79 | 17.27 | | |
| 4 | 4.76 | 8.47 | 11.17 | 23.58 | |
| 4 | 0.68 | 8.39 | 11.19 | 15.26 | |
| 4 | 4.3 | 6.31 | 8.43 | 17.6 | |
| 3 | 4.24 | 8.69 | 13.76 | | |
| 4 | 0.42 | 4.1 | 8.40 | 21.10 | |
| 3 | 0.26 | 8.34 | 21.37 | | |
| 4 | 0.63 | 2.66 | 4.47 | 8.74 | |
| 3 | 4.59 | 11.46 | 21.3 | | |
| 3 | 0.67 | 4.67 | 22.53 | | |
| 3 | 0.69 | 11.47 | 17.35 | | |
| 3 | 0.54 | 8.56 | 9.36 | | |
| 3 | 0.24 | 3.26 | 4.17 | | |
| 3 | 2.32 | 4.43 | 17.77 | | |
| 3 | 0.78 | 2.7 | 8.76 | | |
| 3 | 4.36 | 11.3 | 17.9 | | |
| 3 | 0.45 | 4.14 | 19.39 | | |
| 3 | 0.4 | 3.0 | 8.59 | | |
| 3 | 0.4 | 8.31 | 19.31 | | |
| 3 | 0.33 | 8.54 | 9.34 | | |
| 3 | 2.32 | 3.39 | 13.48 | | |
| 3 | 0.69 | 8.6 | 21.47 | | |
| 2 | 5.22 | 6.46 | | | |
| 3 | 5.10 | 6.64 | 17.77 | | |
| 2 | 6.66 | 23.42 | | | |
| 2 | 5.62 | 11.65 | | | |
| 3 | 6.43 | 11.23 | 17.43 | | |
| 2 | 9.48 | 17.16 | | | |
| 3 | 6.23 | 11.29 | 17.6 | | |
| 2 | 1.44 | 11.70 | | | |
| 2 | 3.11 | 6.3 | | | |
| 2 | 9.59 | 11.34 | | | |
| 2 | 2.49 | 11.16 | | | |
| 2 | 3.1 | 5.10 | | | |
| 2 | 2.19 | 17.8 | | | |
| 3 | 1.77 | 3.17 | 11.17 | | |
| 3 | 6.20 | 11.17 | 17.18 | | |
| 2 | 6.44 | 13.16 | | | |
| 3 | 6.69 | 11.71 | 17.4 | | |
| 3 | 3.36 | 11.27 | 17.18 | | |
| 2 | 6.0 | 22.52 | | | |
| 3 | 1.56 | 11.42 | 17.39 | | |
| 3 | 5.43 | 6.14 | 11.9 | | |
| 3 | 3.80 | 11.50 | 17.31 | | |
| 2 | 1.22 | 3.38 | | | |
| 2 | 7.34 | 17.64 | | | |
| 2 | 6.80 | 21.59 | | | |
| 3 | 5.43 | 6.31 | 17.77 | | |
| 2 | 6.71 | 10.48 | | | |
| 3 | 1.21 | 6.54 | 17.22 | | |
| 3 | 5.65 | 6.58 | 17.41 | | |
| 2 | 7.56 | 17.78 | | | |
| 2 | 6.47 | 21.21 | | | |
| 3 | 1.70 | 3.13 | 17.41 | | |
| 3 | 2.22 | 6.19 | 17.8 | | |
| 3 | 5.63 | 6.74 | 11.14 | | |
| 3 | 6.58 | 10.59 | 17.17 | | |
| 3 | 1.29 | 3.29 | 5.59 | | |
| 3 | 6.72 | 10.71 | 17.32 | | |
| 2 | 9.21 | 17.24 | | | |
| 3 | 2.46 | 11.79 | 17.46 | | |
| 3 | 1.19 | 6.51 | 17.75 | | |
| 2 | 6.53 | 15.34 | | | |
| 3 | 6.28 | 11.34 | 22.24 | | |
| 3 | 3.73 | 6.64 | 11.79 | | |
| 2 | 11.25 | 13.49 | | | |
| 3 | 6.48 | 7.72 | 11.64 | | |
| 3 | 6.41 | 10.18 | 11.1 | | |
| 2 | 6.32 | 21.41 | | | |
| 3 | 3.9 | 5.45 | 6.74 | | |
| 3 | 1.18 | 3.25 | 17.50 | | |
| 2 | 12.72 | 17.11 | | | |
| 3 | 10.43 | 11.75 | 17.40 | | |
| 3 | 3.29 | 9.57 | 11.34 | | |
| 3 | 10.76 | 11.67 | 17.71 | | |
| 2 | 17.54 | 23.74 | | | |
| 3 | 6.23 | 11.5 | 17.66 | | |
| 2 | 6.70 | 18.17 | | | |
| 2 | 3.59 | 22.41 | | | |
| 3 | 1.72 | 3.3 | 17.74 | | |
| 3 | 3.25 | 9.31 | 11.68 | | | wherein an $m^{th}$ element from top to bottom in a column in which d is located indicates a row weight of row m in the first matrix, an $n^{th}$ element (a, b) from left to right in row m in the first matrix indicates that a cyclic shift coefficient of a cyclic shift matrix in row m and column (a+n) in the first matrix is b, all remaining locations in the first matrix are all-zero matrices, $n \in \{1, 2, 3, 4, 5\}$, and m, a, and b are all positive integers.

4. The non-transitory computer program product according to claim 1, wherein a code rate corresponding to the basic matrix is 1/2, and the mother matrix is shown as follows:

$$H(1/2) = \begin{bmatrix} H_{MC}(1/2) & 0_{12 \times r} \\ H_{IR}(1/2) & I_{r \times r} \end{bmatrix},$$

wherein $H(1/2)$ indicates the mother matrix, $H_{MC}(1/2)$ indicates the basic matrix, $H_{IR}(1/2)$ indicates the extension matrix, a size of $H_{IR}(1/2)$ is r rows and 24 columns, 1/2 indicates the code rate, $0_{12 \times r}$ indicates the first fixed matrix, $I_{r \times r}$ indicates the second fixed matrix, $0_{12 \times r}$ indicates an all-zero matrix with a size of 12 rows and r columns, $I_{r \times r}$ indicates an identity matrix with a size of r rows and r columns, $r \geq 1$, $k \leq r$, and r is an integer; and $$H_{MC}(1/2) =$$

$$\begin{bmatrix}
57 & - & - & - & 50 & - & 11 & - & 50 & - & 79 & - & 1 & 0 & - & - & - & - & - & - & - & - & - & - \\
3 & - & 28 & - & 0 & - & - & - & 55 & 7 & - & - & - & 0 & 0 & - & - & - & - & - & - & - & - & - \\
30 & - & - & - & 24 & 37 & - & - & 56 & 14 & - & - & - & - & 0 & 0 & - & - & - & - & - & - & - & - \\
62 & 53 & - & - & 53 & - & - & 3 & 35 & - & - & - & - & - & - & 0 & 0 & - & - & - & - & - & - & - \\
40 & - & - & 20 & 66 & - & - & 22 & 28 & - & - & - & - & - & - & - & 0 & 0 & - & - & - & - & - & - \\
0 & - & - & - & 8 & - & 42 & - & 50 & - & - & 8 & - & - & - & - & - & 0 & 0 & - & - & - & - & - \\
69 & 79 & 79 & - & - & - & 56 & - & 52 & - & - & - & 0 & - & - & - & - & - & 0 & 0 & - & - & - & - \\
65 & - & - & - & 38 & 57 & - & - & 72 & - & 27 & - & - & - & - & - & - & - & - & 0 & 0 & - & - & - \\
64 & - & - & - & 14 & 52 & - & - & 30 & - & - & 32 & - & - & - & - & - & - & - & - & 0 & 0 & - & - \\
- & 45 & - & 70 & 0 & - & - & - & - & 77 & 9 & - & - & - & - & - & - & - & - & - & - & 0 & 0 & - \\
2 & 56 & - & 57 & 35 & - & - & - & - & - & 12 & - & - & - & - & - & - & - & - & - & - & - & 0 & 0 \\
24 & - & 61 & - & 60 & - & - & 27 & 51 & - & - & 16 & 1 & - & - & - & - & - & - & - & - & - & - & 0
\end{bmatrix},$$

wherein "-" indicates an all-zero matrix; and
wherein a Table B indicates a second matrix with a size of 100 rows and 24 columns, $H_{IR}(1/2)$ is obtained by reading r rows and 24 columns from the second matrix, the r rows are any r rows in the 100 rows in the second matrix, and Table B is shown as follows:

TABLE B

| nd | 1 | 2 | 3 | 4 | 5 |
|---|---|---|---|---|---|
| 5 | 0.29 | 4.22 | 6.80 | 8.34 | 10.39 |
| 3 | 1.60 | 7.20 | 11.15 | | |
| 3 | 2.7 | 5.7 | 12.77 | | |
| 2 | 9.56 | 13.69 | | | |
| 2 | 14.2 | 15.8 | | | |
| 2 | 3.49 | 16.75 | | | |
| 2 | 17.79 | 20.72 | | | |
| 2 | 19.58 | 21.22 | | | |
| 5 | 4.47 | 4.80 | 18.75 | 22.18 | 23.38 |
| 2 | 0.21 | 8.50 | | | |
| 2 | 5.32 | 6.63 | | | |
| 2 | 1.30 | 7.55 | | | |
| 2 | 9.21 | 11.44 | | | |
| 2 | 2.67 | 12.36 | | | |
| 2 | 13.26 | 14.2 | | | |
| 2 | 15.14 | 16.67 | | | |
| 2 | 3.9 | 17.73 | | | |
| 2 | 18.35 | 20.78 | | | |
| 2 | 21.63 | 22.44 | | | |
| 4 | 0.67 | 8.53 | 19.8 | 23.18 | |
| 2 | 4.9 | 8.56 | | | |
| 2 | 1.5 | 5.45 | | | |
| 2 | 7.50 | 9.25 | | | |
| 2 | 6.50 | 15.45 | | | |
| 2 | 2.76 | 11.4 | | | |
| 2 | 12.34 | 14.28 | | | |
| 2 | 13.62 | 16.8 | | | |
| 2 | 3.50 | 17.40 | | | |
| 2 | 20.32 | 23.13 | | | |
| 2 | 18.20 | 21.80 | | | |
| 4 | 8.38 | 8.47 | 19.0 | 22.38 | |
| 2 | 0.71 | 4.57 | | | |
| 2 | 1.55 | 7.45 | | | |
| 2 | 5.49 | 11.67 | | | |
| 2 | 6.7 | 9.79 | | | |
| 2 | 15.27 | 16.33 | | | |
| 2 | 2.76 | 3.47 | | | |
| 2 | 14.17 | 17.58 | | | |
| 2 | 12.39 | 19.26 | | | |
| 2 | 13.68 | 21.19 | | | |
| 2 | 22.3 | 23.31 | | | |
| 4 | 8.69 | 8.76 | 18.43 | 20.6 | |
| 2 | 0.24 | 4.1 | | | |
| 2 | 1.40 | 7.42 | | | |
| 2 | 5.10 | 9.37 | | | |
| 2 | 3.26 | 11.34 | | | |
| 2 | 15.66 | 16.63 | | | |

TABLE B-continued

| nd | 1 | 2 | 3 | 4 | 5 |
|---|---|---|---|---|---|
| 2 | 6.47 | 20.74 | | | |
| 2 | 2.59 | 14.46 | | | |
| 2 | 17.53 | 21.3 | | | |
| 2 | 13.67 | 18.67 | | | |
| 2 | 12.69 | 22.47 | | | |
| 3 | 4.36 | 19.54 | 23.35 | | |
| 2 | 0.17 | 8.56 | | | |
| 2 | 1.24 | 9.26 | | | |
| 2 | 7.32 | 11.77 | | | |
| 2 | 5.7 | 15.43 | | | |
| 2 | 3.78 | 10.76 | | | |
| 2 | 2.3 | 20.9 | | | |
| 2 | 16.36 | 19.14 | | | |
| 2 | 6.45 | 14.39 | | | |
| 2 | 12.0 | 23.59 | | | |
| 2 | 13.4 | 17.4 | | | |
| 2 | 21.31 | 22.31 | | | |
| 3 | 8.33 | 8.34 | 18.54 | | |
| 2 | 0.32 | 1.39 | | | |
| 2 | 3.6 | 7.48 | | | |
| 2 | 5.47 | 9.69 | | | |
| 2 | 11.46 | 18.22 | | | |
| 2 | 2.10 | 15.77 | | | |
| 2 | 6.66 | 10.64 | | | |
| 2 | 12.42 | 23.65 | | | |
| 2 | 16.62 | 17.23 | | | |
| 2 | 14.43 | 20.43 | | | |
| 2 | 13.16 | 19.48 | | | |
| 3 | 8.23 | 21.29 | 22.6 | | |
| 2 | 0.44 | 4.70 | | | |
| 2 | 1.3 | 7.11 | | | |
| 2 | 9.34 | 11.59 | | | |
| 2 | 3.49 | 5.16 | | | |
| 2 | 15.10 | 18.1 | | | |
| 2 | 2.19 | 21.8 | | | |
| 2 | 14.77 | 16.17 | | | |
| 2 | 6.17 | 17.20 | | | |
| 2 | 10.18 | 20.17 | | | |
| 2 | 12.44 | 23.16 | | | |
| 2 | 13.69 | 22.4 | | | |
| 3 | 8.27 | 8.36 | 19.71 | | |
| 2 | 1.18 | 4.0 | | | |
| 2 | 7.52 | 9.39 | | | |
| 2 | 3.42 | 5.56 | | | |
| 2 | 11.43 | 21.9 | | | |
| 2 | 10.14 | 15.31 | | | |
| 2 | 19.50 | 20.80 | | | |
| 2 | 6.22 | 18.38 | | | |
| 2 | 12.64 | 14.34 | | | |
| 2 | 2.80 | 16.59 | | | |
| 2 | 22.43 | 23.31 | | | |
| 3 | 8.71 | 13.77 | 17.48 | | |
| 2 | 0.22 | 4.21 | | | | wherein an $m^{th}$ element from top to bottom in a column in which d is located indicates a row weight of row m in the second matrix, an $n^{th}$ element (a, b) from left to right in row m in the second matrix indicates that a cyclic shift coefficient of a cyclic shift matrix in row m and column (a+n) in the second matrix is b, all remaining locations in the second matrix are all-zero matrices, $n \in \{1, 2, 3, 4, 5\}$, and m, a, and b are all positive integers.

5. The non-transitory computer program product according to claim 1, wherein a code rate corresponding to the basic matrix is 2/3, and the mother matrix is shown as follows:

$$H(2/3) = \begin{bmatrix} H_{MC}(2/3) & 0_{8 \times r} \\ H_{IR}(2/3) & I_{r \times r} \end{bmatrix},$$

wherein
H(2/3) indicates the mother matrix, $H_{MC}(2/3)$ indicates the basic matrix, $H_{IR}(2/3)$ indicates the extension matrix, a size of $H_{IR}(2/3)$ is r rows and 8 columns, 2/3 indicates the code rate, $0_{8 \times r}$ indicates the first fixed matrix, $I_{r \times r}$ indicates the second fixed matrix, $0_{8 \times r}$ indicates an all-zero matrix with a size of 8 rows and r columns, $I_{r \times r}$ indicates an identity matrix with a size of r rows and r columns, r≥1, k≤r, and r is an integer; and $$H_{MC}(2/3) = \begin{bmatrix} 61 & 75 & 4 & 63 & 56 & - & - & - & - & - & - & 8 & - & 2 & 17 & 25 & 1 & 0 & - & - & - & - & - & - \\ 56 & 74 & 77 & 20 & - & - & - & 64 & 24 & 4 & 67 & - & 7 & - & - & - & 0 & 0 & - & - & - & - & - & - \\ 28 & 21 & 68 & 10 & 7 & 14 & 65 & - & - & - & 23 & - & - & - & 75 & - & - & 0 & 0 & - & - & - & - & - \\ 48 & 38 & 43 & 78 & 76 & - & - & - & - & 5 & 36 & - & 15 & 72 & - & - & - & - & 0 & 0 & - & - & - & - \\ 40 & 2 & 53 & 25 & - & 52 & 62 & - & 20 & - & - & 44 & - & - & - & - & - & - & - & 0 & 0 & - & - & - \\ 69 & 23 & 64 & 10 & 22 & - & 21 & - & - & - & - & - & 68 & 23 & 29 & - & - & - & - & - & 0 & 0 & - & - \\ 12 & 0 & 68 & 20 & 55 & 61 & - & 40 & - & - & - & 52 & - & - & - & 44 & - & - & - & - & - & - & 0 & 0 \\ 58 & 8 & 34 & 64 & 78 & - & - & 11 & 78 & 24 & - & - & - & - & - & 58 & - & - & - & - & - & - & - & 0 \end{bmatrix},$$

wherein "-" indicates an all-zero matrix; and
wherein a Table C indicates a third matrix with a size of 100 rows and 24 columns, $H_{IR}(2/3)$ is obtained by reading r rows and 24 columns from the third matrix, the r rows are any r rows in the 100 rows in the third matrix, and Table C is shown as follows:

TABLE C

3.

| d | 1 | 2 | 3 | 4 | 5 | 6 | 7 |
|---|---|---|---|---|---|---|---|
| 6 | 1.39 | 2.34 | 3.22 | 4.80 | 7.29 | 12.15 | |
| 6 | 0.77 | 1.7 | 2.7 | 3.20 | 7.69 | 12.60 | |
| 7 | 0.75 | 1.2 | 2.49 | 3.8 | 7.72 | 12.79 | 13.56 |
| 7 | 0.38 | 2.18 | 3.22 | 4.75 | 8.80 | 12.47 | 13.58 |
| 7 | 0.21 | 2.32 | 3.63 | 4.50 | 8.21 | 12.55 | 14.30 |
| 6 | 0.67 | 1.67 | 2.26 | 3.36 | 7.2 | 18.44 | |
| 6 | 1.9 | 2.35 | 3.78 | 5.73 | 8.14 | 12.44 | |
| 5 | 0.18 | 1.63 | 2.67 | 3.53 | 17.8 | | |
| 5 | 1.45 | 2.5 | 3.56 | 7.50 | 11.9 | | |
| 6 | 0.28 | 1.76 | 2.50 | 3.25 | 7.45 | 21.4 | |
| 6 | 0.32 | 1.40 | 2.34 | 3.50 | 12.62 | 19.8 | |
| 5 | 0.38 | 1.80 | 3.0 | 6.20 | 12.13 | | |
| 5 | 1.71 | 2.47 | 3.57 | 12.55 | 23.38 | | |
| 5 | 0.45 | 1.79 | 2.7 | 10.49 | 12.67 | | |
| 5 | 0.27 | 1.47 | 2.17 | 3.76 | 22.33 | | |
| 5 | 0.58 | 1.68 | 2.26 | 12.39 | 16.19 | | |
| 4 | 0.31 | 1.3 | 3.43 | 20.6 | | | |

TABLE C-continued

3.

| d | 1 | 2 | 3 | 4 | 5 | 6 | 7 |
|---|---|---|---|---|---|---|---|
| 5 | 0.40 | 2.69 | 3.76 | 12.24 | 15.1 | | |
| 5 | 1.34 | 2.26 | 3.42 | 12.37 | 20.10 | | |
| 4 | 0.66 | 2.63 | 3.74 | 9.47 | | | |
| 5 | 0.67 | 1.53 | 3.59 | 5.46 | 20.3 | | |
| 4 | 2.47 | 3.67 | 12.69 | 17.35 | | | |
| 4 | 0.54 | 1.56 | 3.17 | 11.36 | | | |
| 5 | 1.43 | 2.24 | 3.77 | 6.26 | 10.32 | | |
| 4 | 0.76 | 2.7 | 3.78 | 5.3 | | | |
| 4 | 0.9 | 1.45 | 6.14 | 23.36 | | | |
| 4 | 1.4 | 2.0 | 3.39 | 14.59 | | | |
| 4 | 0.4 | 2.54 | 3.31 | 16.31 | | | |
| 4 | 1.34 | 3.33 | 9.32 | 16.39 | | | |
| 3 | 2.6 | 3.48 | 22.47 | | | | |
| 4 | 1.46 | 2.69 | 3.22 | 21.77 | | | |
| 4 | 1.64 | 2.66 | 3.42 | 19.10 | | | |
| 4 | 1.43 | 3.65 | 9.23 | 14.62 | | | |
| 4 | 0.16 | 1.6 | 3.48 | 15.43 | | | |
| 4 | 1.44 | 2.23 | 3.70 | 11.29 | | | |
| 3 | 2.34 | 10.3 | 11.11 | | | | |
| 3 | 0.59 | 1.49 | 18.16 | | | | |
| 3 | 1.10 | 2.8 | 14.1 | | | | |
| 4 | 1.17 | 2.19 | 5.17 | 21.77 | | | |
| 4 | 1.44 | 2.20 | 5.17 | 15.18 | | | |
| 3 | 1.4 | 2.69 | 14.16 | | | | |
| 4 | 0.27 | 7.18 | 13.36 | 14.71 | | | |

TABLE C-continued

3.

| d | 1 | 2 | 3 | 4 | 5 | 6 | 7 |
|---|---|---|---|---|---|---|---|
| 3 | 0.0 | 9.39 | 12.52 | | | | |
| 3 | 0.43 | 5.56 | 14.42 | | | | |
| 3 | 0.31 | 6.9 | 21.14 | | | | |
| 2 | 0.80 | 9.50 | | | | | |
| 3 | 0.64 | 9.22 | 10.38 | | | | |
| 3 | 0.34 | 14.59 | 16.80 | | | | |
| 3 | 0.43 | 11.31 | 14.77 | | | | |
| 3 | 0.71 | 6.22 | 9.48 | | | | |
| 3 | 0.21 | 11.54 | 16.41 | | | | |
| 3 | 5.78 | 9.58 | 14.65 | | | | |
| 2 | 14.47 | 15.56 | | | | | |
| 3 | 12.21 | 14.13 | 16.41 | | | | |
| 3 | 10.19 | 12.70 | 16.8 | | | | |
| 3 | 9.74 | 11.63 | 14.22 | | | | |
| 3 | 9.17 | 12.14 | 20.59 | | | | |
| 2 | 11.58 | 12.29 | | | | | |
| 3 | 6.29 | 14.59 | 16.32 | | | | |
| 2 | 5.72 | 6.71 | | | | | |
| 3 | 11.79 | 14.24 | 15.21 | | | | |
| 2 | 9.46 | 10.46 | | | | | |
| 3 | 9.75 | 15.51 | 16.19 | | | | |
| 3 | 9.34 | 12.28 | 14.53 | | | | |
| 3 | 6.24 | 7.64 | 14.34 | | | | |
| 2 | 5.73 | 16.79 | | | | | |
| 2 | 11.49 | 13.25 | | | | | |

TABLE C-continued

3.

| d | \multicolumn{7}{c}{n} |
|---|---|---|---|---|---|---|---|
|   | 1 | 2 | 3 | 4 | 5 | 6 | 7 |
| 3 | 9.64 | 12.72 | 14.48 | | | | |
| 3 | 15.18 | 16.41 | 18.1 | | | | |
| 3 | 11.45 | 12.41 | 14.32 | | | | |
| 3 | 6.9 | 12.25 | 14.74 | | | | |
| 3 | 8.50 | 12.18 | 14.72 | | | | |
| 3 | 5.75 | 9.43 | 14.11 | | | | |
| 3 | 12.34 | 14.40 | 21.57 | | | | |
| 3 | 12.76 | 13.71 | 14.29 | | | | |
| 3 | 6.67 | 11.54 | 14.74 | | | | |

$$H_{MC}(2/3) = \begin{bmatrix} 61 & 75 & 4 & 63 & 56 & - & - & - & - & - & - & 8 & - & 2 & 17 & 25 & 1 & 0 & - & - & - & - & - & - \\ 56 & 74 & 77 & 20 & - & - & - & 64 & 24 & 4 & 67 & - & 7 & - & - & - & - & 0 & 0 & - & - & - & - & - \\ 28 & 21 & 68 & 10 & 7 & 14 & 65 & - & - & - & 23 & - & - & - & 75 & - & - & - & 0 & 0 & - & - & - & - \\ 48 & 38 & 43 & 78 & 76 & - & - & - & - & 5 & 36 & - & 15 & 72 & - & - & - & - & - & - & 0 & 0 & - & - \\ 40 & 2 & 53 & 25 & - & 52 & 62 & - & 20 & - & - & 44 & - & - & - & - & - & - & - & - & - & 0 & 0 & - \\ 69 & 23 & 64 & 10 & 22 & - & 21 & - & - & - & - & - & 68 & 23 & 29 & - & - & - & - & - & - & - & 0 & - \\ 12 & 0 & 68 & 20 & 55 & 61 & - & 40 & - & - & - & 52 & - & - & - & 44 & - & - & - & - & - & - & - & 0 & 0 \\ 58 & 8 & 34 & 64 & 78 & - & - & 11 & 78 & 24 & - & - & - & - & - & 58 & - & - & - & - & - & - & - & 0 \end{bmatrix},$$

TABLE C-continued

3.

| d | \multicolumn{7}{c}{n} |
|---|---|---|---|---|---|---|---|
|   | 1 | 2 | 3 | 4 | 5 | 6 | 7 |
| 2 | 12.23 | 13.5 | | | | | |
| 3 | 5.66 | 10.17 | 14.70 | | | | |
| 3 | 7.59 | 12.72 | 14.41 | | | | |
| 3 | 12.3 | 14.74 | 15.31 | | | | |
| 3 | 9.25 | 14.68 | 23.54 | | | | |
| 3 | 5.65 | 10.18 | 14.15 | | | | |
| 3 | 5.11 | 6.21 | 14.29 | | | | |
| 3 | 7.30 | 9.33 | 12.29 | | | | |
| 3 | 6.80 | 12.50 | 16.79 | | | | |
| 2 | 4.41 | 14.51 | | | | | |
| 2 | 14.41 | 20.45 | | | | | |
| 3 | 9.18 | 11.51 | 15.77 | | | | |
| 3 | 5.67 | 11.3 | 12.6 | | | | |
| 3 | 10.58 | 14.56 | 15.34 | | | | |
| 3 | 6.64 | 12.30 | 16.14 | | | | |
| 3 | 4.69 | 11.11 | 12.58 | | | | |
| 2 | 11.59 | 21.74 | | | | | |
| 3 | 5.38 | 7.52 | 14.48 | | | | |
| 3 | 5.16 | 7.58 | 12.41 | | | | |
| 3 | 6.2 | 14.80 | 15.63 | | | | |
| 3 | 6.25 | 12.8 | 20.35 | | | | |
| 3 | 10.26 | 11.64 | 15.4 | | | | |
| 3 | 7.39 | 14.68 | 15.61 | | | | |
| 3 | 10.26 | 12.66 | 15.50 | | | | | wherein an $m^{th}$ element from top to bottom in a column in which d is located indicates a row weight of row m in the third matrix, an $n^{th}$ element (a, b) from left to right in row m in the third matrix indicates that a cyclic shift coefficient of a cyclic shift matrix in row m and column (a+n) in the third matrix is b, all remaining locations in the third matrix are all-zero matrices, $n \in \{1, 2, 3, 4, 5, 6, 7\}$, and m, a, and b are all positive integers.

6. The non-transitory computer program product according to claim 1, wherein a code rate corresponding to the basic matrix is 2/3, and the mother matrix is shown as follows:

$$H(2/3) = \begin{bmatrix} H_{MC}(2/3) & 0_{8 \times r} \\ H_{IR}(2/3) & I_{r \times r} \end{bmatrix},$$

where:

H(2/3) indicates the mother matrix, $H_{MC}(2/3)$ indicates the basic matrix, $H_{IR}(2/3)$ indicates the extension matrix, a size of $H_{IR}(2/3)$ is r rows and 24 columns, 2/3 indicates the code rate, $0_{8 \times r}$ indicates the first fixed matrix, $I_{r \times r}$ indicates the second fixed matrix, $0_{8 \times r}$ indicates an all-zero matrix with a size of 8 rows and r columns, $I_{r \times r}$ indicates an identity matrix with a size of r rows and r columns, r≥1, k≤r, and r is an integer; and wherein "-" indicates an all-zero matrix; and
wherein a Table D indicates a fourth matrix with a size of 100 rows and 24 columns, $H_{IR}(2/3)$ is obtained by reading r rows and 24 columns from the fourth matrix, the r rows are any r rows in the 100 rows in the fourth matrix, the 24 columns in $H_{IR}(2/3)$ are the 24 columns in the fourth matrix, and Table D is shown as follows:

TABLE D

4.

| nd | 1 | 2 | 3 | 4 | 5 |
|---|---|---|---|---|---|
| 5 | 0.34 | 1.39 | 2.22 | 3.80 | 4.29 |
| 5 | 7.15 | 11.20 | 14.7 | 15.60 | 16.7 |
| 4 | 5.77 | 8.2 | 9.56 | 13.69 | |
| 3 | 6.8 | 10.49 | 12.75 | | |
| 3 | 17.79 | 18.58 | 19.72 | | |
| 5 | 3.47 | 20.22 | 21.18 | 22.38 | 23.75 |
| 4 | 0.32 | 1.21 | 2.80 | 4.50 | |
| 3 | 13.63 | 14.30 | 15.55 | | |
| 3 | 7.21 | 11.67 | 16.44 | | |
| 3 | 5.26 | 8.2 | 9.36 | | |
| 3 | 6.9 | 10.14 | 12.67 | | |
| 2 | 22.73 | 23.78 | | | |
| 2 | 20.44 | 21.35 | | | |
| 5 | 0.53 | 1.67 | 17.8 | 18.63 | 19.18 |
| 2 | 0.56 | 3.9 | | | |
| 3 | 4.50 | 13.45 | 14.5 | | |
| 3 | 11.50 | 15.45 | 16.25 | | |
| 3 | 7.28 | 8.76 | 9.4 | | |
| 3 | 5.8 | 10.34 | 12.62 | | |
| 2 | 6.40 | 19.50 | | | |
| 2 | 17.13 | 18.32 | | | |
| 5 | 0.47 | 20.20 | 21.0 | 22.80 | 23.38 |
| 3 | 1.57 | 3.71 | 4.38 | | |
| 2 | 2.55 | 13.45 | | | |
| 3 | 11.7 | 14.49 | 15.67 | | |
| 2 | 7.79 | 16.27 | | | |
| 3 | 5.47 | 8.76 | 9.33 | | |
| 3 | 6.17 | 10.39 | 12.58 | | |
| 3 | 17.19 | 18.68 | 19.26 | | |
| 2 | 20.3 | 23.31 | | | |
| 4 | 1.69 | 1.76 | 21.6 | 22.43 | |
| 3 | 0.1 | 2.24 | 3.40 | | |
| 2 | 13.10 | 14.42 | | | |

TABLE D-continued

4.

| nd | 1 | 2 | 3 | 4 | 5 |
|---|---|---|---|---|---|
| 3 | 11.34 | 15.26 | 16.37 | | |
| 2 | 9.63 | 12.66 | | | |
| 3 | 5.47 | 7.74 | 8.59 | | |
| 2 | 10.46 | 22.3 | | | |
| 2 | 6.53 | 21.67 | | | |
| 2 | 17.47 | 18.67 | | | |
| 4 | 0.36 | 19.54 | 20.35 | 23.69 | |
| 2 | 1.56 | 3.17 | | | |
| 2 | 2.26 | 4.24 | | | |
| 3 | 13.32 | 14.77 | 15.43 | | |
| 2 | 11.78 | 16.7 | | | |
| 2 | 5.3 | 8.76 | | | |
| 3 | 7.36 | 9.9 | 10.14 | | |
| 2 | 6.45 | 22.39 | | | |
| 2 | 12.59 | 23.0 | | | |
| 2 | 20.4 | 21.4 | | | |
| 4 | 0.34 | 17.31 | 18.31 | 19.54 | |
| 3 | 1.39 | 2.32 | 3.33 | | |
| 2 | 4.6 | 13.48 | | | |
| 2 | 5.69 | 15.47 | | | |
| 2 | 7.46 | 14.22 | | | |
| 2 | 8.10 | 11.77 | | | |
| 2 | 9.66 | 19.64 | | | |
| 2 | 16.65 | 17.42 | | | |
| 2 | 6.62 | 10.23 | | | |
| 2 | 12.43 | 18.43 | | | |
| 2 | 20.16 | 23.48 | | | |
| 4 | 1.23 | 1.44 | 21.29 | 22.6 | |
| 2 | 0.3 | 2.70 | | | |
| 2 | 4.11 | 13.34 | | | |
| 2 | 15.16 | 21.59 | | | |
| 2 | 7.49 | 14.1 | | | |
| 2 | 5.10 | 22.8 | | | |
| 3 | 6.19 | 8.17 | 12.77 | | |
| 2 | 9.20 | 16.17 | | | |
| 2 | 11.18 | 20.17 | | | |
| 2 | 10.16 | 19.44 | | | |
| 4 | 3.27 | 17.71 | 18.69 | 23.4 | |
| 2 | 0.18 | 1.36 | | | |
| 2 | 2.0 | 4.52 | | | |
| 3 | 7.56 | 11.39 | 13.42 | | |
| 3 | 14.9 | 15.43 | 21.14 | | |
| 2 | 8.50 | 22.31 | | | |
| 2 | 9.80 | 17.38 | | | |
| 3 | 5.64 | 6.22 | 12.34 | | |
| 2 | 16.59 | 19.80 | | | |
| 2 | 10.31 | 18.43 | | | |
| 4 | 1.22 | 1.71 | 20.77 | 23.48 | |
| 2 | 0.54 | 2.21 | | | |
| 2 | 4.41 | 5.65 | | | |
| 3 | 11.58 | 13.78 | 14.56 | | |
| 2 | 15.47 | 21.21 | | | |
| 2 | 12.13 | 23.41 | | | |

TABLE D-continued

4.

| nd | 1 | 2 | 3 | 4 | 5 |
|---|---|---|---|---|---|
| 3 | 6.8 | 9.19 | 10.70 | | |
| 3 | 7.74 | 8.22 | 16.63 | | |
| 2 | 20.17 | 22.14 | | | |

TABLE D-continued

4.

| nd | 1 | 2 | 3 | 4 | 5 |
|---|---|---|---|---|---|
| 4 | 1.59 | 17.58 | 18.29 | 19.59 | |
| 2 | 0.32 | 3.29 | | | |
| 2 | 2.72 | 4.71 | | | |
| 3 | 5.79 | 6.24 | 13.21 | | |
| 2 | 11.46 | 15.46 | | | |
| 3 | 9.19 | 12.75 | 22.51 | | |
| 2 | 14.34 | 16.53 | | | |
| 2 | 18.34 | 23.28 | | | |
| 3 | 7.24 | 8.64 | 10.79 | | |
| 3 | 19.73 | 20.25 | 21.49 | | |
| 3 | 1.64 | 1.72 | 17.48 | | | wherein an $m^{th}$ element from top to bottom in a column in which d is located indicates a row weight of row m in the fourth matrix, an $n^{th}$ element (a, b) from left to right in row m in the fourth matrix indicates that a cyclic shift coefficient of a cyclic shift matrix in row m and column (a+n) in the fourth matrix is b, all remaining locations in the fourth matrix are all-zero matrices, $n \in \{1, 2, 3, 4, 5\}$, and m, a, and b are all positive integers.

7. The non-transitory computer program product according to claim 1, wherein a code rate corresponding to the basic matrix is 3/4, and the mother matrix is shown as follows:

$$H(3/4) = \begin{bmatrix} H_{MC}(3/4) & 0_{6 \times r} \\ H_{IR}(3/4) & I_{r \times r} \end{bmatrix},$$

where:

H(3/4) indicates the mother matrix, $H_{MC}(3/4)$ indicates the basic matrix, $H_{IR}(3/4)$ indicates the extension matrix, a size of $H_{IR}(3/4)$ is r rows and 24 columns, 3/4 indicates the code rate, $0_{6 \times r}$, indicates the first fixed matrix, $I_{r \times r}$ indicates the second fixed matrix, $0_{6 \times r}$ indicates an all-zero matrix with a size of 6 rows and r columns, $I_{r \times r}$ indicates an identity matrix with a size of r rows and r columns, r≥1, k≤r, and r is an integer; and $$H_{MC}(3/4) = \begin{bmatrix} 48 & 29 & 28 & 39 & 9 & 61 & - & - & - & 63 & 45 & 80 & - & - & - & 37 & 32 & 22 & 1 & 0 & - & - & - & - \\ 4 & 49 & 42 & 48 & 11 & 30 & - & - & - & 49 & 17 & 41 & 37 & 15 & - & 54 & - & - & - & 0 & 0 & - & - & - \\ 35 & 76 & 78 & 51 & 37 & 35 & 21 & - & 17 & 64 & - & - & - & 59 & 7 & - & - & 32 & - & - & 0 & 0 & - & - \\ 9 & 65 & 44 & 9 & 54 & 56 & 73 & 34 & 42 & - & - & - & 35 & - & - & - & 46 & 39 & 0 & - & - & 0 & 0 & - \\ 3 & 62 & 7 & 80 & 68 & 26 & - & 80 & 55 & - & 36 & - & 26 & - & 9 & - & 72 & - & - & - & - & - & 0 & 0 \\ 26 & 75 & 33 & 21 & 69 & 59 & 3 & 38 & - & - & - & 35 & - & 62 & 36 & 26 & - & - & 1 & - & - & - & - & 0 \end{bmatrix},$$

wherein "-" indicates an all-zero matrix; and wherein a Table E indicates a fifth matrix with a size of 100 rows and 24 columns, $H_{IR}(3/4)$ is obtained by reading r rows and 24 columns from the fifth matrix, the r rows are any r rows in the 100 rows in the fifth matrix, and Table E is shown as follows:

TABLE E

5.

| d | n=1 | n=2 | n=3 | n=4 | n=5 | n=6 | n=7 | n=8 | n=9 |
|---|---|---|---|---|---|---|---|---|---|
| 9 | 0.22 | 1.20 | 2.7 | 3.29 | 4.15 | 5.60 | 9.39 | 17.34 | 19.80 |
| 7 | 0.8 | 2.2 | 3.69 | 5.75 | 9.7 | 17.56 | 19.77 | | |
| 7 | 1.58 | 2.72 | 3.38 | 4.18 | 5.49 | 11.79 | 19.22 | | |
| 8 | 1.30 | 2.75 | 3.21 | 4.80 | 5.32 | 9.47 | 10.50 | 17.63 | |
| 8 | 0.21 | 2.67 | 3.2 | 4.44 | 5.36 | 10.26 | 14.67 | 19.55 | |
| 7 | 1.73 | 2.63 | 3.35 | 5.44 | 7.14 | 17.78 | 19.9 | | |
| 7 | 0.9 | 1.67 | 2.8 | 3.18 | 5.56 | 8.5 | 9.53 | | |
| 6 | 3.50 | 4.45 | 5.25 | 6.76 | 17.50 | 19.45 | | | |
| 6 | 0.28 | 1.62 | 2.34 | 3.8 | 5.4 | 12.40 | | | |
| 5 | 0.32 | 2.50 | 5.20 | 17.80 | 23.13 | | | | |
| 6 | 0.38 | 2.71 | 3.57 | 5.47 | 13.0 | 17.38 | | | |
| 5 | 0.67 | 2.49 | 3.55 | 5.7 | 21.45 | | | | |
| 5 | 2.33 | 3.76 | 5.47 | 17.79 | 18.27 | | | | |
| 6 | 0.26 | 2.39 | 3.58 | 4.17 | 5.68 | 22.19 | | | |
| 6 | 0.69 | 2.3 | 3.31 | 13.6 | 17.43 | 19.76 | | | |
| 5 | 0.42 | 2.40 | 5.1 | 15.24 | 17.10 | | | | |
| 6 | 0.74 | 3.26 | 5.34 | 16.66 | 17.63 | 19.37 | | | |
| 6 | 0.67 | 2.46 | 3.47 | 5.59 | 14.53 | 17.3 | | | |
| 5 | 0.54 | 5.35 | 15.47 | 17.67 | 21.69 | | | | |
| 5 | 0.17 | 2.26 | 5.24 | 8.56 | 17.36 | | | | |
| 5 | 0.32 | 2.78 | 3.77 | 5.7 | 20.43 | | | | |
| 5 | 0.3 | 2.36 | 3.14 | 17.9 | 22.76 | | | | |
| 5 | 2.59 | 3.0 | 5.39 | 8.45 | 18.4 | | | | |
| 4 | 0.4 | 3.31 | 5.31 | 7.54 | | | | | |
| 4 | 2.34 | 3.39 | 6.33 | 17.32 | | | | | |
| 5 | 0.48 | 3.6 | 5.47 | 16.69 | 17.22 | | | | |
| 5 | 2.77 | 5.46 | 11.10 | 17.66 | 21.64 | | | | |
| 5 | 0.62 | 3.42 | 5.23 | 12.43 | 17.65 | | | | |
| 5 | 0.29 | 2.43 | 3.16 | 15.6 | 18.48 | | | | |
| 4 | 0.23 | 2.70 | 17.44 | 23.3 | | | | | |
| 4 | 2.16 | 5.34 | 10.11 | 17.59 | | | | | |
| 5 | 0.19 | 2.10 | 5.8 | 6.49 | 7.1 | | | | |
| 4 | 0.17 | 3.77 | 11.17 | 17.20 | | | | | |
| 4 | 2.17 | 5.18 | 6.16 | 7.44 | | | | | |
| 4 | 3.4 | 5.71 | 17.69 | 20.27 | | | | | |
| 4 | 0.0 | 2.52 | 3.36 | 14.18 | | | | | |
| 4 | 2.39 | 3.43 | 10.42 | 18.56 | | | | | |
| 3 | 0.9 | 3.14 | 12.31 | | | | | | |
| 4 | 3.50 | 5.38 | 11.80 | 16.22 | | | | | |
| 4 | 0.80 | 3.64 | 5.59 | 13.34 | | | | | |
| 3 | 6.31 | 14.43 | 17.77 | | | | | | |
| 3 | 6.22 | 16.48 | 17.71 | | | | | | |
| 4 | 0.21 | 3.41 | 5.65 | 9.54 | | | | | |
| 3 | 0.58 | 12.56 | 18.78 | | | | | | |
| 3 | 5.47 | 11.21 | 12.13 | | | | | | |
| 3 | 2.41 | 5.8 | 10.70 | | | | | | |
| 3 | 3.19 | 8.22 | 11.63 | | | | | | |
| 3 | 3.14 | 17.17 | 22.74 | | | | | | |
| 3 | 0.58 | 13.29 | 16.59 | | | | | | |
| 3 | 2.32 | 15.29 | 17.59 | | | | | | |
| 4 | 2.71 | 6.72 | 8.21 | 12.24 | | | | | |
| 3 | 0.46 | 2.46 | 10.79 | | | | | | |
| 3 | 6.19 | 17.75 | 20.51 | | | | | | |
| 3 | 0.53 | 7.28 | 16.34 | | | | | | |
| 3 | 0.24 | 2.34 | 4.64 | | | | | | |
| 3 | 11.79 | 12.49 | 17.73 | | | | | | |
| 3 | 0.48 | 10.72 | 16.25 | | | | | | |
| 3 | 11.1 | 18.64 | 21.18 | | | | | | |
| 3 | 11.41 | 16.41 | 17.32 | | | | | | |
| 2 | 17.45 | 22.74 | | | | | | | |
| 3 | 4.9 | 10.50 | 17.25 | | | | | | |
| 3 | 10.11 | 15.72 | 16.18 | | | | | | |
| 3 | 8.40 | 16.75 | 17.43 | | | | | | |
| 3 | 10.29 | 12.34 | 17.57 | | | | | | |
| 3 | 11.76 | 12.71 | 17.67 | | | | | | |
| 3 | 4.74 | 6.54 | 18.23 | | | | | | |
| 2 | 17.66 | 20.5 | | | | | | | |
| 3 | 7.17 | 10.70 | 17.41 | | | | | | |
| 3 | 7.59 | 10.12 | 18.74 | | | | | | |
| 2 | 10.3 | 16.31 | | | | | | | |
| 3 | 4.25 | 6.54 | 11.68 | | | | | | |
| 3 | 11.65 | 13.18 | 16.15 | | | | | | |
| 3 | 10.11 | 12.21 | 16.29 | | | | | | |
| 3 | 4.33 | 10.29 | 16.30 | | | | | | |

TABLE E-continued

5.

| d | n=1 | n=2 | n=3 | n=4 | n=5 | n=6 | n=7 | n=8 | n=9 |
|---|---|---|---|---|---|---|---|---|---|
| 3 | 8.80 | 13.50 | 16.79 | | | | | | |
| 2 | 11.51 | 12.41 | | | | | | | |
| 2 | 6.41 | 13.45 | | | | | | | |
| 3 | 4.18 | 10.77 | 12.51 | | | | | | |
| 3 | 12.67 | 16.6 | 18.3 | | | | | | |
| 3 | 4.58 | 7.56 | 10.34 | | | | | | |
| 3 | 11.30 | 13.64 | 20.14 | | | | | | |
| 3 | 4.58 | 6.11 | 12.69 | | | | | | |
| 3 | 10.48 | 11.74 | 12.59 | | | | | | |
| 2 | 4.38 | 8.52 | | | | | | | |
| 3 | 1.16 | 11.41 | 12.58 | | | | | | |
| 2 | 7.80 | 11.63 | | | | | | | |
| 3 | 12.25 | 16.2 | 18.8 | | | | | | |
| 3 | 4.35 | 6.4 | 13.64 | | | | | | |
| 3 | 8.26 | 11.61 | 12.68 | | | | | | |
| 3 | 6.39 | 8.50 | 12.66 | | | | | | |
| 3 | 4.31 | 6.11 | 12.26 | | | | | | |
| 3 | 6.80 | 12.73 | 14.18 | | | | | | |
| 2 | 6.28 | 14.44 | | | | | | | |
| 3 | 6.68 | 9.54 | 10.0 | | | | | | |
| 2 | 10.55 | 15.53 | | | | | | | |
| 3 | 6.42 | 11.72 | 15.3 | | | | | | |
| 2 | 6.73 | 18.65 | | | | | | | |
| 3 | 8.11 | 11.54 | 16.69 | | | | | | |
| 2 | 9.70 | 16.15 | | | | | | | |
| 3 | 10.61 | 11.44 | 13.48 | | | | | | | wherein an $m^{th}$ element from top to bottom in a column in which d is located indicates a row weight of row m in the fifth matrix, an $n^{th}$ element (a, b) from left to right in row m in the fifth matrix indicates that a cyclic shift coefficient of a cyclic shift matrix in row m and column (a+n) in the fifth matrix is b, all remaining locations in the fifth matrix are all-zero matrices, $n \in \{1, 2, 3, 4, 5, 6, 7, 8, 9\}$, and m, a, and b are all positive integers.

8. The non-transitory computer program product according to claim 1, wherein a code rate corresponding to the basic matrix is 3/4, and the mother matrix is shown as follows:

$$H(3/4) = \begin{bmatrix} H_{MC}(3/4) & 0_{6 \times r} \\ H_{IR}(3/4) & I_{r \times r} \end{bmatrix},$$

where:

H(3/4) indicates the mother matrix, $H_{MC}(3/4)$ indicates the basic matrix, $H_{IR}(3/4)$ indicates the extension matrix, a size of $H_{IR}(3/4)$ is r rows and 24 columns, 3/4 indicates the code rate, $0_{6 \times r}$ indicates the first fixed matrix, $I_{r \times r}$ indicates the second fixed matrix, $0_{6 \times r}$ indicates an all-zero matrix with a size of 6 rows and r columns, $I_{r \times r}$ indicates an identity matrix with a size of r rows and r columns, r≥1, k≤r, and r is an integer; and $$H_{MC}(3/4) = \begin{bmatrix} 48 & 29 & 28 & 39 & 9 & 61 & - & - & - & 63 & 45 & 80 & - & - & - & 37 & 32 & 22 & 1 & 0 & - & - & - & - \\ 4 & 49 & 42 & 48 & 11 & 30 & - & - & - & 49 & 17 & 41 & 37 & 15 & - & 54 & - & - & - & 0 & 0 & - & - & - \\ 35 & 76 & 78 & 51 & 37 & 35 & 21 & - & 17 & 64 & - & - & - & 59 & 7 & - & - & 32 & - & - & 0 & 0 & - & - \\ 9 & 65 & 44 & 9 & 54 & 56 & 73 & 34 & 42 & - & - & - & 35 & - & - & - & 46 & 39 & 0 & - & - & 0 & 0 & - \\ 3 & 62 & 7 & 80 & 68 & 26 & - & 80 & 55 & - & 36 & - & 26 & - & 9 & - & 72 & - & - & - & - & - & 0 & 0 \\ 26 & 75 & 33 & 21 & 69 & 59 & 3 & 38 & - & - & - & 35 & - & 62 & 36 & 26 & - & - & 1 & - & - & - & - & 0 \end{bmatrix},$$

wherein "-" indicates an all-zero matrix; and wherein a Table F indicates a sixth matrix with a size of 100 rows and 24 columns, $H_{MC}(3/4)$ is obtained by reading r rows and 24 columns from the sixth matrix, the r rows are any r rows in the 100 rows in the sixth matrix, and Table F is shown as follows:

TABLE F

| nd | 1 | 2 | 3 | 4 | 5 |
|---|---|---|---|---|---|
| 5 | 0.34 | 1.39 | 2.22 | 3.80 | 4.29 |
| 5 | 5.7 | 9.15 | 10.60 | 13.20 | 15.7 |
| 5 | 11.8 | 12.77 | 16.2 | 17.69 | 18.56 |
| 4 | 6.49 | 7.79 | 8.75 | 14.72 | |
| 4 | 19.58 | 20.38 | 21.22 | 23.18 | |
| 5 | 0.21 | 1.47 | 4.50 | 4.80 | 22.75 |
| 5 | 1.63 | 5.32 | 9.21 | 13.55 | 15.30 |
| 4 | 10.26 | 11.67 | 17.36 | 22.44 | |
| 4 | 12.2 | 14.14 | 16.67 | 18.9 | |
| 3 | 6.35 | 7.73 | 8.78 | | |
| 5 | 0.53 | 19.8 | 20.44 | 21.18 | 23.63 |
| 4 | 1.56 | 2.5 | 3.67 | 4.9 | |
| 4 | 5.50 | 9.45 | 13.45 | 15.25 | |
| 3 | 10.76 | 11.4 | 22.50 | | |
| 4 | 12.34 | 16.28 | 17.62 | 18.8 | |
| 4 | 6.13 | 7.50 | 8.32 | 14.40 | |
| 5 | 1.47 | 19.80 | 20.38 | 21.0 | 23.20 |
| 4 | 0.71 | 2.55 | 3.57 | 4.38 | |
| 3 | 5.67 | 9.45 | 15.49 | | |
| 3 | 10.7 | 13.79 | 22.27 | | |
| 3 | 11.33 | 16.47 | 18.76 | | |
| 3 | 12.58 | 14.17 | 17.39 | | |
| 3 | 6.68 | 7.26 | 8.19 | | |
| 2 | 21.31 | 23.3 | | | |
| 4 | 4.69 | 4.76 | 19.6 | 20.43 | |
| 3 | 0.24 | 2.40 | 3.1 | | |
| 3 | 5.42 | 9.37 | 13.10 | | |
| 3 | 10.34 | 15.26 | 20.66 | | |
| 3 | 11.74 | 19.63 | 22.47 | | |
| 3 | 12.46 | 16.59 | 18.3 | | |
| 3 | 14.67 | 17.53 | 23.67 | | |
| 5 | 4.36 | 6.47 | 7.35 | 8.69 | 21.54 |
| 3 | 0.56 | 2.17 | 3.26 | | |
| 2 | 1.24 | 5.77 | | | |
| 3 | 9.32 | 13.43 | 15.7 | | |
| 3 | 10.76 | 19.3 | 20.78 | | |
| 3 | 11.14 | 12.9 | 22.36 | | |
| 3 | 16.45 | 17.39 | 18.0 | | |
| 3 | 6.4 | 7.4 | 8.59 | | |
| 4 | 4.34 | 14.31 | 21.31 | 23.54 | |
| 3 | 0.32 | 2.39 | 3.33 | | |
| 3 | 1.6 | 5.47 | 15.48 | | |
| 3 | 9.69 | 10.22 | 13.46 | | |
| 2 | 14.10 | 20.77 | | | |
| 2 | 6.64 | 19.66 | | | |
| 3 | 16.62 | 17.65 | 18.42 | | |
| 3 | 11.43 | 12.23 | 22.43 | | |
| 3 | 7.6 | 8.48 | 21.16 | | |
| 3 | 4.23 | 4.44 | 23.29 | | |
| 2 | 0.3 | 2.70 | | | |
| 3 | 1.11 | 5.59 | 13.34 | | |
| 3 | 9.1 | 10.49 | 15.16 | | |
| 3 | 12.10 | 17.8 | 22.19 | | |
| 3 | 14.17 | 16.77 | 23.17 | | |
| 3 | 11.17 | 19.20 | 20.18 | | |
| 2 | 7.16 | 18.44 | | | |

TABLE F-continued

| nd | 1 | 2 | 3 | 4 | 5 |
|---|---|---|---|---|---|
| 4 | 4.27 | 6.4 | 8.69 | 21.71 | |
| 2 | 0.18 | 3.36 | | | |
| 3 | 1.0 | 2.39 | 5.52 | | |
| 3 | 9.43 | 13.56 | 15.42 | | |
| 3 | 10.14 | 18.31 | 20.9 | | |
| 2 | 14.80 | 23.50 | | | |
| 2 | 8.22 | 22.38 | | | |
| 3 | 11.64 | 12.80 | 16.34 | | |
| 2 | 19.59 | 21.43 | | | |
| 4 | 4.71 | 6.77 | 7.31 | 17.48 | |
| 3 | 0.22 | 2.21 | 5.54 | | |
| 2 | 1.41 | 9.65 | | | |
| 3 | 3.78 | 10.58 | 15.56 | | |
| 2 | 13.21 | 17.47 | | | |
| 2 | 6.13 | 16.41 | | | |
| 3 | 8.8 | 11.70 | 12.19 | | |
| 2 | 7.63 | 23.22 | | | |
| 3 | 14.14 | 18.17 | 22.74 | | |
| 4 | 0.59 | 19.59 | 20.29 | 21.58 | |
| 2 | 2.32 | 4.29 | | | |
| 3 | 1.71 | 3.72 | 5.24 | | |
| 3 | 9.79 | 10.46 | 15.21 | | |
| 2 | 11.46 | 13.51 | | | |
| 3 | 6.53 | 12.19 | 17.75 | | |
| 2 | 8.34 | 14.28 | | | |
| 2 | 18.24 | 19.34 | | | |
| 3 | 7.64 | 20.79 | 23.73 | | |
| 4 | 0.72 | 16.49 | 21.25 | 22.48 | |
| 3 | 2.18 | 4.64 | 5.1 | | |
| 2 | 1.41 | 3.41 | | | |
| 3 | 9.74 | 13.45 | 15.32 | | |
| 2 | 10.25 | 17.9 | | | |
| 3 | 11.72 | 12.18 | 23.50 | | |
| 2 | 16.11 | 20.75 | | | |
| 3 | 6.43 | 14.40 | 22.34 | | |
| 3 | 8.29 | 18.71 | 19.57 | | |
| 3 | 4.54 | 7.67 | 21.76 | | |
| 2 | 0.74 | 5.23 | | | |
| 2 | 1.5 | 2.66 | | | |
| 3 | 3.41 | 9.17 | 15.70 | | |
| 3 | 7.59 | 11.74 | 17.72 | | |
| 3 | 10.25 | 13.31 | 18.3 | | |
| 3 | 12.54 | 14.65 | 20.68 | | |
| 2 | 6.15 | 21.18 | | | | wherein an $m^{th}$ element from top to bottom in a column in which d is located indicates a row weight of row m in the sixth matrix, an $n^{th}$ element (a, b) from left to right in row m in the sixth matrix indicates that a cyclic shift coefficient of a cyclic shift matrix in row m and column (a+n) in the sixth matrix is b, all remaining locations in the sixth matrix are all-zero matrices, $n \in \{1, 2, 3, 4, 5\}$, and m, a, and b are all positive integers.

9. The non-transitory computer program product according to claim 1, wherein a code rate corresponding to the basic matrix is 5/6, and the mother matrix is shown as follows:

$$H(5/6) = \begin{bmatrix} H_{MC}(5/6) & 0_{4 \times r} \\ H_{IR}(5/6) & I_{r \times r} \end{bmatrix},$$

where:
H(5/6) indicates the mother matrix, $H_{MC}$(5/6) indicates the basic matrix, $H_{IR}$(5/6) indicates the extension matrix, a size of $H_{IR}$(5/6) is r rows and 24 columns, 5/6 indicates the code rate, $0_{4 \times r}$ indicates the first fixed matrix, $I_{r \times r}$ indicates the second fixed matrix, $0_{4 \times 7}$ indicates an all-zero matrix with a size of 4 rows and r columns, $I_{r \times r}$ indicates an identity matrix with a size of r rows and r columns, r≥1, k≤r, and r is an integer; and $$H_{MC}(5/6) = \begin{bmatrix} 13 & 48 & 80 & 66 & 4 & 74 & 7 & 30 & 76 & 52 & 37 & 60 & - & 49 & - & 73 & 31 & 74 & 73 & 23 & 1 & 0 & - & - \\ 69 & 63 & 74 & 56 & 64 & 77 & 57 & 65 & 6 & 16 & 51 & - & 64 & - & 64 & 68 & 9 & 48 & 62 & 54 & - & 0 & 0 & - \\ 51 & 15 & 0 & 80 & 24 & 25 & 42 & 54 & 44 & 71 & 71 & 9 & 67 & 35 & 67 & - & 58 & - & 29 & - & 0 & - & 0 & 0 \\ 16 & 29 & 36 & 41 & 44 & 56 & 59 & 37 & 50 & 24 & - & 65 & 4 & 65 & 4 & 52 & - & 4 & - & 73 & 1 & - & - & 0 \end{bmatrix},$$

wherein "-" indicates an all-zero matrix; and
wherein a Table G indicates a seventh matrix with a size of 100 rows and 24 columns, $H_{IR}$(5/6) is obtained by reading r rows and 24 columns from the seventh matrix, the r rows are any r rows in the 100 rows in the seventh matrix, and Table G is shown as follows:

TABLE G

| | | | | | 7. | | | | | | |
|---|---|---|---|---|---|---|---|---|---|---|---|
| | | | | | | n | | | | | |
| d | 1 | 2 | 3 | 4 | 5 | 6 | 7 | 8 | 9 | 10 | 11 |
| 11 | 0.60 | 1.15 | 3.34 | 4.80 | 5.20 | 6.29 | 7.39 | 9.22 | 11.77 | 12.7 | 18.7 |
| 10 | 0.72 | 2.79 | 3.69 | 4.49 | 5.75 | 6.8 | 9.2 | 11.56 | 12.22 | 14.58 | |
| 8 | 1.18 | 2.47 | 4.21 | 5.80 | 6.38 | 7.50 | 9.75 | 11.32 | | | |
| 9 | 0.21 | 1.26 | 2.30 | 3.36 | 4.44 | 5.67 | 6.63 | 7.2 | 11.55 | | |
| 9 | 0.18 | 2.63 | 3.78 | 4.44 | 6.67 | 8.14 | 9.35 | 11.73 | 14.9 | | |
| 9 | 1.56 | 2.5 | 3.9 | 5.45 | 6.67 | 7.50 | 9.25 | 17.8 | 19.53 | | |
| 8 | 0.45 | 1.28 | 3.50 | 4.62 | 6.34 | 7.8 | 9.4 | 20.76 | | | |
| 7 | 2.80 | 3.50 | 4.13 | 5.40 | 6.32 | 9.0 | 10.20 | | | | |
| 8 | 1.47 | 2.38 | 3.55 | 4.45 | 6.67 | 7.71 | 9.57 | 23.38 | | | |
| 7 | 1.47 | 2.79 | 3.7 | 4.76 | 6.27 | 9.33 | 21.49 | | | | |
| 7 | 1.58 | 2.19 | 3.26 | 4.31 | 5.39 | 9.68 | 15.17 | | | | |
| 6 | 2.6 | 3.76 | 5.24 | 6.69 | 7.3 | 16.43 | | | | | |
| 6 | 1.40 | 3.34 | 6.37 | 7.42 | 9.1 | 13.10 | | | | | |
| 6 | 1.59 | 2.47 | 3.66 | 6.63 | 9.74 | 17.26 | | | | | |
| 6 | 2.47 | 3.3 | 4.53 | 5.67 | 7.67 | 22.46 | | | | | |
| 6 | 3.69 | 4.56 | 5.35 | 6.36 | 9.54 | 18.17 | | | | | |
| 6 | 3.7 | 6.26 | 7.77 | 9.24 | 16.43 | 22.32 | | | | | |
| 5 | 1.36 | 2.9 | 3.76 | 6.3 | 8.78 | | | | | | |
| 5 | 1.14 | 2.45 | 6.0 | 7.59 | 19.39 | | | | | | |
| 5 | 1.4 | 3.4 | 6.54 | 8.31 | 13.31 | | | | | | |
| 5 | 1.48 | 2.39 | 3.33 | 6.32 | 10.34 | | | | | | |
| 5 | 1.46 | 4.47 | 6.6 | 13.69 | 20.22 | | | | | | |
| 5 | 1.66 | 3.64 | 6.10 | 9.77 | 23.42 | | | | | | |
| 5 | 1.23 | 2.62 | 6.65 | 15.43 | 16.43 | | | | | | |
| 5 | 1.6 | 2.48 | 3.16 | 6.29 | 12.23 | | | | | | |
| 5 | 2.3 | 3.11 | 6.44 | 8.34 | 16.70 | | | | | | |
| 4 | 1.59 | 2.49 | 3.16 | 14.1 | | | | | | | |
| 5 | 2.77 | 3.19 | 6.8 | 13.10 | 21.17 | | | | | | |
| 5 | 1.44 | 2.20 | 3.18 | 14.17 | 19.17 | | | | | | |
| 4 | 3.71 | 6.16 | 9.4 | 10.69 | | | | | | | |
| 4 | 2.27 | 3.18 | 12.36 | 14.0 | | | | | | | |
| 5 | 1.52 | 3.43 | 6.42 | 8.39 | 20.56 | | | | | | |
| 4 | 1.31 | 6.14 | 8.50 | 22.9 | | | | | | | |
| 4 | 3.22 | 6.38 | 9.64 | 18.80 | | | | | | | |
| 4 | 1.43 | 2.80 | 3.59 | 17.34 | | | | | | | |
| 5 | 2.48 | 3.31 | 6.22 | 15.77 | 16.71 | | | | | | |
| 4 | 3.21 | 6.54 | 10.41 | 13.65 | | | | | | | |
| 4 | 3.58 | 6.78 | 14.47 | 18.56 | | | | | | | |
| 5 | 1.70 | 3.21 | 6.13 | 11.8 | 13.41 | | | | | | |

TABLE G-continued

7.

| d | n | | | | | | | | | | |
|---|---|---|---|---|---|---|---|---|---|---|---|
|   | 1 | 2 | 3 | 4 | 5 | 6 | 7 | 8 | 9 | 10 | 11 |
| 4 | 1.22 | 6.19 | 18.63 | 21.74 | | | | | | | |
| 4 | 1.59 | 2.58 | 6.17 | 12.14 | | | | | | | |
| 5 | 1.59 | 3.72 | 6.32 | 15.29 | 20.29 | | | | | | |
| 4 | 1.71 | 2.79 | 14.21 | 20.24 | | | | | | | |
| 4 | 2.46 | 3.46 | 16.19 | 17.51 | | | | | | | |
| 4 | 1.53 | 2.75 | 13.34 | 22.28 | | | | | | | |
| 4 | 0.79 | 1.24 | 2.34 | 8.64 | | | | | | | |
| 3 | 1.73 | 2.25 | 10.49 | | | | | | | | |
| 4 | 1.48 | 2.18 | 17.64 | 19.72 | | | | | | | |
| 3 | 0.41 | 2.41 | 10.1 | | | | | | | | |
| 3 | 1.32 | 12.74 | 15.45 | | | | | | | | |
| 3 | 2.9 | 12.50 | 19.25 | | | | | | | | |
| 4 | 1.72 | 2.18 | 12.75 | 21.11 | | | | | | | |
| 3 | 0.40 | 1.34 | 2.43 | | | | | | | | |
| 4 | 1.57 | 2.71 | 8.76 | 11.29 | | | | | | | |
| 3 | 0.74 | 10.67 | 15.54 | | | | | | | | |
| 3 | 7.5 | 8.23 | 14.66 | | | | | | | | |
| 3 | 10.70 | 12.41 | 13.17 | | | | | | | | |
| 3 | 10.59 | 12.72 | 14.74 | | | | | | | | |
| 3 | 0.3 | 8.25 | 14.31 | | | | | | | | |
| 3 | 8.54 | 14.65 | 22.68 | | | | | | | | |
| 3 | 0.15 | 12.18 | 13.29 | | | | | | | | |
| 3 | 0.11 | 8.21 | 19.33 | | | | | | | | |
| 3 | 0.30 | 13.29 | 19.80 | | | | | | | | |
| 3 | 0.50 | 8.41 | 16.79 | | | | | | | | |
| 3 | 12.51 | 14.41 | 22.45 | | | | | | | | |
| 2 | 8.18 | 17.77 | | | | | | | | | |
| 3 | 0.3 | 4.51 | 8.6 | | | | | | | | |
| 3 | 8.34 | 10.58 | 14.67 | | | | | | | | |
| 3 | 10.14 | 17.30 | 18.56 | | | | | | | | |
| 2 | 14.69 | 18.64 | | | | | | | | | |
| 3 | 9.58 | 12.59 | 15.11 | | | | | | | | |
| 3 | 0.74 | 12.48 | 14.38 | | | | | | | | |
| 3 | 0.41 | 10.52 | 15.16 | | | | | | | | |
| 3 | 12.58 | 16.63 | 20.80 | | | | | | | | |
| 3 | 0.8 | 12.2 | 18.25 | | | | | | | | |
| 2 | 0.64 | 20.35 | | | | | | | | | |
| 3 | 0.68 | 11.4 | 12.26 | | | | | | | | |
| 3 | 0.39 | 12.66 | 22.61 | | | | | | | | |
| 3 | 11.26 | 12.50 | 18.31 | | | | | | | | |
| 2 | 14.11 | 16.18 | | | | | | | | | |
| 3 | 9.73 | 10.80 | 19.44 | | | | | | | | |
| 2 | 11.54 | 13.28 | | | | | | | | | |
| 3 | 0.68 | 14.0 | 19.55 | | | | | | | | |
| 3 | 0.53 | 7.3 | 15.42 | | | | | | | | |
| 3 | 0.65 | 10.72 | 16.73 | | | | | | | | |
| 3 | 0.54 | 12.11 | 23.69 | | | | | | | | |
| 3 | 0.44 | 12.15 | 17.70 | | | | | | | | |
| 3 | 12.57 | 16.48 | 18.61 | | | | | | | | |
| 3 | 7.48 | 14.30 | 18.72 | | | | | | | | |
| 2 | 7.80 | 10.47 | | | | | | | | | |
| 3 | 0.4 | 12.23 | 19.72 | | | | | | | | |
| 3 | 9.59 | 13.4 | 17.69 | | | | | | | | |
| 2 | 9.66 | 18.22 | | | | | | | | | |
| 3 | 12.52 | 16.53 | 19.60 | | | | | | | | |
| 2 | 8.35 | 21.13 | | | | | | | | | |
| 3 | 7.65 | 9.44 | 16.68 | | | | | | | | |
| 3 | 12.16 | 13.9 | 17.9 | | | | | | | | |
| 3 | 7.10 | 12.3 | 14.7 | | | | | | | | |
| 2 | 17.50 | 22.5 | | | | | | | | | |
| 3 | 9.62 | 16.20 | 17.80 | | | | | | | | | wherein an $m^{th}$ element from top to bottom in a column in which d is located indicates a row weight of row m in the seventh matrix, an $n^{th}$ element (a, b) from left to right in row m in the seventh matrix indicates that a cyclic shift coefficient of a cyclic shift matrix in row m and column (a+n) in the seventh matrix is b, all remaining locations in the seventh matrix are all-zero matrices, n∈{1, 2, 3, 4, 5, 6, 7, 8, 9, 10, 11}, and m, a, and b are all positive integers.

10. The non-transitory computer program product according to claim 1, wherein a code rate corresponding to the basic matrix is 5/6, and the mother matrix is shown as follows:

$$H(5/6) = \begin{bmatrix} H_{MC}(5/6) & 0_{4 \times r} \\ H_{IR}(5/6) & I_{r \times r} \end{bmatrix},$$

where:
H(5/6) indicates the mother matrix, $H_{MC}(5/6)$ indicates the basic matrix, $H_{IR}(5/6)$ indicates the extension matrix, a size of $H_{IR}(5/6)$ is r rows and 24 columns, 5/6 indicates the code rate, $0_{4 \times r}$ indicates the first fixed matrix, $I_{r \times r}$ indicates the second fixed matrix, $0_{4 \times r}$ indicates an all-zero matrix with a size of 4 rows and r columns, $I_{r \times r}$ indicates an identity matrix with a size of r rows and r columns, r≥1, k≤r, and r is an integer; and $$H_{MC}(5/6) = \begin{bmatrix} 13 & 48 & 80 & 66 & 4 & 74 & 7 & 30 & 76 & 52 & 37 & 60 & - & 49 & - & 73 & 31 & 74 & 73 & 23 & 1 & 0 & - & - \\ 69 & 63 & 74 & 56 & 64 & 77 & 57 & 65 & 6 & 16 & 51 & - & 64 & - & 64 & 68 & 9 & 48 & 62 & 54 & - & 0 & 0 & - \\ 51 & 15 & 0 & 80 & 24 & 25 & 42 & 54 & 44 & 71 & 71 & 9 & 67 & 35 & 67 & - & 58 & - & 29 & - & 0 & - & 0 & 0 \\ 16 & 29 & 36 & 41 & 44 & 56 & 59 & 37 & 50 & 24 & - & 65 & 4 & 65 & 4 & 52 & - & 4 & - & 73 & 1 & - & - & 0 \end{bmatrix},$$

wherein "-" indicates an all-zero matrix; and
wherein a Table H indicates an eighth matrix with a size of 100 rows and 24 columns, $H_{IR}(5/6)$ is obtained by reading r rows and 24 columns from the eighth matrix, the r rows are any r rows in the 100 rows in the eighth matrix, and Table H is shown as follows:

TABLE H

| 8. | | | | | |
|---|---|---|---|---|---|
| nd | 1 | 2 | 3 | 4 | 5 |
| 5 | 0.80 | 1.29 | 2.34 | 8.39 | 9.22 |
| 5 | 3.7 | 4.20 | 5.60 | 6.15 | 7.7 |
| 5 | 11.8 | 13.2 | 14.77 | 18.69 | 20.56 |
| 5 | 12.72 | 15.58 | 16.79 | 17.75 | 19.49 |
| 5 | 5.47 | 10.75 | 21.18 | 22.22 | 23.38 |
| 5 | 2.32 | 3.80 | 6.21 | 7.63 | 9.50 |
| 5 | 0.44 | 1.30 | 4.55 | 8.21 | 20.67 |
| 5 | 11.26 | 13.67 | 14.14 | 16.2 | 18.36 |
| 5 | 10.35 | 12.78 | 15.73 | 17.9 | 19.44 |
| 5 | 4.53 | 6.67 | 21.18 | 22.8 | 23.63 |
| 5 | 0.56 | 1.5 | 2.50 | 4.45 | 9.9 |
| 5 | 5.76 | 7.45 | 8.4 | 13.25 | 20.50 |
| 4 | 11.34 | 14.8 | 16.62 | 18.28 | |
| 4 | 12.32 | 15.13 | 17.40 | 19.50 | |
| 5 | 9.47 | 10.38 | 21.80 | 22.20 | 23.0 |
| 5 | 1.71 | 2.38 | 4.45 | 6.57 | 7.55 |
| 4 | 0.67 | 5.7 | 8.79 | 20.49 | |
| 4 | 3.27 | 13.47 | 14.76 | 18.33 | |
| 4 | 11.58 | 12.17 | 16.26 | 17.39 | |
| 4 | 10.68 | 15.31 | 19.3 | 23.19 | |
| 5 | 1.76 | 4.24 | 4.69 | 21.6 | 22.43 |
| 4 | 0.40 | 6.10 | 7.42 | 9.1 | |
| 4 | 3.37 | 5.66 | 8.26 | 20.34 | |
| 3 | 13.63 | 21.47 | 22.74 | | |
| 3 | 10.3 | 18.59 | 23.46 | | |
| 3 | 11.67 | 14.53 | 16.67 | | |
| 5 | 4.36 | 12.54 | 15.35 | 17.47 | 19.69 |
| 3 | 0.17 | 1.26 | 6.56 | | |
| 4 | 5.32 | 7.24 | 8.77 | 20.43 | |
| 3 | 2.76 | 3.78 | 9.7 | | |
| 3 | 13.36 | 21.3 | 22.9 | | |
| 3 | 11.45 | 14.39 | 18.14 | | |
| 3 | 10.4 | 16.59 | 23.0 | | |
| 3 | 12.31 | 15.31 | 19.4 | | |
| 4 | 4.32 | 4.33 | 4.34 | 17.54 | |
| 3 | 1.39 | 7.48 | 20.6 | | |
| 3 | 5.69 | 8.47 | 9.22 | | |
| 3 | 2.77 | 3.10 | 17.46 | | |
| 3 | 12.66 | 15.42 | 19.64 | | |
| 3 | 10.65 | 21.23 | 22.62 | | |
| 3 | 11.48 | 13.43 | 18.43 | | |
| 5 | 4.23 | 4.44 | 14.16 | 16.6 | 23.29 |
| 3 | 5.11 | 7.3 | 8.70 | | |
| 3 | 1.16 | 9.59 | 20.34 | | |
| 3 | 0.10 | 16.49 | 17.1 | | |
| 3 | 3.8 | 12.77 | 19.19 | | |
| 3 | 13.17 | 15.20 | 21.17 | | |
| 3 | 10.17 | 14.18 | 23.44 | | |
| 3 | 2.4 | 11.16 | 22.69 | | |
| 4 | 4.18 | 4.27 | 4.36 | 18.71 | |
| 3 | 5.52 | 7.39 | 20.0 | | |
| 3 | 1.42 | 9.56 | 19.43 | | |
| 3 | 15.14 | 17.31 | 18.9 | | |
| 3 | 3.50 | 12.38 | 16.80 | | |
| 3 | 0.34 | 11.22 | 22.64 | | |
| 2 | 2.59 | 14.80 | | | |
| 3 | 13.77 | 21.31 | 23.43 | | |
| 4 | 4.22 | 4.71 | 5.21 | 10.48 | |
| 3 | 1.41 | 4.65 | 7.54 | | |
| 3 | 9.58 | 18.56 | 20.78 | | |
| 3 | 0.47 | 17.21 | 19.13 | | |
| 3 | 10.8 | 11.41 | 22.70 | | |
| 3 | 12.22 | 15.19 | 21.63 | | |
| 3 | 2.17 | 13.14 | 16.74 | | |
| 5 | 3.59 | 4.29 | 4.59 | 14.58 | 23.29 |
| 3 | 1.71 | 16.72 | 17.32 | | |
| 3 | 5.79 | 10.21 | 20.24 | | |
| 2 | 7.46 | 19.46 | | | |
| 3 | 9.51 | 14.19 | 18.75 | | |
| 2 | 0.53 | 8.34 | | | |
| 3 | 11.34 | 12.28 | 15.24 | | |
| 3 | 2.64 | 13.79 | 23.73 | | |
| 4 | 3.49 | 4.72 | 21.25 | 22.48 | |
| 3 | 1.64 | 10.1 | 17.18 | | |
| 3 | 5.41 | 13.32 | 23.41 | | |
| 2 | 9.74 | 18.45 | | | |
| 3 | 0.50 | 7.25 | 14.9 | | |
| 3 | 3.18 | 16.11 | 20.72 | | |
| 2 | 12.43 | 21.75 | | | |
| 3 | 2.40 | 11.57 | 19.34 | | |
| 2 | 6.71 | 8.29 | | | |
| 3 | 4.54 | 15.67 | 22.76 | | |
| 3 | 3.74 | 5.23 | 9.5 | | |
| 3 | 1.17 | 11.66 | 20.70 | | |
| 2 | 7.41 | 17.59 | | | |
| 3 | 0.3 | 2.72 | 18.74 | | |
| 3 | 10.68 | 13.31 | 14.25 | | |
| 3 | 8.65 | 15.54 | 16.18 | | |
| 3 | 12.29 | 19.15 | 23.21 | | |
| 3 | 6.11 | 21.33 | 22.29 | | |
| 3 | 4.79 | 5.30 | 9.80 | | |
| 3 | 3.41 | 14.50 | 15.51 | | |
| 3 | 1.41 | 8.18 | 18.45 | | |

TABLE H-continued

8.

| nd | 1 | 2 | 3 | 4 | 5 |
|---|---|---|---|---|---|
| 3 | 0.51 | 2.3 | 13.77 | | |
| 3 | 7.67 | 19.58 | 20.6 | | |
| 3 | 11.14 | 16.56 | 23.34 | | |
| 2 | 10.64 | 22.30 | | | |
| 2 | 6.11 | 12.69 | | | |
| 4 | 4.48 | 9.74 | 17.59 | 21.58 | |
| 3 | 0.52 | 14.38 | 15.16 | | | wherein an $m^{th}$ element from top to bottom in a column in which d is located indicates a row weight of row m in the eighth matrix, an $n^{th}$ element (a, b) from left to right in row m in the eighth matrix indicates that a cyclic shift coefficient of a cyclic shift matrix in row m and column (a+n) in the eighth matrix is b, all remaining locations in the eighth matrix are all-zero matrices, $n \in \{1, 2, 3, 4, 5\}$, and m, a, and b are all positive integers.

11. The non-transitory computer program product of claim 1, wherein:
   the basic matrix is located at a top-left corner of the mother matrix,
   the extension matrix is located at a bottom-left corner of the mother matrix,
   the first fixed matrix is located at a top-right corner of the mother matrix,
   the second fixed matrix is located at a bottom-right corner of the mother matrix,
   a quantity of rows in the basic matrix is equal to a quantity of rows in the first fixed matrix,
   a quantity of rows in the extension matrix is equal to a quantity of rows in the second fixed matrix,
   a quantity of columns in the extension matrix is equal to a quantity of columns in the basic matrix,
   a quantity of columns in the first fixed matrix is equal to a quantity of columns in the second fixed matrix,
   i=p+k, j=q+k, p and q are respectively the quantity of rows and the quantity of columns in the basic matrix, k≥0, and
   i, j, p, q, and k are all integers.

12. A non-transitory computer-readable recording medium on which a program is recorded, wherein the program, when executed, enables the computer to perform operations comprising:
   performing, based on a first check matrix, low-density parity-check (LDPC) code encoding on an information bit sequence to obtain a first codeword at a first code rate, wherein:
      the first check matrix is obtained by reading i rows and j columns from a mother matrix, and
      the mother matrix comprises a basic matrix, an extension matrix, a first fixed matrix, and a second fixed matrix;
   and
   sending the first codeword.

13. The non-transitory computer-readable recording medium according to claim 12, wherein the operations further comprising:
   receiving retransmission indication information;
   performing LDPC code encoding on the information bit sequence based on a second check matrix, to obtain a second codeword at a second code rate, wherein the second check matrix is obtained by reading w rows and z columns from the mother matrix, w=p+h, z=q+h, h>k, and w, z, and h are all positive integers; and
   sending the second codeword.

14. The non-transitory computer-readable recording medium according to claim 12, wherein a code rate corresponding to the basic matrix is 1/2, and the mother matrix is shown as follows:

$$H(1/2) = \begin{bmatrix} H_{MC}(1/2) & 0_{12 \times r} \\ H_{IR}(1/2) & I_{r \times r} \end{bmatrix},$$

where:
   H(1/2) indicates the mother matrix, $H_{MC}(1/2)$ indicates the basic matrix, $H_{IR}(1/2)$ indicates the extension matrix, a size of $H_{IR}(1/2)$ is r rows and 24 columns, 1/2 indicates the code rate, $0_{12 \times r}$ indicates the first fixed matrix, $I_{r \times r}$ indicates the second fixed matrix, $0_{12 \times r}$ indicates an all-zero matrix with a size of 12 rows and r columns, $I_{r \times r}$ indicates an identity matrix with a size of r rows and r columns, r≥1, k≤r, and r is an integer; and $$H_{MC}(1/2) = \begin{bmatrix}
57 & - & - & - & 50 & - & 11 & - & 50 & - & 79 & - & 1 & 0 & - & - & - & - & - & - & - & - & - & - \\
3 & - & 28 & - & 0 & - & - & - & 55 & 7 & - & - & - & 0 & 0 & - & - & - & - & - & - & - & - & - \\
30 & - & - & - & 24 & 37 & - & - & 56 & 14 & - & - & - & - & 0 & 0 & - & - & - & - & - & - & - & - \\
62 & 53 & - & - & 53 & - & - & 3 & 35 & - & - & - & - & - & - & 0 & 0 & - & - & - & - & - & - & - \\
40 & - & - & 20 & 66 & - & - & 22 & 28 & - & - & - & - & - & - & - & 0 & 0 & - & - & - & - & - & - \\
0 & - & - & - & 8 & - & 42 & - & 50 & - & - & 8 & - & - & - & - & - & 0 & 0 & - & - & - & - & - \\
69 & 79 & 79 & - & - & - & 56 & - & 52 & - & - & - & 0 & - & - & - & - & - & 0 & 0 & - & - & - & - \\
65 & - & - & - & 38 & 57 & - & - & 72 & - & 27 & - & - & - & - & - & - & - & - & 0 & 0 & - & - & - \\
64 & - & - & - & 14 & 52 & - & - & 30 & - & - & 32 & - & - & - & - & - & - & - & - & 0 & 0 & - & - \\
- & 45 & - & 70 & 0 & - & - & - & 77 & 9 & - & - & - & - & - & - & - & - & - & - & - & 0 & 0 & - \\
2 & 56 & - & 57 & 35 & - & - & - & - & 12 & - & - & - & - & - & - & - & - & - & - & - & - & 0 & 0 \\
24 & - & 61 & - & 60 & - & - & 27 & 51 & - & - & 16 & 1 & - & - & - & - & - & - & - & - & - & - & 0
\end{bmatrix},$$

wherein "-" indicates an all-zero matrix; and wherein a Table A indicates a first matrix with a size of 100 rows and 24 columns, $H_{IR}(1/2)$ is obtained by reading r rows and 24 columns from the first matrix, the r rows are any r rows in the 100 rows in the first matrix, and Table A is shown as follows:

TABLE A

9.

| | n | | | | |
|---|---|---|---|---|---|
| d | 1 | 2 | 3 | 4 | 5 |
| 5 | 0.22 | 1.34 | 4.39 | 8.29 | 11.80 |
| 5 | 0.7 | 1.60 | 4.20 | 8.7 | 13.15 |
| 5 | 0.56 | 4.2 | 7.77 | 8.69 | 9.8 |
| 5 | 0.79 | 1.49 | 4.72 | 8.75 | 10.58 |
| 5 | 1.47 | 4.18 | 7.22 | 8.38 | 9.75 |
| 5 | 1.63 | 4.80 | 8.21 | 9.50 | 10.32 |
| 4 | 3.30 | 4.44 | 8.55 | 10.21 | |
| 4 | 0.26 | 4.67 | 5.2 | 8.36 | |
| 4 | 4.9 | 5.14 | 6.73 | 8.67 | |
| 4 | 0.44 | 4.35 | 8.78 | 22.63 | |
| 4 | 0.67 | 4.18 | 8.8 | 23.53 | |
| 4 | 0.56 | 4.45 | 5.9 | 6.5 | |
| 4 | 0.50 | 4.50 | 8.25 | 15.45 | |
| 4 | 0.4 | 6.76 | 8.28 | 23.34 | |
| 4 | 0.8 | 4.50 | 5.40 | 6.62 | |
| 4 | 0.80 | 4.20 | 6.32 | 13.13 | |
| 4 | 0.38 | 4.47 | 8.38 | 11.0 | |
| 4 | 0.55 | 5.45 | 8.57 | 15.71 | |
| 3 | 0.49 | 4.67 | 17.7 | | |
| 3 | 4.33 | 8.79 | 17.27 | | |
| 4 | 4.76 | 8.47 | 11.17 | 23.58 | |
| 4 | 0.68 | 8.39 | 11.19 | 15.26 | |
| 4 | 4.3 | 6.31 | 8.43 | 17.6 | |
| 3 | 4.24 | 8.69 | 13.76 | | |
| 4 | 0.42 | 4.1 | 8.40 | 21.10 | |
| 3 | 0.26 | 8.34 | 21.37 | | |
| 4 | 0.63 | 2.66 | 4.47 | 8.74 | |
| 3 | 4.59 | 11.46 | 21.3 | | |
| 3 | 0.67 | 4.67 | 22.53 | | |
| 3 | 0.69 | 11.47 | 17.35 | | |
| 3 | 0.54 | 8.56 | 9.36 | | |
| 3 | 0.24 | 3.26 | 4.17 | | |
| 3 | 2.32 | 4.43 | 17.77 | | |
| 3 | 0.78 | 2.7 | 8.76 | | |
| 3 | 4.36 | 11.3 | 17.9 | | |
| 3 | 0.45 | 4.14 | 19.39 | | |
| 3 | 0.4 | 3.0 | 8.59 | | |
| 3 | 0.4 | 8.31 | 19.31 | | |
| 3 | 0.33 | 8.54 | 9.34 | | |
| 3 | 2.32 | 3.39 | 13.48 | | |
| 3 | 0.69 | 8.6 | 21.47 | | |
| 2 | 5.22 | 6.46 | | | |
| 3 | 5.10 | 6.64 | 17.77 | | |
| 2 | 6.66 | 23.42 | | | |
| 2 | 5.62 | 11.65 | | | |
| 3 | 6.43 | 11.23 | 17.43 | | |
| 2 | 9.48 | 17.16 | | | |
| 3 | 6.23 | 11.29 | 17.6 | | |
| 2 | 1.44 | 11.70 | | | |
| 2 | 3.11 | 6.3 | | | |
| 2 | 9.59 | 11.34 | | | |
| 2 | 2.49 | 11.16 | | | |
| 2 | 3.1 | 5.10 | | | |
| 2 | 2.19 | 17.8 | | | |
| 3 | 1.77 | 3.17 | 11.17 | | |
| 3 | 6.20 | 11.17 | 17.18 | | |
| 2 | 6.44 | 13.16 | | | |
| 3 | 6.69 | 11.71 | 17.4 | | |
| 3 | 3.36 | 11.27 | 17.18 | | |
| 2 | 6.0 | 22.52 | | | |
| 3 | 1.56 | 11.42 | 17.39 | | |
| 3 | 5.43 | 6.14 | 11.9 | | |
| 3 | 3.80 | 11.50 | 17.31 | | |
| 2 | 1.22 | 3.38 | | | |
| 2 | 7.34 | 17.64 | | | |
| 2 | 6.80 | 21.59 | | | |
| 3 | 5.43 | 6.31 | 17.77 | | |
| 2 | 6.71 | 10.48 | | | |
| 3 | 1.21 | 6.54 | 17.22 | | |
| 3 | 5.65 | 6.58 | 17.41 | | |
| 2 | 7.56 | 17.78 | | | |
| 2 | 6.47 | 21.21 | | | |
| 3 | 1.70 | 3.13 | 17.41 | | |
| 3 | 2.22 | 6.19 | 17.8 | | |
| 3 | 5.63 | 6.74 | 11.14 | | |
| 3 | 6.58 | 10.59 | 17.17 | | |
| 3 | 1.29 | 3.29 | 5.59 | | |
| 3 | 6.72 | 10.71 | 17.32 | | |
| 2 | 9.21 | 17.24 | | | |
| 3 | 2.46 | 11.79 | 17.46 | | |
| 3 | 1.19 | 6.51 | 17.75 | | |
| 2 | 6.53 | 15.34 | | | |
| 3 | 6.28 | 11.34 | 22.24 | | |
| 3 | 3.73 | 6.64 | 11.79 | | |
| 2 | 11.25 | 13.49 | | | |
| 3 | 6.48 | 7.72 | 11.64 | | |
| 3 | 6.41 | 10.18 | 11.1 | | |
| 2 | 6.32 | 21.41 | | | |
| 3 | 3.9 | 5.45 | 6.74 | | |
| 3 | 1.18 | 3.25 | 17.50 | | |
| 2 | 12.72 | 17.11 | | | |
| 3 | 10.43 | 11.75 | 17.40 | | |
| 3 | 3.29 | 9.57 | 11.34 | | |
| 3 | 10.76 | 11.67 | 17.71 | | |
| 2 | 17.54 | 23.74 | | | |
| 3 | 6.23 | 11.5 | 17.66 | | |
| 2 | 6.70 | 18.17 | | | |
| 2 | 3.59 | 22.41 | | | |
| 3 | 1.72 | 3.3 | 17.74 | | |
| 3 | 3.25 | 9.31 | 11.68 | | | wherein an $m^{th}$ element from top to bottom in a column in which d is located indicates a row weight of row m in the first matrix, an $n^{th}$ element (a, b) from left to right in row m in the first matrix indicates that a cyclic shift coefficient of a cyclic shift matrix in row m and column (a+n) in the first matrix is b, all remaining locations in the first matrix are all-zero matrices, $n \in \{1, 2, 3, 4, 5\}$, and m, a, and b are all positive integers.

15. The non-transitory computer-readable recording medium according to claim 12, wherein a code rate corresponding to the basic matrix is 1/2, and the mother matrix is shown as follows:

$$H(1/2) = \begin{bmatrix} H_{MC}(1/2) & 0_{12 \times r} \\ H_{IR}(1/2) & I_{r \times r} \end{bmatrix},$$

where:

H(1/2) indicates the mother matrix, $H_{MC}(1/2)$ indicates the basic matrix, $H_{IR}(1/2)$ indicates the extension matrix, a size of $H_{IR}(1/2)$ is r rows and 24 columns, 1/2 indicates the code rate, $0_{12 \times r}$ indicates the first fixed matrix, $I_{r \times r}$ indicates the second fixed matrix, $0_{12 \times r}$ indicates an all-zero matrix with a size of 12 rows and r columns, $I_{r \times r}$ indicates an identity matrix with a size of r rows and r columns, r≥1, k≤r, and r is an integer; and $$H_{MC}(1/2) = \begin{bmatrix} 57 & - & - & - & 50 & - & 11 & - & 50 & - & 79 & - & 1 & 0 & - & - & - & - & - & - & - & - & - & - \\ 3 & - & 28 & - & 0 & - & - & - & 55 & 7 & - & - & - & 0 & 0 & - & - & - & - & - & - & - & - & - \\ 30 & - & - & - & 24 & 37 & - & - & 56 & 14 & - & - & - & - & 0 & 0 & - & - & - & - & - & - & - & - \\ 62 & 53 & - & - & 53 & - & - & 3 & 35 & - & - & - & - & - & - & 0 & 0 & - & - & - & - & - & - & - \\ 40 & - & - & 20 & 66 & - & - & 22 & 28 & - & - & - & - & - & - & - & 0 & 0 & - & - & - & - & - & - \\ 0 & - & - & - & 8 & - & 42 & - & 50 & - & - & 8 & - & - & - & - & - & 0 & 0 & - & - & - & - & - \\ 69 & 79 & 79 & - & - & - & 56 & - & 52 & - & - & - & 0 & - & - & - & - & - & 0 & 0 & - & - & - & - \\ 65 & - & - & - & 38 & 57 & - & - & 72 & - & 27 & - & - & - & - & - & - & - & - & 0 & 0 & - & - & - \\ 64 & - & - & - & 14 & 52 & - & - & 30 & - & - & 32 & - & - & - & - & - & - & - & - & 0 & 0 & - & - \\ - & 45 & - & 70 & 0 & - & - & - & 77 & 9 & - & - & - & - & - & - & - & - & - & - & - & 0 & 0 & - \\ 2 & 56 & - & 57 & 35 & - & - & - & - & - & 12 & - & - & - & - & - & - & - & - & - & - & - & 0 & 0 \\ 24 & - & 61 & - & 60 & - & - & 27 & 51 & - & - & 16 & 1 & - & - & - & - & - & - & - & - & - & - & 0 \end{bmatrix},$$

wherein "-" indicates an all-zero matrix; and wherein a Table B indicates a second matrix with a size of 100 rows and 24 columns, $H_{IR}(1/2)$ is obtained by reading r rows and 24 columns from the second matrix, the r rows are any r rows in the 100 rows in the second matrix, and Table B is shown as follows:

TABLE B

10.

| | | n | | | |
|---|---|---|---|---|---|
| d | 1 | 2 | 3 | 4 | 5 |
| 5 | 0.29 | 4.22 | 6.80 | 8.34 | 10.39 |
| 3 | 1.60 | 7.20 | 11.15 | | |
| 3 | 2.7 | 5.7 | 12.77 | | |
| 2 | 9.56 | 13.69 | | | |
| 2 | 14.2 | 15.8 | | | |
| 2 | 3.49 | 16.75 | | | |
| 2 | 17.79 | 20.72 | | | |
| 2 | 19.58 | 21.22 | | | |
| 5 | 4.47 | 4.80 | 18.75 | 22.18 | 23.38 |
| 2 | 0.21 | 8.50 | | | |
| 2 | 5.32 | 6.63 | | | |
| 2 | 1.30 | 7.55 | | | |
| 2 | 9.21 | 11.44 | | | |
| 2 | 2.67 | 12.36 | | | |
| 2 | 13.26 | 14.2 | | | |
| 2 | 15.14 | 16.67 | | | |
| 2 | 3.9 | 17.73 | | | |
| 2 | 18.35 | 20.78 | | | |
| 2 | 21.63 | 22.44 | | | |
| 4 | 0.67 | 8.53 | 19.8 | 23.18 | |
| 2 | 4.9 | 8.56 | | | |
| 2 | 1.5 | 5.45 | | | |
| 2 | 7.50 | 9.25 | | | |
| 2 | 6.50 | 15.45 | | | |
| 2 | 2.76 | 11.4 | | | |
| 2 | 12.34 | 14.28 | | | |
| 2 | 13.62 | 16.8 | | | |
| 2 | 3.50 | 17.40 | | | |
| 2 | 20.32 | 23.13 | | | |
| 2 | 18.20 | 21.80 | | | |
| 4 | 8.38 | 8.47 | 19.0 | 22.38 | |
| 2 | 0.71 | 4.57 | | | |
| 2 | 1.55 | 7.45 | | | |
| 2 | 5.49 | 11.67 | | | |
| 2 | 6.7 | 9.79 | | | |
| 2 | 15.27 | 16.33 | | | |
| 2 | 2.76 | 3.47 | | | |
| 2 | 14.17 | 17.58 | | | |
| 2 | 12.39 | 19.26 | | | |
| 2 | 13.68 | 21.19 | | | |
| 2 | 22.3 | 23.31 | | | |
| 4 | 8.69 | 8.76 | 18.43 | 20.6 | |
| 2 | 0.24 | 4.1 | | | |
| 2 | 1.40 | 7.42 | | | |
| 2 | 5.10 | 9.37 | | | |
| 2 | 3.26 | 11.34 | | | |
| 2 | 15.66 | 16.63 | | | |

TABLE B-continued

10.

| | | n | | | |
|---|---|---|---|---|---|
| d | 1 | 2 | 3 | 4 | 5 |
| 2 | 6.47 | 20.74 | | | |
| 2 | 2.59 | 14.46 | | | |
| 2 | 17.53 | 21.3 | | | |
| 2 | 13.67 | 18.67 | | | |
| 2 | 12.69 | 22.47 | | | |
| 3 | 4.36 | 19.54 | 23.35 | | |
| 2 | 0.17 | 8.56 | | | |
| 2 | 1.24 | 9.26 | | | |
| 2 | 7.32 | 11.77 | | | |
| 2 | 5.7 | 15.43 | | | |
| 2 | 3.78 | 10.76 | | | |
| 2 | 2.3 | 20.9 | | | |
| 2 | 16.36 | 19.14 | | | |
| 2 | 6.45 | 14.39 | | | |
| 2 | 12.0 | 23.59 | | | |
| 2 | 13.4 | 17.4 | | | |
| 2 | 21.31 | 22.31 | | | |
| 3 | 8.33 | 8.34 | 18.54 | | |
| 2 | 0.32 | 1.39 | | | |
| 2 | 3.6 | 7.48 | | | |
| 2 | 5.47 | 9.69 | | | |
| 2 | 11.46 | 18.22 | | | |
| 2 | 2.10 | 15.77 | | | |
| 2 | 6.66 | 10.64 | | | |
| 2 | 12.42 | 23.65 | | | |
| 2 | 16.62 | 17.23 | | | |
| 2 | 14.43 | 20.43 | | | |
| 2 | 13.16 | 19.48 | | | |
| 3 | 8.23 | 21.29 | 22.6 | | |
| 2 | 0.44 | 4.70 | | | |
| 2 | 1.3 | 7.11 | | | |
| 2 | 9.34 | 11.59 | | | |
| 2 | 3.49 | 5.16 | | | |
| 2 | 15.10 | 18.1 | | | |
| 2 | 2.19 | 21.8 | | | |
| 2 | 14.77 | 16.17 | | | |
| 2 | 6.17 | 17.20 | | | |
| 2 | 10.18 | 20.17 | | | |
| 2 | 12.44 | 23.16 | | | |
| 2 | 13.69 | 22.4 | | | |
| 3 | 8.27 | 8.36 | 19.71 | | |
| 2 | 1.18 | 4.0 | | | |
| 2 | 7.52 | 9.39 | | | |
| 2 | 3.42 | 5.56 | | | |
| 2 | 11.43 | 21.9 | | | |
| 2 | 10.14 | 15.31 | | | |
| 2 | 19.50 | 20.80 | | | |
| 2 | 6.22 | 18.38 | | | |
| 2 | 12.64 | 14.34 | | | |
| 2 | 2.80 | 16.59 | | | |
| 2 | 22.43 | 23.31 | | | |
| 3 | 8.71 | 13.77 | 17.48 | | |
| 2 | 0.22 | 4.21 | | | | wherein an $m^{th}$ element from top to bottom in a column in which d is located indicates a row weight of row m in the second matrix, an $n^{th}$ element (a, b) from left to right in row m in the second matrix indicates that a cyclic shift coefficient of a cyclic shift matrix in row m and column (a+n) in the second matrix is b, all remaining locations in the second matrix are all-zero matrices, $n \in \{1, 2, 3, 4, 5\}$, and m, a, and b are all positive integers.

16. The non-transitory computer-readable recording medium according to claim 12, wherein a code rate corresponding to the basic matrix is 2/3, and the mother matrix is shown as follows:

$$H(2/3) = \begin{bmatrix} H_{MC}(2/3) & 0_{8 \times r} \\ H_{IR}(2/3) & I_{r \times r} \end{bmatrix},$$

where:

H(2/3) indicates the mother matrix, $H_{MC}(2/3)$ indicates the basic matrix, $H_{IR}(2/3)$ indicates the extension matrix, a size of $H_{IR}(2/3)$ is r rows and 8 columns, 2/3 indicates the code rate, $0_{8 \times r}$ indicates the first fixed matrix, $I_{r \times r}$ indicates the second fixed matrix, $0_{8 \times r}$ indicates an all-zero matrix with a size of 8 rows and r columns, $I_{r \times r}$ indicates an identity matrix with a size of r rows and r columns, $r \geq 1$, $k \leq r$, and r is an integer; and $$H_{MC}(2/3) = \begin{bmatrix} 61 & 75 & 4 & 63 & 56 & - & - & - & - & - & 8 & - & 2 & 17 & 25 & 1 & 0 & - & - & - & - & - & - & - \\ 56 & 74 & 77 & 20 & - & - & - & 64 & 24 & 4 & 67 & - & 7 & - & - & - & 0 & 0 & - & - & - & - & - & - \\ 28 & 21 & 68 & 10 & 7 & 14 & 65 & - & - & - & 23 & - & - & - & 75 & - & - & - & 0 & 0 & - & - & - & - \\ 48 & 38 & 43 & 78 & 76 & - & - & - & - & 5 & 36 & - & 15 & 72 & - & - & - & - & - & 0 & 0 & - & - & - \\ 40 & 2 & 53 & 25 & - & 52 & 62 & - & 20 & - & - & 44 & - & - & - & - & - & - & - & - & 0 & 0 & - & - \\ 69 & 23 & 64 & 10 & 22 & - & 21 & - & - & - & - & - & 68 & 23 & 29 & - & - & - & - & - & - & 0 & 0 & - \\ 12 & 0 & 68 & 20 & 55 & 61 & - & 40 & - & - & - & 52 & - & - & - & 44 & - & - & - & - & - & - & 0 & 0 \\ 58 & 8 & 34 & 64 & 78 & - & - & 11 & 78 & 24 & - & - & - & - & - & 58 & - & - & - & - & - & - & - & 0 \end{bmatrix},$$

wherein "-" indicates an all-zero matrix; and wherein a Table C indicates a third matrix with a size of 100 rows and 24 columns, $H_{IR}(2/3)$ is obtained by reading r rows and 24 columns from the third matrix, the r rows are any r rows in the 100 rows in the third matrix, and Table C is shown as follows:

TABLE C

| | | | 11. | | | | |
|---|---|---|---|---|---|---|---|
| | | | n | | | | |
| d | 1 | 2 | 3 | 4 | 5 | 6 | 7 |
| 6 | 1.39 | 2.34 | 3.22 | 4.80 | 7.29 | 12.15 | |
| 6 | 0.77 | 1.7 | 2.7 | 3.20 | 7.69 | 12.60 | |
| 7 | 0.75 | 1.2 | 2.49 | 3.8 | 7.72 | 12.79 | 13.56 |
| 7 | 0.38 | 2.18 | 3.22 | 4.75 | 8.80 | 12.47 | 13.58 |
| 7 | 0.21 | 2.32 | 3.63 | 4.50 | 8.21 | 12.55 | 14.30 |
| 6 | 0.67 | 1.67 | 2.26 | 3.36 | 7.2 | 18.44 | |
| 6 | 1.9 | 2.35 | 3.78 | 5.73 | 8.14 | 12.44 | |
| 5 | 0.18 | 1.63 | 2.67 | 3.53 | 17.8 | | |
| 5 | 1.45 | 2.5 | 3.56 | 7.50 | 11.9 | | |
| 6 | 0.28 | 1.76 | 2.50 | 3.25 | 7.45 | 21.4 | |
| 6 | 0.32 | 1.40 | 2.34 | 3.50 | 12.62 | 19.8 | |
| 5 | 0.38 | 1.80 | 3.0 | 6.20 | 12.13 | | |
| 5 | 1.71 | 2.47 | 3.57 | 12.55 | 23.38 | | |
| 5 | 0.45 | 1.79 | 2.7 | 10.49 | 12.67 | | |
| 5 | 0.27 | 1.47 | 2.17 | 3.76 | 22.33 | | |
| 5 | 0.58 | 1.68 | 2.26 | 12.39 | 16.19 | | |
| 4 | 0.31 | 1.3 | 3.43 | 20.6 | | | |
| 5 | 0.40 | 2.69 | 3.76 | 12.24 | 15.1 | | |
| 5 | 1.34 | 2.26 | 3.42 | 12.37 | 20.10 | | |

TABLE C-continued

| | | | 11. | | | | |
|---|---|---|---|---|---|---|---|
| | | | n | | | | |
| d | 1 | 2 | 3 | 4 | 5 | 6 | 7 |
| 4 | 0.66 | 2.63 | 3.74 | 9.47 | | | |
| 5 | 0.67 | 1.53 | 3.59 | 5.46 | 20.3 | | |
| 4 | 2.47 | 3.67 | 12.69 | 17.35 | | | |
| 4 | 0.54 | 1.56 | 3.17 | 11.36 | | | |
| 5 | 1.43 | 2.24 | 3.77 | 6.26 | 10.32 | | |
| 4 | 0.76 | 2.7 | 3.78 | 5.3 | | | |
| 4 | 0.9 | 1.45 | 6.14 | 23.36 | | | |
| 4 | 1.4 | 2.0 | 3.39 | 14.59 | | | |
| 4 | 0.4 | 2.54 | 3.31 | 16.31 | | | |
| 4 | 1.34 | 3.33 | 9.32 | 16.39 | | | |
| 3 | 2.6 | 3.48 | 22.47 | | | | |
| 4 | 1.46 | 2.69 | 3.22 | 21.77 | | | |
| 4 | 1.64 | 2.66 | 3.42 | 19.10 | | | |
| 4 | 1.43 | 3.65 | 9.23 | 14.62 | | | |
| 4 | 0.16 | 1.6 | 3.48 | 15.43 | | | |
| 4 | 1.44 | 2.23 | 3.70 | 11.29 | | | |
| 3 | 2.34 | 10.3 | 11.11 | | | | |
| 3 | 0.59 | 1.49 | 18.16 | | | | |
| 3 | 1.10 | 2.8 | 14.1 | | | | |
| 4 | 1.17 | 2.19 | 5.17 | 21.77 | | | |
| 4 | 1.44 | 2.20 | 5.17 | 15.18 | | | |
| 3 | 1.4 | 2.69 | 14.16 | | | | |

TABLE C-continued

| | | | 11. | | | | |
|---|---|---|---|---|---|---|---|
| | | | n | | | | |
| d | 1 | 2 | 3 | 4 | 5 | 6 | 7 |
| 4 | 0.27 | 7.18 | 13.36 | 14.71 | | | |
| 3 | 0.0 | 9.39 | 12.52 | | | | |
| 3 | 0.43 | 5.56 | 14.42 | | | | |
| 3 | 0.31 | 6.9 | 21.14 | | | | |
| 2 | 0.80 | 9.50 | | | | | |
| 3 | 0.64 | 9.22 | 10.38 | | | | |
| 3 | 0.34 | 14.59 | 16.80 | | | | |
| 3 | 0.43 | 11.31 | 14.77 | | | | |
| 3 | 0.71 | 6.22 | 9.48 | | | | |
| 3 | 0.21 | 11.54 | 16.41 | | | | |
| 3 | 5.78 | 9.58 | 14.65 | | | | |
| 2 | 14.47 | 15.56 | | | | | |
| 3 | 12.21 | 14.13 | 16.41 | | | | |
| 3 | 10.19 | 12.70 | 16.8 | | | | |
| 3 | 9.74 | 11.63 | 14.22 | | | | |
| 3 | 9.17 | 12.14 | 20.59 | | | | |
| 2 | 11.58 | 12.29 | | | | | |
| 3 | 6.29 | 14.59 | 16.32 | | | | |
| 2 | 5.72 | 6.71 | | | | | |
| 3 | 11.79 | 14.24 | 15.21 | | | | |
| 2 | 9.46 | 10.46 | | | | | |
| 3 | 9.75 | 15.51 | 16.19 | | | | |
| 3 | 9.34 | 12.28 | 14.53 | | | | |

TABLE C-continued

11.

| d | n=1 | n=2 | n=3 | n=4 | n=5 | n=6 | n=7 |
|---|------|-------|-------|---|---|---|---|
| 3 | 6.24 | 7.64 | 14.34 | | | | |
| 2 | 5.73 | 16.79 | | | | | |
| 2 | 11.49 | 13.25 | | | | | |
| 3 | 9.64 | 12.72 | 14.48 | | | | |
| 3 | 15.18 | 16.41 | 18.1 | | | | |
| 3 | 11.45 | 12.41 | 14.32 | | | | |
| 3 | 6.9 | 12.25 | 14.74 | | | | |
| 3 | 8.50 | 12.18 | 14.72 | | | | |
| 3 | 5.75 | 9.43 | 14.11 | | | | |
| 3 | 12.34 | 14.40 | 21.57 | | | | |
| 3 | 12.76 | 13.71 | 14.29 | | | | |
| 3 | 6.67 | 11.54 | 14.74 | | | | |
| 2 | 12.23 | 13.5 | | | | | |
| 3 | 5.66 | 10.17 | 14.70 | | | | |
| 3 | 7.59 | 12.72 | 14.41 | | | | |
| 3 | 12.3 | 14.74 | 15.31 | | | | |
| 3 | 9.25 | 14.68 | 23.54 | | | | |
| 3 | 5.65 | 10.18 | 14.15 | | | | |
| 3 | 5.11 | 6.21 | 14.29 | | | | |
| 3 | 7.30 | 9.33 | 12.29 | | | | |
| 3 | 6.80 | 12.50 | 16.79 | | | | |
| 2 | 4.41 | 14.51 | | | | | |
| 2 | 14.41 | 20.45 | | | | | |
| 3 | 9.18 | 11.51 | 15.77 | | | | |
| 3 | 5.67 | 11.3 | 12.6 | | | | |
| 3 | 10.58 | 14.56 | 15.34 | | | | |
| 3 | 6.64 | 12.30 | 16.14 | | | | |
| 3 | 4.69 | 11.11 | 12.58 | | | | |
| 2 | 11.59 | 21.74 | | | | | |
| 3 | 5.38 | 7.52 | 14.48 | | | | |
| 3 | 5.16 | 7.58 | 12.41 | | | | |
| 3 | 6.2 | 14.80 | 15.63 | | | | |
| 3 | 6.25 | 12.8 | 20.35 | | | | |
| 3 | 10.26 | 11.64 | 15.4 | | | | |
| 3 | 7.39 | 14.68 | 15.61 | | | | |
| 3 | 10.26 | 12.66 | 15.50 | | | | | wherein an $m^{th}$ element from top to bottom in a column in which d is located indicates a row weight of row m in the third matrix, an $n^{th}$ element (a, b) from left to right in row m in the third matrix indicates that a cyclic shift coefficient of a cyclic shift matrix in row m and column (a+n) in the third matrix is b, all remaining locations in the third matrix are all-zero matrices, $n \in \{1, 2, 3, 4, 5, 6, 7\}$, and m, a, and b are all positive integers.

17. The non-transitory computer-readable recording medium according to claim 12, wherein a code rate corresponding to the basic matrix is 2/3, and the mother matrix is shown as follows:

$$H(2/3) = \begin{bmatrix} H_{MC}(2/3) & 0_{8 \times r} \\ H_{IR}(2/3) & I_{r \times r} \end{bmatrix},$$

where:
H(2/3) indicates the mother matrix, $H_{MC}$ (2/3) indicates the basic matrix, $H_{IR}$(2/3) indicates the extension matrix, a size of $H_{IR}$(2/3) is r rows and 24 columns, 2/3 indicates the code rate, $0_{8 \times r}$ indicates the first fixed matrix, $I_{r \times r}$ indicates the second fixed matrix, $0_{8 \times r}$ indicates an all-zero matrix with a size of 8 rows and r columns, $I_{r \times r}$ indicates an identity matrix with a size of r rows and r columns, r≥1, k≤r, and r is an integer; and $$H_{MC}(2/3) = \begin{bmatrix} 61 & 75 & 4 & 63 & 56 & - & - & - & - & - & 8 & - & 2 & 17 & 25 & 1 & 0 & - & - & - & - & - & - & - \\ 56 & 74 & 77 & 20 & - & - & - & 64 & 24 & 4 & 67 & - & 7 & - & - & - & 0 & 0 & - & - & - & - & - & - \\ 28 & 21 & 68 & 10 & 7 & 14 & 65 & - & - & - & 23 & - & - & - & 75 & - & - & - & 0 & 0 & - & - & - & - \\ 48 & 38 & 43 & 78 & 76 & - & - & - & - & 5 & 36 & - & 15 & 72 & - & - & - & - & - & 0 & 0 & - & - & - \\ 40 & 2 & 53 & 25 & - & 52 & 62 & - & 20 & - & - & 44 & - & - & - & - & - & - & - & - & 0 & 0 & - & - \\ 69 & 23 & 64 & 10 & 22 & - & 21 & - & - & - & - & - & 68 & 23 & 29 & - & - & - & - & - & - & 0 & 0 & - \\ 12 & 0 & 68 & 20 & 55 & 61 & - & 40 & - & - & - & 52 & - & - & - & 44 & - & - & - & - & - & - & 0 & 0 \\ 58 & 8 & 34 & 64 & 78 & - & - & 11 & 78 & 24 & - & - & - & - & 58 & - & - & - & - & - & - & - & - & 0 \end{bmatrix},$$

wherein "-" indicates an all-zero matrix; and
wherein a Table D indicates a fourth matrix with a size of 100 rows and 24 columns, $H_{IR}(2/3)$ is obtained by reading r rows and 24 columns from the fourth matrix, the r rows are any r rows in the 100 rows in the fourth matrix, the 24 columns in $H_{IR}(2/3)$ are the 24 columns in the fourth matrix, and Table D is shown as follows:

TABLE D

12.

| | | | n | | |
|---|---|---|---|---|---|
| d | 1 | 2 | 3 | 4 | 5 |
| 5 | 0.34 | 1.39 | 2.22 | 3.80 | 4.29 |
| 5 | 7.15 | 11.20 | 14.7 | 15.60 | 16.7 |
| 4 | 5.77 | 8.2 | 9.56 | 13.69 | |
| 3 | 6.8 | 10.49 | 12.75 | | |
| 3 | 17.79 | 18.58 | 19.72 | | |
| 5 | 3.47 | 20.22 | 21.18 | 22.38 | 23.75 |
| 4 | 0.32 | 1.21 | 2.80 | 4.50 | |
| 3 | 13.63 | 14.30 | 15.55 | | |
| 3 | 7.21 | 11.67 | 16.44 | | |
| 3 | 5.26 | 8.2 | 9.36 | | |
| 3 | 6.9 | 10.14 | 12.67 | | |
| 2 | 22.73 | 23.78 | | | |
| 2 | 20.44 | 21.35 | | | |
| 5 | 0.53 | 1.67 | 17.8 | 18.63 | 19.18 |
| 2 | 0.56 | 3.9 | | | |
| 3 | 4.50 | 13.45 | 14.5 | | |
| 3 | 11.50 | 15.45 | 16.25 | | |
| 3 | 7.28 | 8.76 | 9.4 | | |
| 3 | 5.8 | 10.34 | 12.62 | | |
| 2 | 6.40 | 19.50 | | | |
| 2 | 17.13 | 18.32 | | | |
| 5 | 0.47 | 20.20 | 21.0 | 22.80 | 23.38 |
| 3 | 1.57 | 3.71 | 4.38 | | |
| 2 | 2.55 | 13.45 | | | |
| 3 | 11.7 | 14.49 | 15.67 | | |
| 2 | 7.79 | 16.27 | | | |
| 3 | 5.47 | 8.76 | 9.33 | | |
| 3 | 6.17 | 10.39 | 12.58 | | |
| 3 | 17.19 | 18.68 | 19.26 | | |
| 2 | 20.3 | 23.31 | | | |
| 4 | 1.69 | 1.76 | 21.6 | 22.43 | |
| 3 | 0.1 | 2.24 | 3.40 | | |
| 2 | 13.10 | 14.42 | | | |
| 3 | 11.34 | 15.26 | 16.37 | | |
| 2 | 9.63 | 12.66 | | | |
| 3 | 5.47 | 7.74 | 8.59 | | |
| 2 | 10.46 | 22.3 | | | |
| 2 | 6.53 | 21.67 | | | |
| 2 | 17.47 | 18.67 | | | |
| 4 | 0.36 | 19.54 | 20.35 | 23.69 | |
| 2 | 1.56 | 3.17 | | | |
| 2 | 2.26 | 4.24 | | | |
| 3 | 13.32 | 14.77 | 15.43 | | |
| 2 | 11.78 | 16.7 | | | |
| 2 | 5.3 | 8.76 | | | |
| 3 | 7.36 | 9.9 | 10.14 | | |
| 2 | 6.45 | 22.39 | | | |
| 2 | 12.59 | 23.0 | | | |
| 2 | 20.4 | 21.4 | | | |
| 4 | 0.34 | 17.31 | 18.31 | 19.54 | |
| 3 | 1.39 | 2.32 | 3.33 | | |
| 2 | 4.6 | 13.48 | | | |
| 2 | 5.69 | 15.47 | | | |
| 2 | 7.46 | 14.22 | | | |
| 2 | 8.10 | 11.77 | | | |
| 2 | 9.66 | 19.64 | | | |
| 2 | 16.65 | 17.42 | | | |
| 2 | 6.62 | 10.23 | | | |
| 2 | 12.43 | 18.43 | | | |
| 2 | 20.16 | 23.48 | | | |
| 4 | 1.23 | 1.44 | 21.29 | 22.6 | |
| 2 | 0.3 | 2.70 | | | |
| 2 | 4.11 | 13.34 | | | |
| 2 | 15.16 | 21.59 | | | |
| 2 | 7.49 | 14.1 | | | |
| 2 | 5.10 | 22.8 | | | |
| 3 | 6.19 | 8.17 | 12.77 | | |
| 2 | 9.20 | 16.17 | | | |
| 2 | 11.18 | 20.17 | | | |
| 2 | 10.16 | 19.44 | | | |
| 4 | 3.27 | 17.71 | 18.69 | 23.4 | |
| 2 | 0.18 | 1.36 | | | |
| 2 | 2.0 | 4.52 | | | |
| 3 | 7.56 | 11.39 | 13.42 | | |
| 3 | 14.9 | 15.43 | 21.14 | | |
| 2 | 8.50 | 22.31 | | | |
| 2 | 9.80 | 17.38 | | | |
| 3 | 5.64 | 6.22 | 12.34 | | |
| 2 | 16.59 | 19.80 | | | |
| 2 | 10.31 | 18.43 | | | |
| 4 | 1.22 | 1.71 | 20.77 | 23.48 | |
| 2 | 0.54 | 2.21 | | | |
| 2 | 4.41 | 5.65 | | | |
| 3 | 11.58 | 13.78 | 14.56 | | |
| 2 | 15.47 | 21.21 | | | |
| 2 | 12.13 | 23.41 | | | |
| 3 | 6.8 | 9.19 | 10.70 | | |
| 3 | 7.74 | 8.22 | 16.63 | | |
| 2 | 20.17 | 22.14 | | | |
| 4 | 1.59 | 17.58 | 18.29 | 19.59 | |
| 2 | 0.32 | 3.29 | | | |
| 2 | 2.72 | 4.71 | | | |
| 3 | 5.79 | 6.24 | 13.21 | | |
| 2 | 11.46 | 15.46 | | | |
| 3 | 9.19 | 12.75 | 22.51 | | |
| 2 | 14.34 | 16.53 | | | |
| 2 | 18.34 | 23.28 | | | |
| 3 | 7.24 | 8.64 | 10.79 | | |
| 3 | 19.73 | 20.25 | 21.49 | | |
| 3 | 1.64 | 1.72 | 17.48 | | | wherein an $m^{th}$ element from top to bottom in a column in which d is located indicates a row weight of row m in the fourth matrix, an $n^{th}$ element (a, b) from left to right in row m in the fourth matrix indicates that a cyclic shift coefficient of a cyclic shift matrix in row m and column (a+n) in the fourth matrix is b, all remaining locations in the fourth matrix are all-zero matrices, $n \in \{1, 2, 3, 4, 5\}$, and m, a, and b are all positive integers.

18. The non-transitory computer-readable recording medium according to claim 12, wherein a code rate corresponding to the basic matrix is 3/4, and the mother matrix is shown as follows:

$$H(3/4) = \begin{bmatrix} H_{MC}(3/4) & 0_{6 \times r} \\ H_{IR}(3/4) & I_{r \times r} \end{bmatrix},$$

where:

$H(3/4)$ indicates the mother matrix, $H_{MC}(3/4)$ indicates the basic matrix, $H_{IR}(3/4)$ indicates the extension matrix, a size of $H_{IR}(3/4)$ is r rows and 24 columns, 3/4 indicates the code rate, $0_{6 \times r}$ indicates the first fixed matrix, $I_{r \times r}$ indicates the second fixed matrix, $0_{6 \times r}$ indicates an all-zero matrix with a size of 6 rows and r columns, $I_{r \times r}$ indicates an identity matrix with a size of r rows and r columns, $r \geq 1$, $k \leq r$, and r is an integer; and $$H_{MC}(3/4) = \begin{bmatrix} 48 & 29 & 28 & 39 & 9 & 61 & - & - & - & 63 & 45 & 80 & - & - & - & 37 & 32 & 22 & 1 & 0 & - & - & - & - \\ 4 & 49 & 42 & 48 & 11 & 30 & - & - & - & 49 & 17 & 41 & 37 & 15 & - & 54 & - & - & - & 0 & 0 & - & - & - \\ 35 & 76 & 78 & 51 & 37 & 35 & 21 & - & 17 & 64 & - & - & - & 59 & 7 & - & - & 32 & - & - & 0 & 0 & - & - \\ 9 & 65 & 44 & 9 & 54 & 56 & 73 & 34 & 42 & - & - & - & 35 & - & - & - & 46 & 39 & 0 & - & - & 0 & 0 & - \\ 3 & 62 & 7 & 80 & 68 & 26 & - & 80 & 55 & - & 36 & - & 26 & - & 9 & - & 72 & - & - & - & - & - & 0 & 0 \\ 26 & 75 & 33 & 21 & 69 & 59 & 3 & 38 & - & - & - & 35 & - & 68 & 36 & 26 & - & - & 1 & - & - & - & - & 0 \end{bmatrix},$$

wherein "-" indicates an all-zero matrix; and wherein a Table E indicates a fifth matrix with a size of 100 rows and 24 columns, $H_{IR}(3/4)$ is obtained by reading r rows and 24 columns from the fifth matrix, the r rows are any r rows in the 100 rows in the fifth matrix, and Table E is shown as follows:

TABLE E

13.

| d | n=1 | 2 | 3 | 4 | 5 | 6 | 7 | 8 | 9 |
|---|---|---|---|---|---|---|---|---|---|
| 9 | 0.22 | 1.20 | 2.7 | 3.29 | 4.15 | 5.60 | 9.39 | 17.34 | 19.80 |
| 7 | 0.8 | 2.2 | 3.69 | 5.75 | 9.7 | 17.56 | 19.77 | | |
| 7 | 1.58 | 2.72 | 3.38 | 4.18 | 5.49 | 11.79 | 19.22 | | |
| 8 | 1.30 | 2.75 | 3.21 | 4.80 | 5.32 | 9.47 | 10.50 | 17.63 | |
| 8 | 0.21 | 2.67 | 3.2 | 4.44 | 5.36 | 10.26 | 14.67 | 19.55 | |
| 7 | 1.73 | 2.63 | 3.35 | 5.44 | 7.14 | 17.78 | 19.9 | | |
| 7 | 0.9 | 1.67 | 2.8 | 3.18 | 5.56 | 8.5 | 9.53 | | |
| 6 | 3.50 | 4.45 | 5.25 | 6.76 | 17.50 | 19.45 | | | |
| 6 | 0.28 | 1.62 | 2.34 | 3.8 | 5.4 | 12.40 | | | |
| 5 | 0.32 | 2.50 | 5.20 | 17.80 | 23.13 | | | | |
| 6 | 0.38 | 2.71 | 3.57 | 5.47 | 13.0 | 17.38 | | | |
| 5 | 0.67 | 2.49 | 3.55 | 5.7 | 21.45 | | | | |
| 5 | 2.33 | 3.76 | 5.47 | 17.79 | 18.27 | | | | |
| 6 | 0.26 | 2.39 | 3.58 | 4.17 | 5.68 | 22.19 | | | |
| 6 | 0.69 | 2.3 | 3.31 | 13.6 | 17.43 | 19.76 | | | |
| 5 | 0.42 | 2.40 | 5.1 | 15.24 | 17.10 | | | | |
| 6 | 0.74 | 3.26 | 5.34 | 16.66 | 17.63 | 19.37 | | | |
| 6 | 0.67 | 2.46 | 3.47 | 5.59 | 14.53 | 17.3 | | | |
| 5 | 0.54 | 5.35 | 15.47 | 17.67 | 21.69 | | | | |
| 5 | 0.17 | 2.26 | 5.24 | 8.56 | 17.36 | | | | |
| 5 | 0.32 | 2.78 | 3.77 | 5.7 | 20.43 | | | | |
| 5 | 0.3 | 2.36 | 3.14 | 17.9 | 22.76 | | | | |
| 5 | 2.59 | 3.0 | 5.39 | 8.45 | 18.4 | | | | |
| 4 | 0.4 | 3.31 | 5.31 | 7.54 | | | | | |
| 4 | 2.34 | 3.39 | 6.33 | 17.32 | | | | | |
| 5 | 0.48 | 3.6 | 5.47 | 16.69 | 17.22 | | | | |
| 5 | 2.77 | 5.46 | 11.10 | 17.66 | 21.64 | | | | |
| 5 | 0.62 | 3.42 | 5.23 | 12.43 | 17.65 | | | | |
| 5 | 0.29 | 2.43 | 3.16 | 15.6 | 18.48 | | | | |
| 4 | 0.23 | 2.70 | 17.44 | 23.3 | | | | | |
| 4 | 2.16 | 5.34 | 10.11 | 17.59 | | | | | |
| 5 | 0.19 | 2.10 | 5.8 | 6.49 | 7.1 | | | | |
| 4 | 0.17 | 3.77 | 11.17 | 17.20 | | | | | |
| 4 | 2.17 | 5.18 | 6.16 | 7.44 | | | | | |
| 4 | 3.4 | 5.71 | 17.69 | 20.27 | | | | | |
| 4 | 0.0 | 2.52 | 3.36 | 14.18 | | | | | |
| 4 | 2.39 | 3.43 | 10.42 | 18.56 | | | | | |
| 3 | 0.9 | 3.14 | 12.31 | | | | | | |
| 4 | 3.50 | 5.38 | 11.80 | 16.22 | | | | | |
| 4 | 0.80 | 3.64 | 5.59 | 13.34 | | | | | |
| 3 | 6.31 | 14.43 | 17.77 | | | | | | |
| 3 | 6.22 | 16.48 | 17.71 | | | | | | |
| 4 | 0.21 | 3.41 | 5.65 | 9.54 | | | | | |
| 3 | 0.58 | 12.56 | 18.78 | | | | | | |
| 3 | 5.47 | 11.21 | 12.13 | | | | | | |
| 3 | 2.41 | 5.8 | 10.70 | | | | | | |
| 3 | 3.19 | 8.22 | 11.63 | | | | | | |
| 3 | 3.14 | 17.17 | 22.74 | | | | | | |
| 3 | 0.58 | 13.29 | 16.59 | | | | | | |
| 3 | 2.32 | 15.29 | 17.59 | | | | | | |
| 4 | 2.71 | 6.72 | 8.21 | 12.24 | | | | | |
| 3 | 0.46 | 2.46 | 10.79 | | | | | | |
| 3 | 6.19 | 17.75 | 20.51 | | | | | | |
| 3 | 0.53 | 7.28 | 16.34 | | | | | | |
| 3 | 0.24 | 2.34 | 4.64 | | | | | | |
| 3 | 11.79 | 12.49 | 17.73 | | | | | | |
| 3 | 0.48 | 10.72 | 16.25 | | | | | | |
| 3 | 11.1 | 18.64 | 21.18 | | | | | | |
| 3 | 11.41 | 16.41 | 17.32 | | | | | | |
| 2 | 17.45 | 22.74 | | | | | | | |
| 3 | 4.9 | 10.50 | 17.25 | | | | | | |
| 3 | 10.11 | 15.72 | 16.18 | | | | | | |
| 3 | 8.40 | 16.75 | 17.43 | | | | | | |
| 3 | 10.29 | 12.34 | 17.57 | | | | | | |
| 3 | 11.76 | 12.71 | 17.67 | | | | | | |
| 3 | 4.74 | 6.54 | 18.23 | | | | | | |
| 2 | 17.66 | 20.5 | | | | | | | |
| 3 | 7.17 | 10.70 | 17.41 | | | | | | |
| 3 | 7.59 | 15.72 | 18.74 | | | | | | |
| 2 | 10.3 | 16.31 | | | | | | | |
| 3 | 4.25 | 6.54 | 11.68 | | | | | | |
| 3 | 11.65 | 13.18 | 16.15 | | | | | | |
| 3 | 10.11 | 12.21 | 16.29 | | | | | | |
| 3 | 4.33 | 10.29 | 16.30 | | | | | | |
| 3 | 8.80 | 13.50 | 16.79 | | | | | | |
| 2 | 11.51 | 12.41 | | | | | | | |
| 2 | 6.41 | 13.45 | | | | | | | |
| 3 | 4.18 | 10.77 | 12.51 | | | | | | |
| 3 | 12.67 | 16.6 | 18.3 | | | | | | |
| 3 | 4.58 | 7.56 | 10.34 | | | | | | |
| 3 | 11.30 | 13.64 | 20.14 | | | | | | |
| 3 | 4.58 | 6.11 | 12.69 | | | | | | |
| 3 | 10.48 | 11.74 | 12.59 | | | | | | |
| 2 | 4.38 | 8.52 | | | | | | | |
| 3 | 1.16 | 11.41 | 12.58 | | | | | | |
| 2 | 7.80 | 11.63 | | | | | | | |
| 3 | 12.25 | 16.2 | 18.8 | | | | | | |
| 3 | 4.35 | 6.4 | 13.64 | | | | | | |
| 3 | 8.26 | 11.61 | 12.68 | | | | | | |
| 3 | 6.39 | 8.50 | 12.66 | | | | | | |
| 3 | 4.31 | 6.11 | 12.26 | | | | | | |
| 3 | 6.80 | 12.73 | 14.18 | | | | | | |
| 2 | 6.28 | 14.44 | | | | | | | |
| 3 | 6.68 | 9.54 | 10.0 | | | | | | |
| 2 | 10.55 | 15.53 | | | | | | | |
| 3 | 6.42 | 11.72 | 15.3 | | | | | | |
| 2 | 6.73 | 18.65 | | | | | | | |
| 3 | 8.11 | 11.54 | 16.69 | | | | | | |
| 2 | 9.70 | 16.15 | | | | | | | |
| 3 | 10.61 | 11.44 | 13.48 | | | | | | | wherein an $m^{th}$ element from top to bottom in a column in which d is located indicates a row weight of row m in the fifth matrix, an $n^{th}$ element (a, b) from left to right in row m in the fifth matrix indicates that a cyclic shift coefficient of a cyclic shift matrix in row m and column (a+n) in the fifth matrix is b, all remaining locations in the fifth matrix are all-zero matrices, $n^\in \{1, 2, 3, 4, 5, 6, 7, 8, 9\}$, and m, a, and b are all positive integers.

19. The non-transitory computer-readable recording medium according to claim 12, wherein a code rate corresponding to the basic matrix is 3/4, and the mother matrix is shown as follows:

$$H(3/4) = \begin{bmatrix} H_{MC}(3/4) & 0_{6 \times r} \\ H_{IR}(3/4) & I_{r \times r} \end{bmatrix},$$

where:

H(3/4) indicates the mother matrix, $H_{MC}$ (3/4) indicates the basic matrix, $H_{IR}$(3/4) indicates the extension matrix, a size of $H_{IR}$ (3/4) is r rows and 24 columns, 3/4 indicates the code rate, $0_{6 \times r}$ indicates the first fixed matrix, $I_{r \times r}$ indicates the second fixed matrix, $0_{6 \times r}$ indicates an all-zero matrix with a size of 6 rows and r columns, $I_{r \times r}$ indicates an identity matrix with a size of r rows and r columns, r≥1, k≤r, and r is an integer; and $$H_{MC}(3/4) = \begin{bmatrix} 48 & 29 & 28 & 39 & 9 & 61 & - & - & - & 63 & 45 & 80 & - & - & - & 37 & 32 & 22 & 1 & 0 & - & - & - & - \\ 4 & 49 & 42 & 48 & 11 & 30 & - & - & - & 49 & 17 & 41 & 37 & 15 & - & 54 & - & - & - & 0 & 0 & - & - & - \\ 35 & 76 & 78 & 51 & 37 & 35 & 21 & - & 17 & 64 & - & - & - & 59 & 7 & - & - & 32 & - & - & 0 & 0 & - & - \\ 9 & 65 & 44 & 9 & 54 & 56 & 73 & 34 & 42 & - & - & - & 35 & - & - & - & 46 & 39 & 0 & - & - & 0 & 0 & - \\ 3 & 62 & 7 & 80 & 68 & 26 & - & 80 & 55 & - & 36 & - & 26 & - & 9 & - & 72 & - & - & - & - & - & 0 & 0 \\ 26 & 75 & 33 & 21 & 69 & 59 & 3 & 38 & - & - & - & 35 & - & 68 & 36 & 26 & - & - & 1 & - & - & - & - & 0 \end{bmatrix},$$

wherein "-" indicates an all-zero matrix; and wherein a Table F indicates a sixth matrix with a size of 100 rows and 24 columns, $H_{MC}$ (3/4) is obtained by reading r rows and 24 columns from the sixth matrix, the r rows are any r rows in the 100 rows in the sixth matrix, and Table F is shown as follows:

TABLE F

| | 14. | | | | |
|---|---|---|---|---|---|
| | | | n | | |
| d | 1 | 2 | 3 | 4 | 5 |
| 5 | 0.34 | 1.39 | 2.22 | 3.80 | 4.29 |
| 5 | 5.7 | 9.15 | 10.60 | 13.20 | 15.7 |
| 5 | 11.8 | 12.77 | 16.2 | 17.69 | 18.56 |
| 4 | 6.49 | 7.79 | 8.75 | 14.72 | |
| 4 | 19.58 | 20.38 | 21.22 | 23.18 | |
| 5 | 0.21 | 1.47 | 4.50 | 4.80 | 22.75 |
| 5 | 1.63 | 5.32 | 9.21 | 13.55 | 15.30 |
| 4 | 10.26 | 11.67 | 17.36 | 22.44 | |
| 4 | 12.2 | 14.14 | 16.67 | 18.9 | |
| 3 | 6.35 | 7.73 | 8.78 | | |
| 5 | 0.53 | 19.8 | 20.44 | 21.18 | 23.63 |
| 4 | 1.56 | 2.5 | 3.67 | 4.9 | |
| 4 | 5.50 | 9.45 | 13.45 | 15.25 | |
| 3 | 10.76 | 11.4 | 22.50 | | |
| 4 | 12.34 | 16.28 | 17.62 | 18.8 | |
| 4 | 6.13 | 7.50 | 8.32 | 14.40 | |
| 5 | 1.47 | 19.80 | 20.38 | 21.0 | 23.20 |
| 4 | 0.71 | 2.55 | 3.57 | 4.38 | |
| 3 | 5.67 | 9.45 | 15.49 | | |
| 3 | 10.7 | 13.79 | 22.27 | | |
| 3 | 11.33 | 16.47 | 18.76 | | |
| 3 | 12.58 | 14.17 | 17.39 | | |
| 3 | 6.68 | 7.26 | 8.19 | | |
| 2 | 21.31 | 23.3 | | | |
| 4 | 4.69 | 4.76 | 19.6 | 20.43 | |
| 3 | 0.24 | 2.40 | 3.1 | | |
| 3 | 5.42 | 9.37 | 13.10 | | |
| 3 | 10.34 | 15.26 | 20.66 | | |
| 3 | 11.74 | 19.63 | 22.47 | | |
| 3 | 12.46 | 16.59 | 18.3 | | |
| 3 | 14.67 | 17.53 | 23.67 | | |
| 5 | 4.36 | 6.47 | 7.35 | 8.69 | 21.54 |
| 3 | 0.56 | 2.17 | 3.26 | | |
| 2 | 1.24 | 5.77 | | | |
| 3 | 9.32 | 13.43 | 15.7 | | |
| 3 | 10.76 | 19.3 | 20.78 | | |
| 3 | 11.14 | 12.9 | 22.36 | | |
| 3 | 16.45 | 17.39 | 18.0 | | |
| 3 | 6.4 | 7.4 | 8.59 | | |
| 4 | 4.34 | 14.31 | 21.31 | 23.54 | |
| 3 | 0.32 | 2.39 | 3.33 | | |
| 3 | 1.6 | 5.47 | 15.48 | | |
| 3 | 9.69 | 10.22 | 13.46 | | |
| 2 | 14.10 | 20.77 | | | |
| 2 | 6.64 | 19.66 | | | |
| 3 | 16.62 | 17.65 | 18.42 | | |
| 3 | 11.43 | 12.23 | 22.43 | | |
| 3 | 7.6 | 8.48 | 21.16 | | |
| 3 | 4.23 | 4.44 | 23.29 | | |
| 2 | 0.3 | 2.70 | | | |
| 3 | 1.11 | 5.59 | 13.34 | | |
| 3 | 9.1 | 10.49 | 15.16 | | |
| 3 | 12.10 | 17.8 | 22.19 | | |
| 3 | 14.17 | 16.77 | 23.17 | | |
| 3 | 11.17 | 19.20 | 20.18 | | |
| 2 | 7.16 | 18.44 | | | |
| 4 | 4.27 | 6.4 | 8.69 | 21.71 | |
| 2 | 0.18 | 3.36 | | | |
| 3 | 1.0 | 2.39 | 5.52 | | |
| 3 | 9.43 | 13.56 | 15.42 | | |
| 3 | 10.14 | 18.31 | 20.9 | | |
| 2 | 14.80 | 23.50 | | | |
| 2 | 8.22 | 22.38 | | | |
| 3 | 11.64 | 12.80 | 16.34 | | |
| 2 | 19.59 | 21.43 | | | |
| 4 | 4.71 | 6.77 | 7.31 | 17.48 | |
| 3 | 0.22 | 2.21 | 5.54 | | |
| 2 | 1.41 | 9.65 | | | |
| 3 | 3.78 | 10.58 | 15.56 | | |
| 2 | 13.21 | 17.47 | | | |
| 2 | 6.13 | 16.41 | | | |
| 3 | 8.8 | 11.70 | 12.19 | | |
| 2 | 7.63 | 23.22 | | | |
| 3 | 14.14 | 18.17 | 22.74 | | |
| 4 | 0.59 | 19.59 | 20.29 | 21.58 | |
| 2 | 2.32 | 4.29 | | | |
| 3 | 1.71 | 3.72 | 5.24 | | |
| 3 | 9.79 | 10.46 | 15.21 | | |
| 2 | 11.46 | 13.51 | | | |
| 3 | 6.53 | 12.19 | 17.75 | | |
| 2 | 8.34 | 14.28 | | | |
| 2 | 18.24 | 19.34 | | | |

TABLE F-continued

14.

| d | n | | | | |
|---|---|---|---|---|---|
| | 1 | 2 | 3 | 4 | 5 |
| 3 | 7.64 | 20.79 | 23.73 | | |
| 4 | 0.72 | 16.49 | 21.25 | 22.48 | |
| 3 | 2.18 | 4.64 | 5.1 | | |
| 2 | 1.41 | 3.41 | | | |
| 3 | 9.74 | 13.45 | 15.32 | | |
| 2 | 10.25 | 17.9 | | | |
| 3 | 11.72 | 12.18 | 23.50 | | |
| 2 | 16.11 | 20.75 | | | |
| 3 | 6.43 | 14.40 | 22.34 | | |
| 3 | 8.29 | 18.71 | 19.57 | | |
| 3 | 4.54 | 7.67 | 21.76 | | |
| 2 | 0.74 | 5.23 | | | |
| 2 | 1.5 | 2.66 | | | |
| 3 | 3.41 | 9.17 | 15.70 | | |
| 3 | 7.59 | 11.74 | 17.72 | | |
| 3 | 10.25 | 13.31 | 18.3 | | |
| 3 | 12.54 | 14.65 | 20.68 | | |
| 2 | 6.15 | 21.18 | | | | wherein an $m^{th}$ element from top to bottom in a column in which d is located indicates a row weight of row m $$H_{MC}(5/6) = \begin{bmatrix} 13 & 48 & 80 & 66 & 4 & 74 & 7 & 30 & 76 & 52 & 37 & 60 & - & 49 & - & 73 & 31 & 74 & 73 & 21 & 1 & 0 & - & - \\ 69 & 63 & 74 & 56 & 64 & 77 & 57 & 65 & 6 & 16 & 51 & - & 64 & - & 64 & 68 & 9 & 48 & 62 & 54 & - & 0 & 0 & - \\ 51 & 15 & 0 & 80 & 24 & 25 & 42 & 54 & 44 & 71 & 71 & 9 & 67 & 35 & 67 & - & 58 & - & 29 & - & 0 & - & 0 & 0 \\ 16 & 29 & 36 & 41 & 44 & 56 & 59 & 37 & 50 & 24 & - & 65 & 4 & 65 & 4 & 52 & - & 4 & - & 73 & 1 & - & - & 0 \end{bmatrix},$$

in the sixth matrix, an $n^{th}$ element (a, b) from left to right in row m in the sixth matrix indicates that a cyclic shift coefficient of a cyclic shift matrix in row m and column (a+n) in the sixth matrix is b, all remaining locations in the sixth matrix are all-zero matrices, $n^{\in}\{1, 2, 3, 4, 5\}$, and m, a, and b are all positive integers.

20. The non-transitory computer-readable recording medium according to claim 12, wherein a code rate corresponding to the basic matrix is 5/6, and the mother matrix is shown as follows:

$$H(5/6) = \begin{bmatrix} H_{MC}(5/6) & 0_{4 \times r} \\ H_{IR}(5/6) & I_{r \times r} \end{bmatrix},$$

where:
H(5/6) indicates the mother matrix, $H_{MC}(5/6)$ indicates the basic matrix, $H_{IR}(5/6)$ indicates the extension matrix, a size of $H_{IR}(5/6)$ is r rows and 24 columns, 5/6 indicates the code rate, $0_{4 \times r}$ indicates the first fixed matrix, $I_{r \times r}$ indicates the second fixed matrix, $0_{4 \times r}$ indicates an all-zero matrix with a size of 4 rows and r columns, $I_{r \times r}$ indicates an identity matrix with a size of r rows and r columns, r≥1, k≤r, and r is an integer; and wherein "-" indicates an all-zero matrix; and
wherein a Table G indicates a seventh matrix with a size of 100 rows and 24 columns, $H_{IR}(5/6)$ is obtained by reading r rows and 24 columns from the seventh matrix, the r rows are any r rows in the 100 rows in the seventh matrix, and Table G is shown as follows:

TABLE G

15.

| d | n | | | | | | | | | | |
|---|---|---|---|---|---|---|---|---|---|---|---|
| | 1 | 2 | 3 | 4 | 5 | 6 | 7 | 8 | 9 | 10 | 11 |
| 11 | 0.60 | 1.15 | 3.34 | 4.80 | 5.20 | 6.29 | 7.39 | 9.22 | 11.77 | 12.7 | 18.7 |
| 10 | 0.72 | 2.79 | 3.69 | 4.49 | 5.75 | 6.8 | 9.2 | 11.56 | 12.22 | 14.58 | |
| 8 | 1.18 | 2.47 | 4.21 | 5.80 | 6.38 | 7.50 | 9.75 | 11.32 | | | |
| 9 | 0.21 | 1.26 | 2.30 | 3.36 | 4.44 | 5.67 | 6.63 | 7.2 | 11.55 | | |
| 9 | 0.18 | 2.63 | 3.78 | 4.44 | 6.67 | 8.14 | 9.35 | 11.73 | 14.9 | | |
| 9 | 1.56 | 2.5 | 3.9 | 5.45 | 6.67 | 7.50 | 9.25 | 17.8 | 19.53 | | |
| 8 | 0.45 | 1.28 | 3.50 | 4.62 | 6.34 | 7.8 | 9.4 | 20.76 | | | |
| 7 | 2.80 | 3.50 | 4.13 | 5.40 | 6.32 | 9.0 | 10.20 | | | | |
| 8 | 1.47 | 2.38 | 3.55 | 4.45 | 6.67 | 7.71 | 9.57 | 23.38 | | | |
| 7 | 1.47 | 2.79 | 3.7 | 4.76 | 6.27 | 9.33 | 21.49 | | | | |
| 7 | 1.58 | 2.19 | 3.26 | 4.31 | 5.39 | 9.68 | 15.17 | | | | |
| 6 | 2.6 | 3.76 | 5.24 | 6.69 | 7.3 | 16.43 | | | | | |
| 6 | 1.40 | 3.34 | 6.37 | 7.42 | 9.1 | 13.10 | | | | | |
| 6 | 1.59 | 2.47 | 3.66 | 6.63 | 9.74 | 17.26 | | | | | |
| 6 | 2.47 | 3.3 | 4.53 | 5.67 | 7.67 | 22.46 | | | | | |
| 6 | 3.69 | 4.56 | 5.35 | 6.36 | 9.54 | 18.17 | | | | | |
| 6 | 3.7 | 6.26 | 7.77 | 9.24 | 16.43 | 22.32 | | | | | |
| 5 | 1.36 | 2.9 | 3.76 | 6.3 | 8.78 | | | | | | |
| 5 | 1.14 | 2.45 | 6.0 | 7.59 | 19.39 | | | | | | |
| 5 | 1.4 | 3.4 | 6.54 | 8.31 | 13.31 | | | | | | |
| 5 | 1.48 | 2.39 | 3.33 | 6.32 | 10.34 | | | | | | |
| 5 | 1.46 | 4.47 | 6.6 | 13.69 | 20.22 | | | | | | |
| 5 | 1.66 | 3.64 | 6.10 | 9.77 | 23.42 | | | | | | |
| 5 | 1.23 | 2.62 | 6.65 | 15.43 | 16.43 | | | | | | |
| 5 | 1.6 | 2.48 | 3.16 | 6.29 | 12.23 | | | | | | |

TABLE G-continued

15.

| | | | | n | | | | | | | |
|---|---|---|---|---|---|---|---|---|---|---|---|
| d | 1 | 2 | 3 | 4 | 5 | 6 | 7 | 8 | 9 | 10 | 11 |
| 5 | 2.3 | 3.11 | 6.44 | 8.34 | 16.70 | | | | | | |
| 4 | 1.59 | 2.49 | 3.16 | 14.1 | | | | | | | |
| 5 | 2.77 | 3.19 | 6.8 | 13.10 | 21.17 | | | | | | |
| 5 | 1.44 | 2.20 | 3.18 | 14.17 | 19.17 | | | | | | |
| 4 | 3.71 | 6.16 | 9.4 | 10.69 | | | | | | | |
| 4 | 2.27 | 3.18 | 12.36 | 14.0 | | | | | | | |
| 5 | 1.52 | 3.43 | 6.42 | 8.39 | 20.56 | | | | | | |
| 4 | 1.31 | 6.14 | 8.50 | 22.9 | | | | | | | |
| 4 | 3.22 | 6.38 | 9.64 | 18.80 | | | | | | | |
| 4 | 1.43 | 2.80 | 3.59 | 17.34 | | | | | | | |
| 5 | 2.48 | 3.31 | 6.22 | 15.77 | 16.71 | | | | | | |
| 4 | 3.21 | 6.54 | 10.41 | 13.65 | | | | | | | |
| 4 | 3.58 | 6.78 | 14.47 | 18.56 | | | | | | | |
| 5 | 1.70 | 3.21 | 6.13 | 11.8 | 13.41 | | | | | | |
| 4 | 1.22 | 6.19 | 18.63 | 21.74 | | | | | | | |
| 4 | 1.59 | 2.58 | 6.17 | 12.14 | | | | | | | |
| 5 | 1.59 | 3.72 | 6.32 | 15.29 | 20.29 | | | | | | |
| 4 | 1.71 | 2.79 | 14.21 | 20.24 | | | | | | | |
| 4 | 2.46 | 3.46 | 16.19 | 17.51 | | | | | | | |
| 4 | 1.53 | 2.75 | 13.34 | 22.28 | | | | | | | |
| 4 | 0.79 | 1.24 | 2.34 | 8.64 | | | | | | | |
| 3 | 1.73 | 2.25 | 10.49 | | | | | | | | |
| 4 | 1.48 | 2.18 | 17.64 | 19.72 | | | | | | | |
| 3 | 0.41 | 2.41 | 10.1 | | | | | | | | |
| 3 | 1.32 | 12.74 | 15.45 | | | | | | | | |
| 3 | 2.9 | 12.50 | 19.25 | | | | | | | | |
| 4 | 1.72 | 2.18 | 12.75 | 21.11 | | | | | | | |
| 3 | 0.40 | 1.34 | 2.43 | | | | | | | | |
| 4 | 1.57 | 2.71 | 8.76 | 11.29 | | | | | | | |
| 3 | 0.74 | 10.67 | 15.54 | | | | | | | | |
| 3 | 7.5 | 8.23 | 14.66 | | | | | | | | |
| 3 | 10.70 | 12.41 | 13.17 | | | | | | | | |
| 3 | 10.59 | 12.72 | 14.74 | | | | | | | | |
| 3 | 0.3 | 8.25 | 14.31 | | | | | | | | |
| 3 | 8.54 | 14.65 | 22.68 | | | | | | | | |
| 3 | 0.15 | 12.18 | 13.29 | | | | | | | | |
| 3 | 0.11 | 8.21 | 19.33 | | | | | | | | |
| 3 | 0.30 | 13.29 | 19.80 | | | | | | | | |
| 3 | 0.50 | 8.41 | 16.79 | | | | | | | | |
| 3 | 12.51 | 14.41 | 22.45 | | | | | | | | |
| 2 | 8.18 | 17.77 | | | | | | | | | |
| 3 | 0.3 | 4.51 | 8.6 | | | | | | | | |
| 3 | 8.34 | 10.58 | 14.67 | | | | | | | | |
| 3 | 10.14 | 17.30 | 18.56 | | | | | | | | |
| 2 | 14.69 | 18.64 | | | | | | | | | |
| 3 | 9.58 | 12.59 | 15.11 | | | | | | | | |
| 3 | 0.74 | 12.48 | 14.38 | | | | | | | | |
| 3 | 0.41 | 10.52 | 15.16 | | | | | | | | |
| 3 | 12.58 | 16.63 | 20.80 | | | | | | | | |
| 3 | 0.8 | 12.2 | 18.25 | | | | | | | | |
| 2 | 0.64 | 20.35 | | | | | | | | | |
| 3 | 0.68 | 11.4 | 12.26 | | | | | | | | |
| 3 | 0.39 | 12.66 | 22.61 | | | | | | | | |
| 3 | 11.26 | 12.50 | 18.31 | | | | | | | | |
| 2 | 14.11 | 16.18 | | | | | | | | | |
| 3 | 9.73 | 10.80 | 19.44 | | | | | | | | |
| 2 | 11.54 | 13.28 | | | | | | | | | |
| 3 | 0.68 | 14.0 | 19.55 | | | | | | | | |
| 3 | 0.53 | 7.3 | 15.42 | | | | | | | | |
| 3 | 0.65 | 10.72 | 16.73 | | | | | | | | |
| 3 | 0.54 | 12.11 | 23.69 | | | | | | | | |
| 3 | 0.44 | 12.15 | 17.70 | | | | | | | | |
| 3 | 12.57 | 16.48 | 18.61 | | | | | | | | |
| 3 | 7.48 | 14.30 | 18.72 | | | | | | | | |
| 2 | 7.80 | 10.47 | | | | | | | | | |
| 3 | 0.4 | 12.23 | 19.72 | | | | | | | | |
| 3 | 9.59 | 13.4 | 17.69 | | | | | | | | |
| 2 | 9.66 | 18.22 | | | | | | | | | |
| 3 | 12.52 | 16.53 | 19.60 | | | | | | | | |
| 2 | 8.35 | 21.13 | | | | | | | | | |

TABLE G-continued

15.

| d | n=1 | 2 | 3 | 4 | 5 | 6 | 7 | 8 | 9 | 10 | 11 |
|---|---|---|---|---|---|---|---|---|---|---|---|
| 3 | 7.65 | 9.44 | 16.68 | | | | | | | | |
| 3 | 12.16 | 13.9 | 17.9 | | | | | | | | |
| 3 | 7.10 | 12.3 | 14.7 | | | | | | | | |
| 2 | 17.50 | 22.5 | | | | | | | | | |
| 3 | 9.62 | 16.20 | 17.80 | | | | | | | | | wherein an $m^{th}$ element from top to bottom in a column in which d is located indicates a row weight of row m in the seventh matrix, an $n^{th}$ element (a, b) from left to right in row m in the seventh matrix indicates that a cyclic shift coefficient of a cyclic shift matrix in row m and column (a+n) in the seventh matrix is b, all remaining locations in the seventh matrix are all-zero matrices, $n^{\in}=\{1, 2, 3, 4, 5, 6, 7, 8, 9, 10, 11\}$, and m, a, and b are all positive integers.

21. The non-transitory computer-readable recording medium according to claim 12, wherein a code rate corresponding to the basic matrix is 5/6, and the mother matrix is shown as follows:

$$H(5/6) = \begin{bmatrix} H_{MC}(5/6) & 0_{4\times r} \\ H_{IR}(5/6) & I_{r\times r} \end{bmatrix},$$

where:

H(5/6) indicates the mother matrix, $H_{MC}$ (5/6) indicates the basic matrix, $H_{IR}$ (5/6) indicates the extension matrix, a size of $H_{IR}$(5/6) is r rows and 24 columns, 5/6 indicates the code rate, $0_{4\times r}$ indicates the first fixed matrix, $I_{r\times r}$ indicates the second fixed matrix, $0_{4\times r}$ indicates an all-zero matrix with a size of 4 rows and r columns, $I_{r\times r}$ indicates an identity matrix with a size of r rows and r columns, r≥1, k≤r, and r is an integer; and $$H_{MC}(5/6) = \begin{bmatrix} 13 & 48 & 80 & 66 & 4 & 74 & 7 & 30 & 76 & 52 & 37 & 60 & - & 49 & - & 73 & 31 & 74 & 73 & 21 & 1 & 0 & - & - \\ 69 & 63 & 74 & 56 & 64 & 77 & 57 & 65 & 6 & 16 & 51 & - & 64 & - & 64 & 68 & 9 & 48 & 62 & 54 & - & 0 & 0 & - \\ 51 & 15 & 0 & 80 & 24 & 25 & 42 & 54 & 44 & 71 & 71 & 9 & 67 & 35 & 67 & - & 58 & - & 29 & - & 0 & - & 0 & 0 \\ 16 & 29 & 36 & 41 & 44 & 56 & 59 & 37 & 50 & 24 & - & 65 & 4 & 65 & 4 & 52 & - & 4 & - & 73 & 1 & - & - & 0 \end{bmatrix},$$

wherein "-" indicates an all-zero matrix; and
wherein a Table H indicates an eighth matrix with a size of 100 rows and 24 columns, $H_{IR}$(5/6) is obtained by reading r rows and 24 columns from the eighth matrix, the r rows are any r rows in the 100 rows in the eighth matrix, and Table H is shown as follows:

TABLE H

16.

| d | n=1 | 2 | 3 | 4 | 5 |
|---|---|---|---|---|---|
| 5 | 0.80 | 1.29 | 2.34 | 8.39 | 9.22 |
| 5 | 3.7 | 4.20 | 5.60 | 6.15 | 7.7 |
| 5 | 11.8 | 13.2 | 14.77 | 18.69 | 20.56 |
| 5 | 12.72 | 15.58 | 16.79 | 17.75 | 19.49 |
| 5 | 5.47 | 10.75 | 21.18 | 22.22 | 23.38 |

TABLE H-continued

16.

| d | n=1 | 2 | 3 | 4 | 5 |
|---|---|---|---|---|---|
| 5 | 2.32 | 3.80 | 6.21 | 7.63 | 9.50 |
| 5 | 0.44 | 1.30 | 4.55 | 8.21 | 20.67 |
| 5 | 11.26 | 13.67 | 14.14 | 16.2 | 18.36 |
| 5 | 10.35 | 12.78 | 15.73 | 17.9 | 19.44 |
| 5 | 4.53 | 6.67 | 21.18 | 22.8 | 23.63 |
| 5 | 0.56 | 1.5 | 2.50 | 4.45 | 9.9 |
| 5 | 5.76 | 7.45 | 8.4 | 13.25 | 20.50 |
| 4 | 11.34 | 14.8 | 16.62 | 18.28 | |
| 4 | 12.32 | 15.13 | 17.40 | 19.50 | |
| 5 | 9.47 | 10.38 | 21.80 | 22.20 | 23.0 |
| 5 | 1.71 | 2.38 | 4.45 | 6.57 | 7.55 |
| 4 | 0.67 | 5.7 | 8.79 | 20.49 | |
| 4 | 3.27 | 13.47 | 14.76 | 18.33 | |
| 4 | 11.58 | 12.17 | 16.26 | 17.39 | |
| 4 | 10.68 | 15.31 | 19.3 | 23.19 | |
| 5 | 1.76 | 4.24 | 4.69 | 21.6 | 22.43 |
| 4 | 0.40 | 6.10 | 7.42 | 9.1 | |
| 4 | 3.37 | 5.66 | 8.26 | 20.34 | |
| 3 | 13.63 | 21.47 | 22.74 | | |
| 3 | 10.3 | 18.59 | 23.46 | | |
| 3 | 11.67 | 14.53 | 16.67 | | |
| 5 | 4.36 | 12.54 | 15.35 | 17.47 | 19.69 |
| 3 | 0.17 | 1.26 | 6.56 | | |
| 4 | 5.32 | 7.24 | 8.77 | 20.43 | |
| 3 | 2.76 | 3.78 | 9.7 | | |

TABLE H-continued

16.

| d | n=1 | 2 | 3 | 4 | 5 |
|---|---|---|---|---|---|
| 3 | 13.36 | 21.3 | 22.9 | | |
| 3 | 11.45 | 14.39 | 18.14 | | |
| 3 | 10.4 | 16.59 | 23.0 | | |
| 3 | 12.31 | 15.31 | 19.4 | | |
| 4 | 4.32 | 4.33 | 4.34 | 17.54 | |
| 3 | 1.39 | 7.48 | 20.6 | | |
| 3 | 5.69 | 8.47 | 9.22 | | |
| 3 | 2.77 | 3.10 | 17.46 | | |
| 3 | 12.66 | 15.42 | 19.64 | | |
| 3 | 10.65 | 21.23 | 22.62 | | |
| 3 | 11.48 | 13.43 | 18.43 | | |
| 5 | 4.23 | 4.44 | 14.16 | 16.6 | 23.29 |
| 3 | 5.11 | 7.3 | 8.70 | | |

TABLE H-continued

16.

| d | n | | | | |
|---|---|---|---|---|---|
| | 1 | 2 | 3 | 4 | 5 |
| 3 | 1.16 | 9.59 | 20.34 | | |
| 3 | 0.10 | 16.49 | 17.1 | | |
| 3 | 3.8 | 12.77 | 19.19 | | |
| 3 | 13.17 | 15.20 | 21.17 | | |
| 3 | 10.17 | 14.18 | 23.44 | | |
| 3 | 2.4 | 11.16 | 22.69 | | |
| 4 | 4.18 | 4.27 | 4.36 | 18.71 | |
| 3 | 5.52 | 7.39 | 20.0 | | |
| 3 | 1.42 | 9.56 | 19.43 | | |
| 3 | 15.14 | 17.31 | 18.9 | | |
| 3 | 3.50 | 12.38 | 16.80 | | |
| 3 | 0.34 | 11.22 | 22.64 | | |
| 2 | 2.59 | 14.80 | | | |
| 3 | 13.77 | 21.31 | 23.43 | | |
| 4 | 4.22 | 4.71 | 5.21 | 10.48 | |
| 3 | 1.41 | 4.65 | 7.54 | | |
| 3 | 9.58 | 18.56 | 20.78 | | |
| 3 | 0.47 | 17.21 | 19.13 | | |
| 3 | 10.8 | 11.41 | 22.70 | | |
| 3 | 12.22 | 15.19 | 21.63 | | |
| 3 | 2.17 | 13.14 | 16.74 | | |
| 5 | 3.59 | 4.29 | 4.59 | 14.58 | 23.29 |
| 3 | 1.71 | 16.72 | 17.32 | | |
| 3 | 5.79 | 10.21 | 20.24 | | |
| 2 | 7.46 | 19.46 | | | |
| 3 | 9.51 | 14.19 | 18.75 | | |
| 2 | 0.53 | 8.34 | | | |
| 3 | 11.34 | 12.28 | 15.24 | | |
| 3 | 2.64 | 13.79 | 23.73 | | |
| 4 | 3.49 | 4.72 | 21.25 | 22.48 | |
| 3 | 1.64 | 10.1 | 17.18 | | |
| 3 | 5.41 | 13.32 | 23.41 | | |
| 2 | 9.74 | 18.45 | | | |
| 3 | 0.50 | 7.25 | 14.9 | | |
| 3 | 3.18 | 16.11 | 20.72 | | |
| 2 | 12.43 | 21.75 | | | |
| 3 | 2.40 | 11.57 | 19.34 | | |
| 2 | 6.71 | 8.29 | | | |
| 3 | 4.54 | 15.67 | 22.76 | | |
| 3 | 3.74 | 5.23 | 9.5 | | |
| 3 | 1.17 | 11.66 | 20.70 | | |
| 2 | 7.41 | 17.59 | | | |
| 3 | 0.3 | 2.72 | 18.74 | | |
| 3 | 10.68 | 13.31 | 14.25 | | |
| 3 | 8.65 | 15.54 | 16.18 | | |
| 3 | 12.29 | 19.15 | 23.21 | | |
| 3 | 6.11 | 21.33 | 22.29 | | |
| 3 | 4.79 | 5.30 | 9.80 | | |
| 3 | 3.41 | 14.50 | 15.51 | | |
| 3 | 1.41 | 8.18 | 18.45 | | |
| 3 | 0.51 | 2.3 | 13.77 | | |
| 3 | 7.67 | 19.58 | 20.6 | | |
| 3 | 11.14 | 16.56 | 23.34 | | |
| 2 | 10.64 | 22.30 | | | |
| 2 | 6.11 | 12.69 | | | |
| 4 | 4.48 | 9.74 | 17.59 | 21.58 | |
| 3 | 0.52 | 14.38 | 15.16 | | | wherein an $m^{th}$ element from top to bottom in a column in which d is located indicates a row weight of row m in the eighth matrix, an $n^{th}$ element (a, b) from left to right in row m in the eighth matrix indicates that a cyclic shift coefficient of a cyclic shift matrix in row m and column (a+n) in the eighth matrix is b, all remaining locations in the eighth matrix are all-zero matrices, $n \in \{1, 2, 3, 4, 5\}$, and m, a, and b are all positive integers.

22. The non-transitory computer-readable recording medium according to claim 12, wherein:
the basic matrix is located at a top-left corner of the mother matrix,
the extension matrix is located at a bottom-left corner of the mother matrix,
the first fixed matrix is located at a top-right corner of the mother matrix,
the second fixed matrix is located at a bottom-right corner of the mother matrix,
a quantity of rows in the basic matrix is equal to a quantity of rows in the first fixed matrix,
a quantity of rows in the extension matrix is equal to a quantity of rows in the second fixed matrix,
a quantity of columns in the extension matrix is equal to a quantity of columns in the basic matrix,
a quantity of columns in the first fixed matrix is equal to a quantity of columns in the second fixed matrix,
i=p+k, j=q+k, p and q are respectively the quantity of rows and the quantity of columns in the basic matrix, k≥0, and
i, j, p, q, and k are all integers.

* * * * *